(12) United States Patent
Yamamoto

(10) Patent No.: US 11,940,602 B2
(45) Date of Patent: Mar. 26, 2024

(54) IMAGING DEVICE

(71) Applicant: SONY SEMICONDUCTOR SOLUTIONS CORPORATION, Kanagawa (JP)

(72) Inventor: Atsushi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 603 days.

(21) Appl. No.: 17/058,036

(22) PCT Filed: May 24, 2019

(86) PCT No.: PCT/JP2019/020603
§ 371 (c)(1),
(2) Date: Nov. 23, 2020

(87) PCT Pub. No.: WO2019/235250
PCT Pub. Date: Dec. 12, 2019

(65) Prior Publication Data
US 2021/0223517 A1   Jul. 22, 2021

(30) Foreign Application Priority Data
Jun. 8, 2018 (JP) .................... 2018-110256

(51) Int. Cl.
*G02B 13/00* (2006.01)
*G02B 1/118* (2015.01)
(Continued)

(52) U.S. Cl.
CPC .......... *G02B 13/0045* (2013.01); *G02B 1/118* (2013.01); *G02B 13/0085* (2013.01);
(Continued)

(58) Field of Classification Search
CPC ............ G02B 13/0045; G02B 13/0085; G02B 1/118; G02B 7/021; G02B 5/003;
(Continued)

(56) References Cited

U.S. PATENT DOCUMENTS

2008/0181601 A1* 7/2008 Shintani ................ G03B 17/04
396/529
2011/0156188 A1 6/2011 Tu et al.
(Continued)

FOREIGN PATENT DOCUMENTS

CN           2249911 Y      3/1997
CN           101567968 A    10/2009
(Continued)

OTHER PUBLICATIONS

International Search Report and Written Opinion prepared by the Japanese Patent Office dated Jun. 24, 2019, for International Application No. PCT/JP2019/020603.

*Primary Examiner* — Travis S Fissel
(74) *Attorney, Agent, or Firm* — SHERIDAN ROSS P.C.

(57) ABSTRACT

The present disclosure relates to an imaging device capable of achieving miniaturization and height reduction of a device configuration and reducing generation of a flare or a ghost. A light shielding film is formed in a region including a side surface portion of a lens formed on a solid-state imaging element. The present disclosure is applicable to an imaging device.

14 Claims, 63 Drawing Sheets

(51) Int. Cl.
*H01L 27/146* (2006.01)
*H04N 23/55* (2023.01)

(52) U.S. Cl.
CPC .. *H01L 27/14618* (2013.01); *H01L 27/14621* (2013.01); *H01L 27/14623* (2013.01); *H01L 27/14627* (2013.01); *H01L 27/14636* (2013.01); *H01L 27/14645* (2013.01); *H04N 23/55* (2023.01)

(58) Field of Classification Search
CPC .. G02B 27/021; G02B 27/0018; G02B 30/00; G02B 3/0087; G02B 3/04; H01L 27/14618; H01L 27/14621; H01L 27/14623; H01L 27/14657; H01L 27/14636; H01L 27/14645; H04N 23/54; G03B 17/12
USPC ............... 359/708, 722, 723, 724, 738, 739
See application file for complete search history.

(56) References Cited

U.S. PATENT DOCUMENTS

| 2012/0206639 | A1 | 8/2012 | Matsui et al. |
| 2012/0262793 | A1 | 10/2012 | Yoshikawa et al. |
| 2013/0038775 | A1* | 2/2013 | Nihei ................. G02B 13/0085 359/708 |
| 2017/0023775 | A1* | 1/2017 | Shigemitsu ........ G02B 27/0025 |

FOREIGN PATENT DOCUMENTS

| CN | 106164731 A | 11/2016 |
| EP | 2341540 | 7/2011 |
| JP | 2011-123369 | 6/2011 |
| JP | 2011-170334 | 9/2011 |
| WO | WO 2011/046053 | 4/2011 |
| WO | WO 2014/156954 | 10/2014 |
| WO | WO 2015/115351 | 8/2015 |
| WO | WO 2015/151697 | 10/2015 |

* cited by examiner

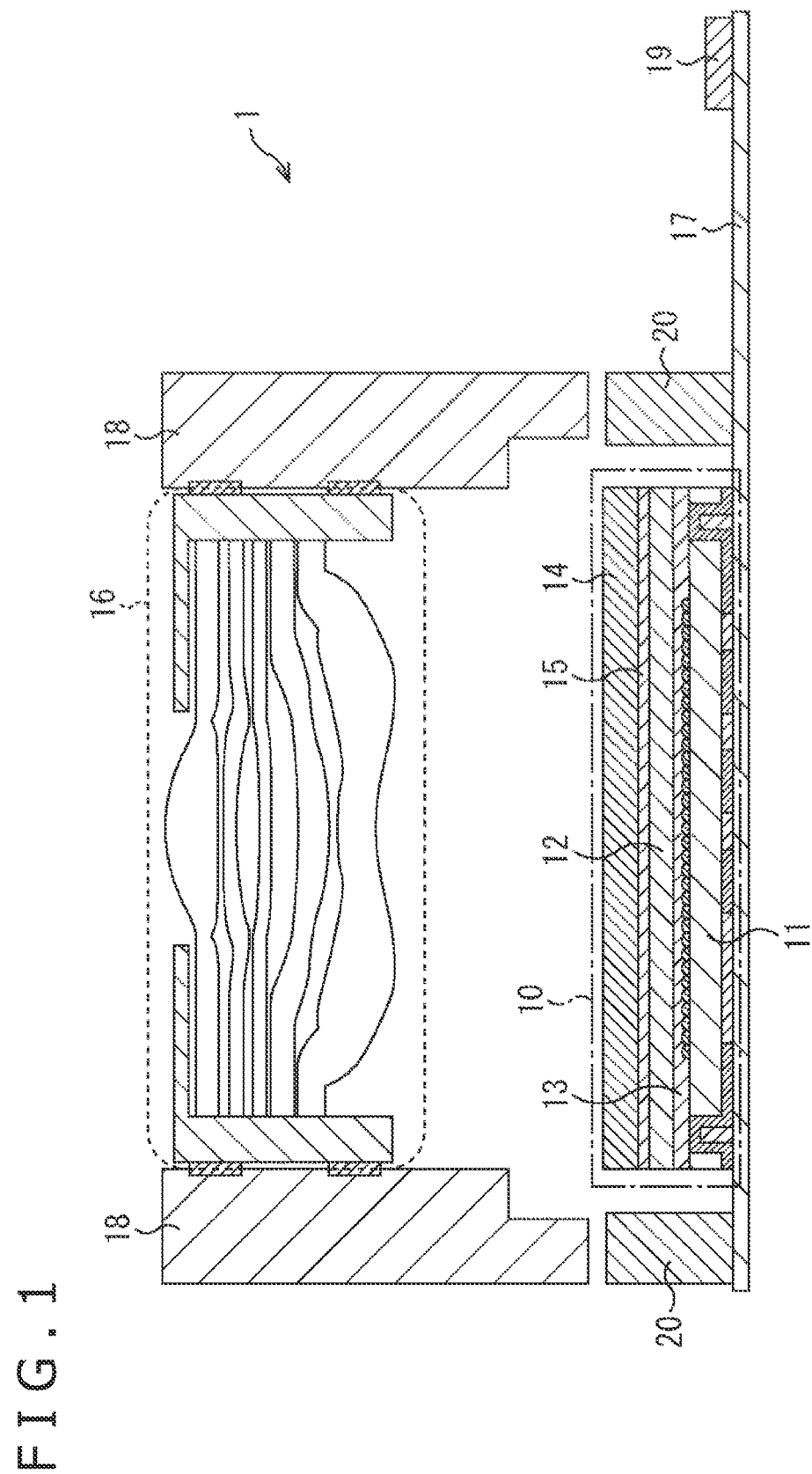
F I G. 1

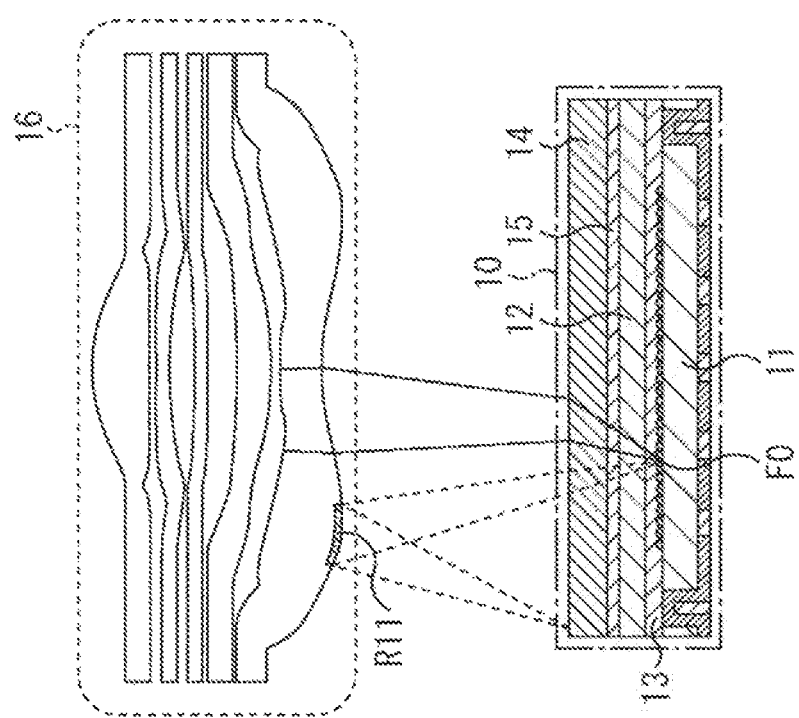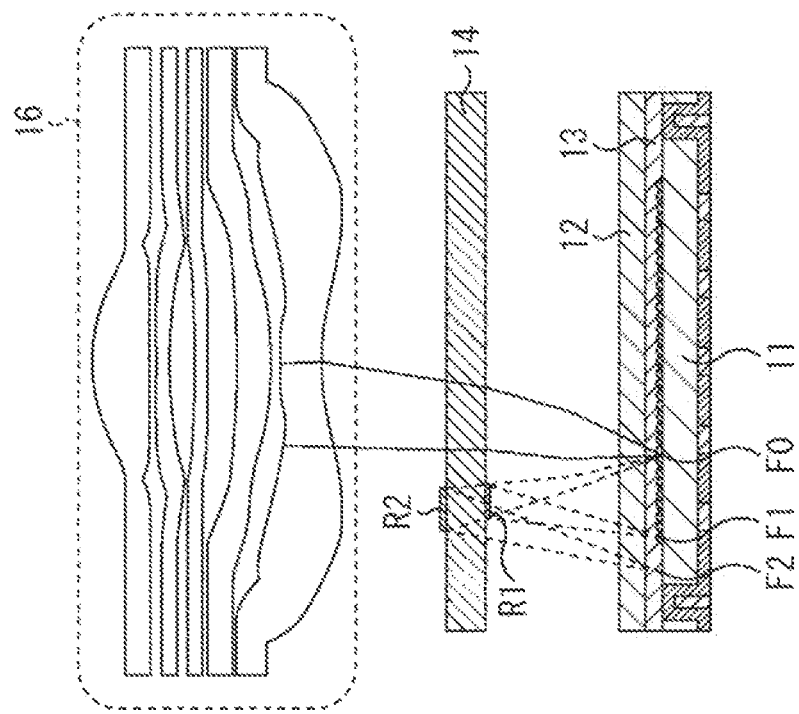
FIG. 7

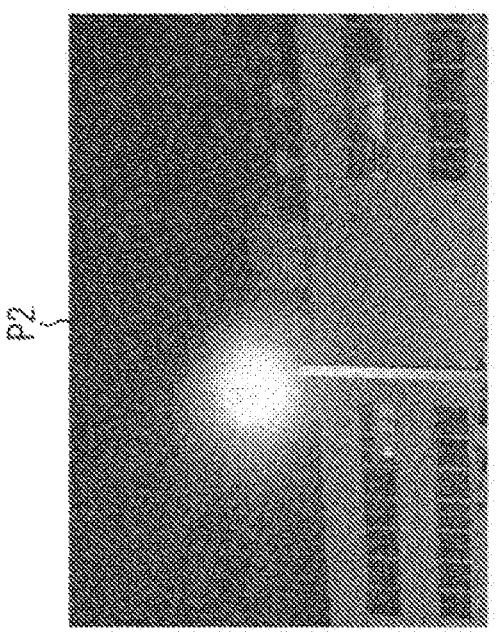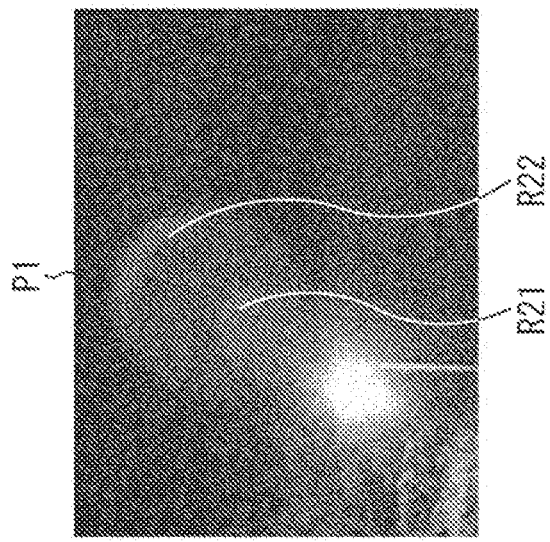
FIG. 8

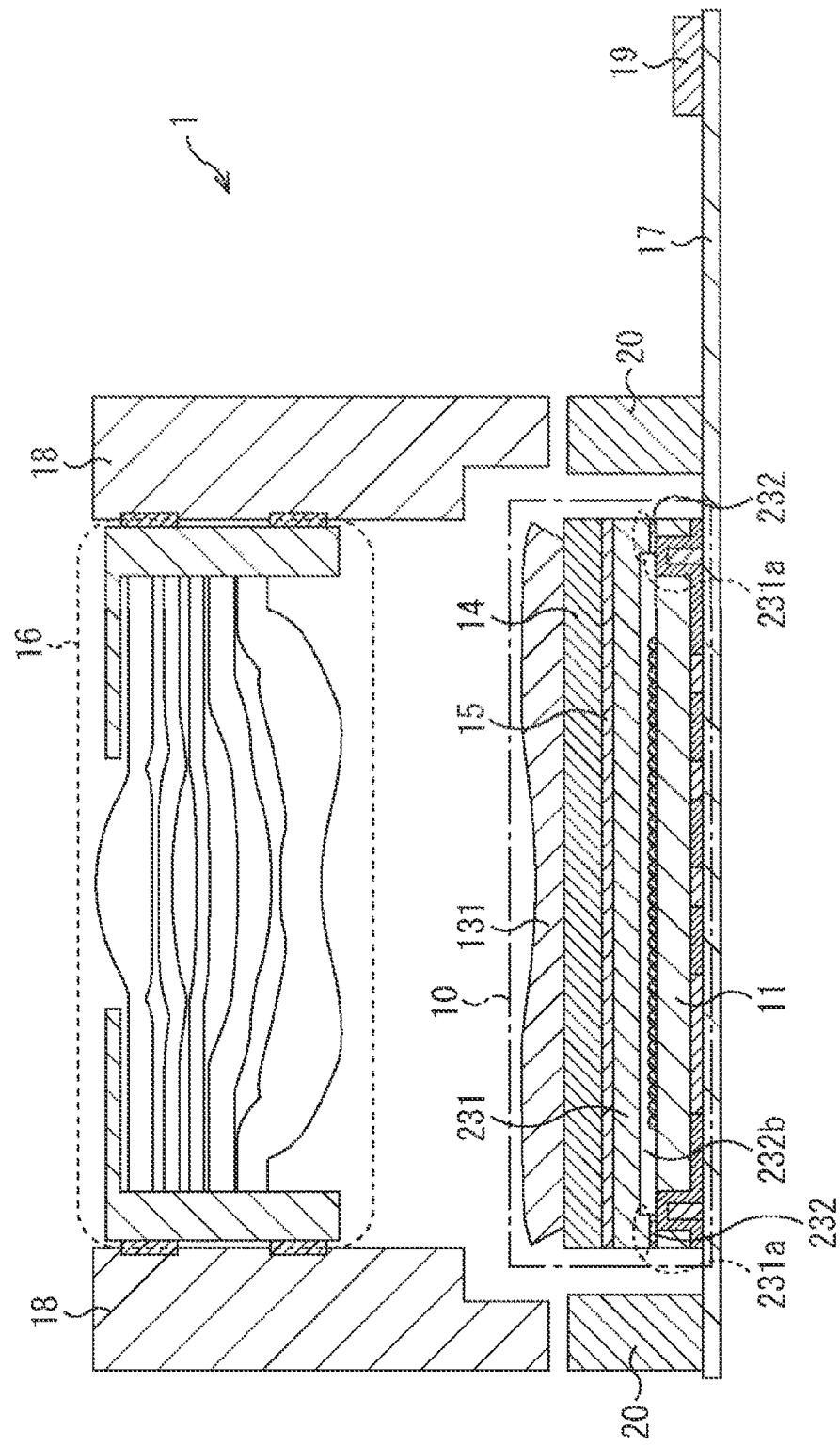
F I G. 17

FIG. 25

FIG.26
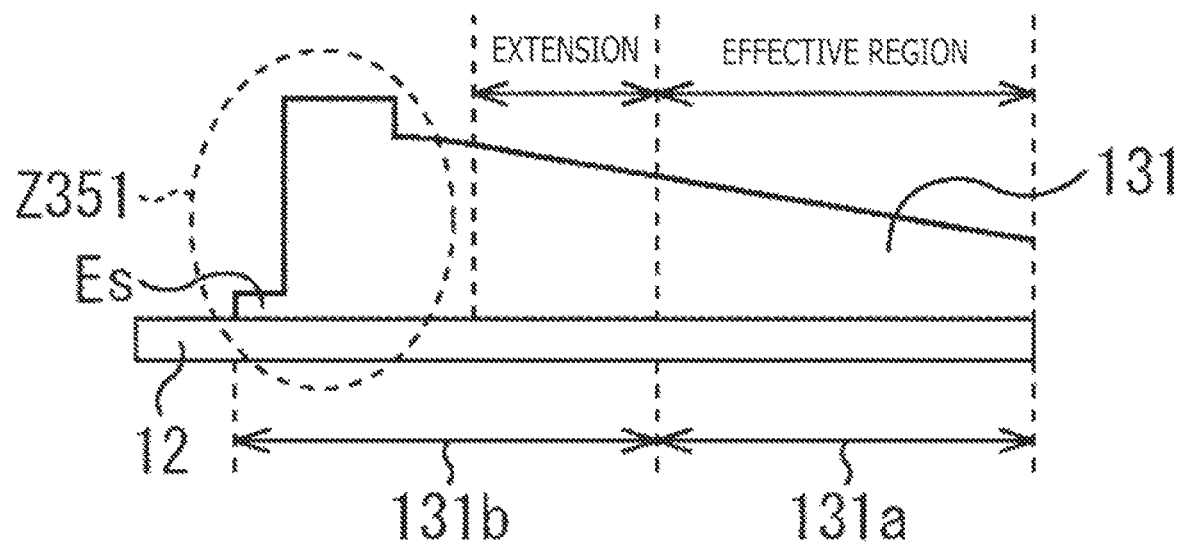
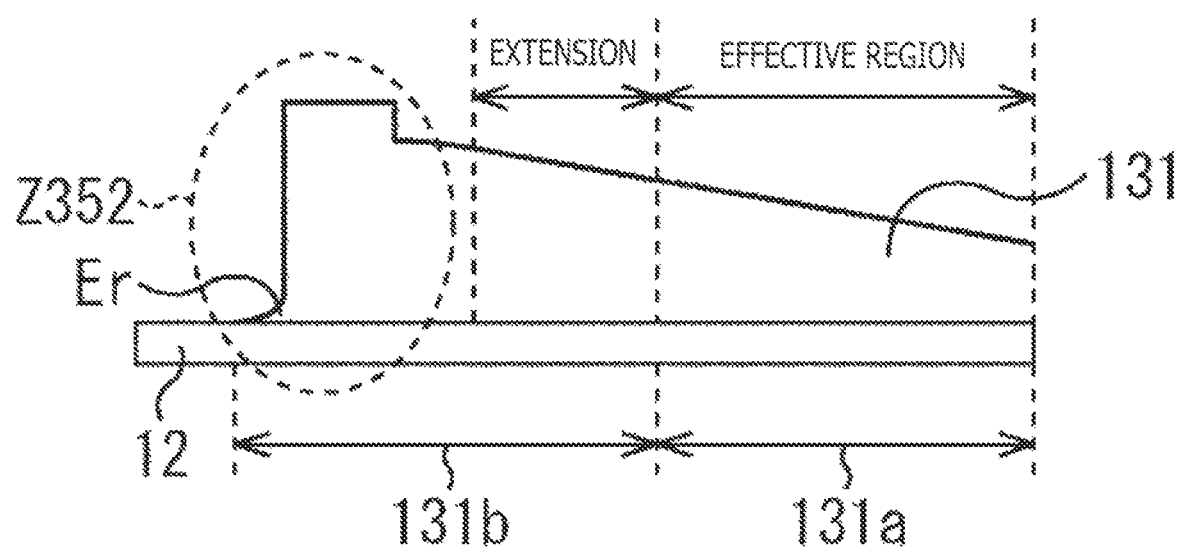

FIG.27
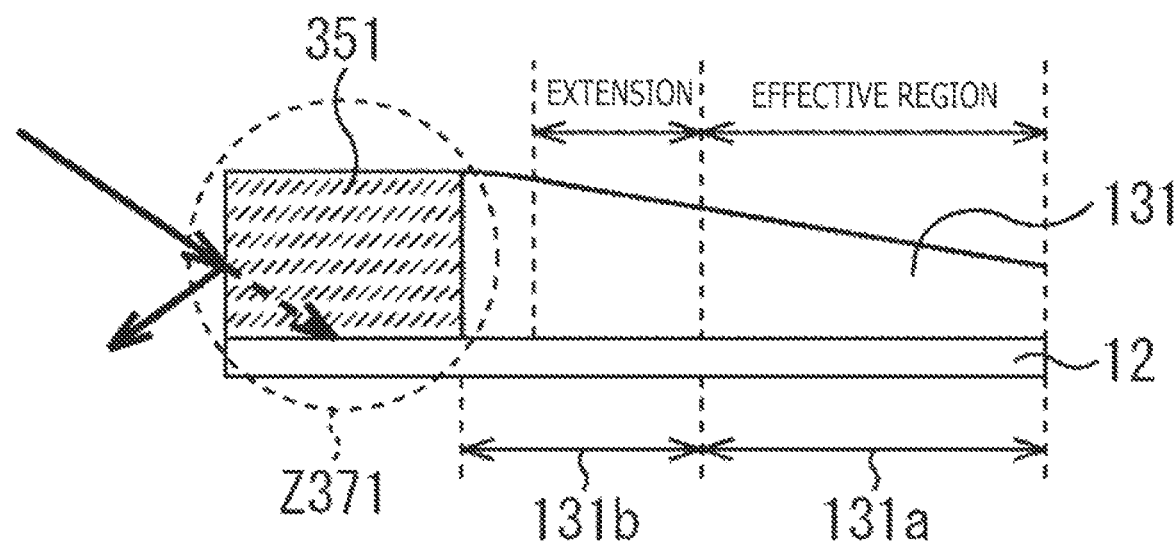
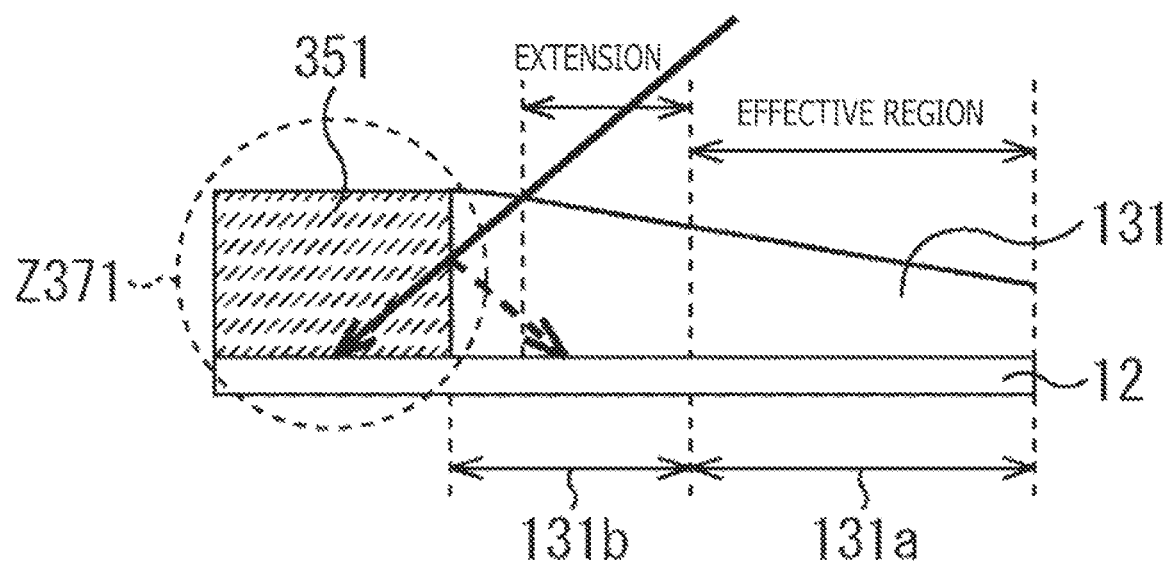

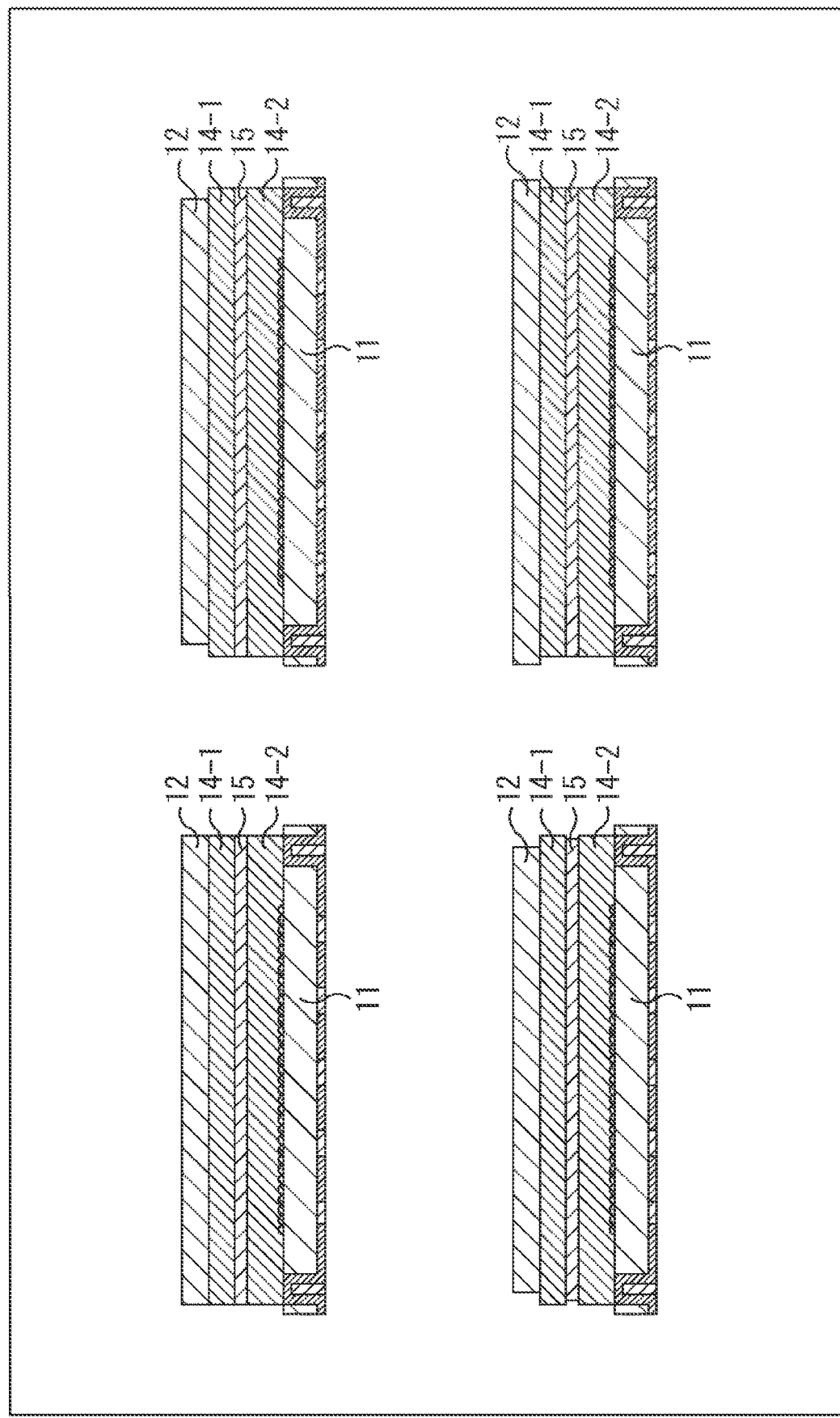
F I G . 3 1

IMAGING DEVICE

CROSS REFERENCE TO RELATED APPLICATIONS

This application is a national stage application under 35 U.S.C. 371 and claims the benefit of PCT Application No. PCT/JP2019/020603 having an international filing date of 24 May 2019, which designated the United States, which PCT application claimed the benefit of Japanese Patent Application No. 2018-110256, filed 8 Jun. 2018, the entire disclosures of each of which are incorporated herein by reference.

TECHNICAL FIELD

The present disclosure relates to an imaging device, and particularly to an imaging device capable of achieving miniaturization and height reduction of a device configuration and imaging while reducing generation of a flare and a ghost.

BACKGROUND ART

High pixelization, miniaturization, and height reduction of a solid-state imaging element included in a mobile terminal apparatus equipped with a camera, a digital still camera, and the like have been progressing in recent years.

With high pixelization and miniaturization of a camera, a lens and a solid-state imaging element are located closer to each other on an optical axis. Accordingly, an infrared cut filter is generally disposed in the vicinity of the lens.

For example, there has been proposed a technology which achieves miniaturization of a solid-state imaging element by disposing a lens, which is included in a lens group constituted by a plurality of lenses and is located in a lowermost layer, on the solid-state imaging element.

CITATION LIST

Patent Literature

[PTL 1]
JP 2015-061193A

SUMMARY

Technical Problem

However, in the case of the configuration where the lens in the lowermost layer is disposed on the solid-state imaging element, this configuration contributes to miniaturization and height reduction of the device configuration, but decreases the distance between the infrared cut filter and the lens. Accordingly, a flare or a ghost is caused by internal diffused reflection resulting from light reflection.

The present disclosure has been developed in consideration of the aforementioned circumstances, and particularly achieves miniaturization and height reduction of a solid-state imaging element, and reduces generation of a flare and a ghost.

Solution to Problem

An imaging device according to one aspect of the present disclosure is directed to an imaging device including a solid-state imaging element that generates a pixel signal by photoelectric conversion according to a light amount of incident light, and a lens group that includes a plurality of lenses and focuses the incident light on a light receiving surface of the solid-state imaging element. A lowermost layer lens included in the lens group and constituting a lowermost layer with respect to an incident direction of the incident light is provided in a foremost stage in a direction for receiving the incident light. The lowermost layer lens is an aspherical and recessed lens, a light shielding film being formed on a side surface of the lowermost layer lens.

According to the one aspect of the present disclosure, the solid-state imaging element generates the pixel signal by photoelectric conversion according to the light amount of the incident light. The lens group including the plurality of lenses focuses the incident light on the light receiving surface of the solid-state imaging element. The lowermost layer lens as an aspherical and recessed lens included in the lens group and constituting the lowermost layer with respect to the incident direction of the incident light is provided in the foremost stage in the direction for receiving the incident light. The light shielding film is formed on the side surface of the lens.

Advantageous Effects of Invention

According to one aspect of the present disclosure, miniaturization and height reduction of a device configuration for a solid-state imaging element, and also reduction of generation of a flare and a ghost are particularly achievable.

BRIEF DESCRIPTION OF DRAWINGS

FIG. 1 is a diagram explaining a configuration example of an imaging device according to a first embodiment of the present disclosure.

FIG. 7 is a diagram explaining that a ghost and a flare caused by internal diffused reflection are not generated in the imaging device of FIG. 1.

FIG. 8 is a diagram explaining that a ghost and a flare caused by internal diffused reflection are not generated in an image captured by the imaging device of FIG. 1.

FIG. 17 is a diagram explaining a configuration example of an imaging device according to a ninth embodiment of the present disclosure.

FIG. 25 is a diagram explaining modified examples of a structure of a lens end portion of FIG. 23.

FIG. 26 is another diagram explaining modified examples of the structure of the lens end portion of FIG. 23.

FIG. 27 is a still another diagram explaining a modified example of the structure of the lens end portion of FIG. 23.

FIG. 31 is a diagram explaining modified examples of an individualized cross section of a configuration example of FIG. 29.

DESCRIPTION OF EMBODIMENTS

Figure 2:
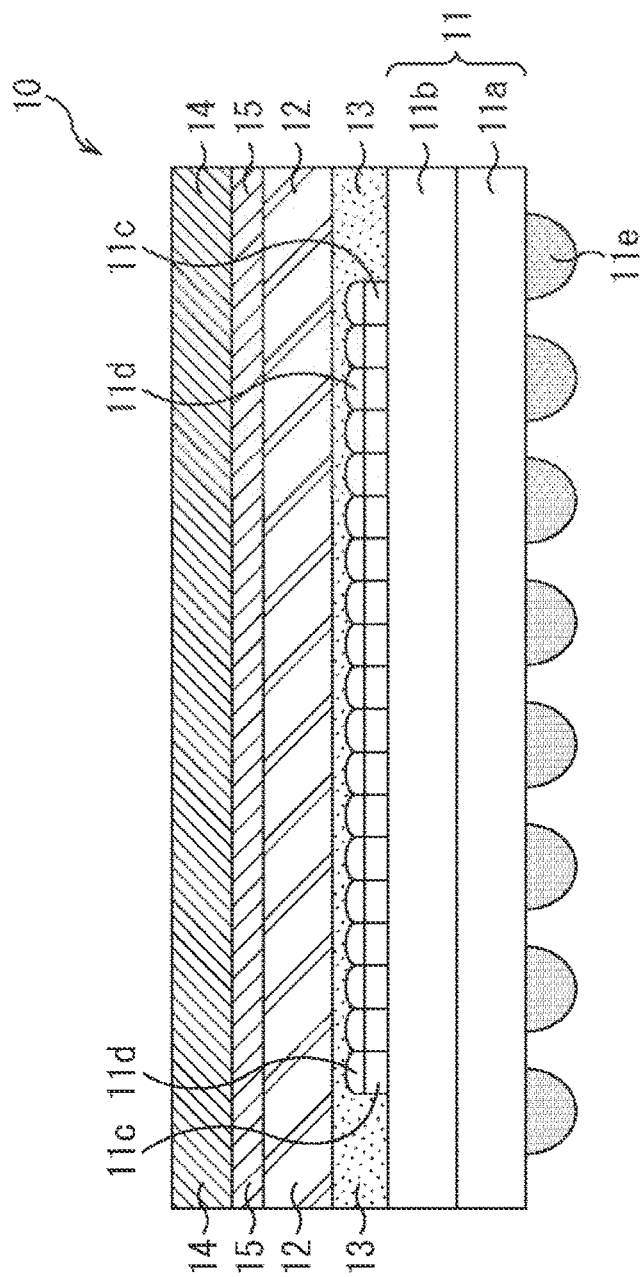
FIG. 2 is an external appearance schematic diagram of an integrated configuration unit including a solid-state imaging element of the imaging device of FIG. 1.

Preferred embodiments according to the present disclosure will be hereinafter described in detail with reference to the accompanying drawings. Note that constituent elements having substantially identical functional configurations are given identical reference signs in the present description and the drawings, and repeated description is thus omitted.

Modes for carrying out the present disclosure (hereinafter referred to as embodiments) will be hereinafter described. Note that the description will be presented in a following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Thirteenth Embodiment
14. Fourteenth Embodiment
15. Fifteenth Embodiment
16. Sixteenth Embodiment
17. Seventeenth Embodiment
18. Eighteenth Embodiment
19. Nineteenth Embodiment
20. Twentieth Embodiment
21. Twenty-First Embodiment
22. Example of application to electronic apparatus
23. Use examples of solid-state imaging device
24. Example of application to endoscopic surgery system
25. Example of application to mobile body 1. First Embodiment <Configuration Example of Imaging Device>

Described with reference to FIG. 1 will be a configuration example of an imaging device which reduces generation of a ghost and a flare while achieving miniaturization and height reduction of a device configuration according to a first embodiment of the present disclosure. Note that FIG. 1 is a side cross-sectional diagram of the imaging device.

An imaging device 1 of FIG. 1 includes a solid-state imaging element 11, a glass substrate 12, an IRCF (infrared cut filter) 14, a lens group 16, a circuit board 17, an actuator 18, a connector 19, and a spacer 20.

The solid-state imaging element 11 is an image sensor constituted by what is generally called a CMOS (Complementary Metal Oxide Semiconductor), a CCD (Charge Coupled Device), or the like, and is fixed while electrically connected on the circuit board 17. As described below with reference to FIG. 4, the solid-state imaging element 11 which includes a plurality of pixels arranged in an array generates a pixel signal corresponding to a light amount of incident light entering the solid-state imaging element 11 from an upper side in the figure after converged via the lens group 16 for each pixel, and outputs the generated signal as an image signal to the outside from the connector 19 via the circuit board 17.

The glass substrate 12 is provided on an upper surface portion of the solid-state imaging element 11 in FIG. 1 and is affixed by an adhesive (GLUE) 13 which is transparent, i.e., has substantially the same refractive index as that of the glass substrate 12.

The IRCF 14 for cutting infrared light included in incident light is provided on an upper surface portion of the glass substrate 12 in FIG. 1 and is affixed by an adhesive (GLUE) 15 which is transparent, i.e., has substantially the same refractive index as that of the glass substrate 12. For example, the IRCF 14 includes a blue plate glass and cuts off (removes) infrared light.

In other words, the solid-state imaging element 11, the glass substrate 12, and the IRCF 14 are laminated, and affixed to each other by the transparent adhesives 13 and 15 to constitute an integrated configuration, and are connected to the circuit board 17. Note that the solid-state imaging element 11, the glass substrate 12, and the IRCF 14 surrounded by a one-dot chain line in the figure are affixed to each other by the adhesives 13 and 15 having substantially the same refractive index to constitute an integrated configuration. Accordingly, the integrated configuration thus formed will be hereinafter also simply referred to as an integrated configuration unit 10.

In addition, the IRCF 14 may be individualized in a manufacturing step of the solid-state imaging element 11 and then affixed onto the glass substrate 12, or the large-sized IRCF 14 may be affixed onto the entire glass substrate 12 having a wafer shape and constituted by a plurality of the solid-state imaging elements 11 and then individualized in units of the solid-state imaging element 11. Either of these methods may be adopted.

The spacer 20 is provided on the circuit board 17 in such a manner as to surround the whole of the integrated configuration constituted by the solid-state imaging element 11, the glass substrate 12, and the IRCF 14. In addition, the actuator 18 is provided on the spacer 20. The actuator 18 having a cylindrical configuration includes the lens group 16 which is built in the actuator 18 and constituted by a plurality of laminated lenses disposed inside the cylindrical shape, and drives the lens group 16 in an up-down direction in FIG. 1.

The actuator 18 thus configured achieves auto-focusing by moving the lens group 16 in the up-down direction in FIG. 1 (a front-rear direction with respect to an optical axis) for focus adjustment such that an image of a not-depicted object is formed on an imaging surface of the solid-state imaging element 11 according to a distance to the object located in the upper side of the figure.

<External Appearance Schematic Diagram>

A configuration of the integrated configuration unit 10 will be subsequently described with reference to FIGS. 2 to 6. FIG. 2 is an external appearance schematic diagram of the integrated configuration unit 10.

The integrated configuration unit 10 depicted in FIG. 2 is a semiconductor package including the packaged solid-state imaging element 11 which includes a laminated substrate constituted by a lamination of a lower substrate 11a and an upper substrate 11b.

A plurality of solder balls lie as back electrodes for electrically connecting with the circuit board 17 in FIG. 1 is formed on the lower substrate 11a of the laminated substrate constituting the solid-state imaging element 11.

Color filters 11c in R (red), G (green), or B (blue), and on-chip lenses 11d are formed on an upper surface of the upper substrate 11b. Moreover, the upper substrate 11b is connected with the glass substrate 12 provided to protect the on-chip lens 11d. This connection is made by a non-cavity structure via the adhesive 13 made of glass seal resin.

Figure 3:
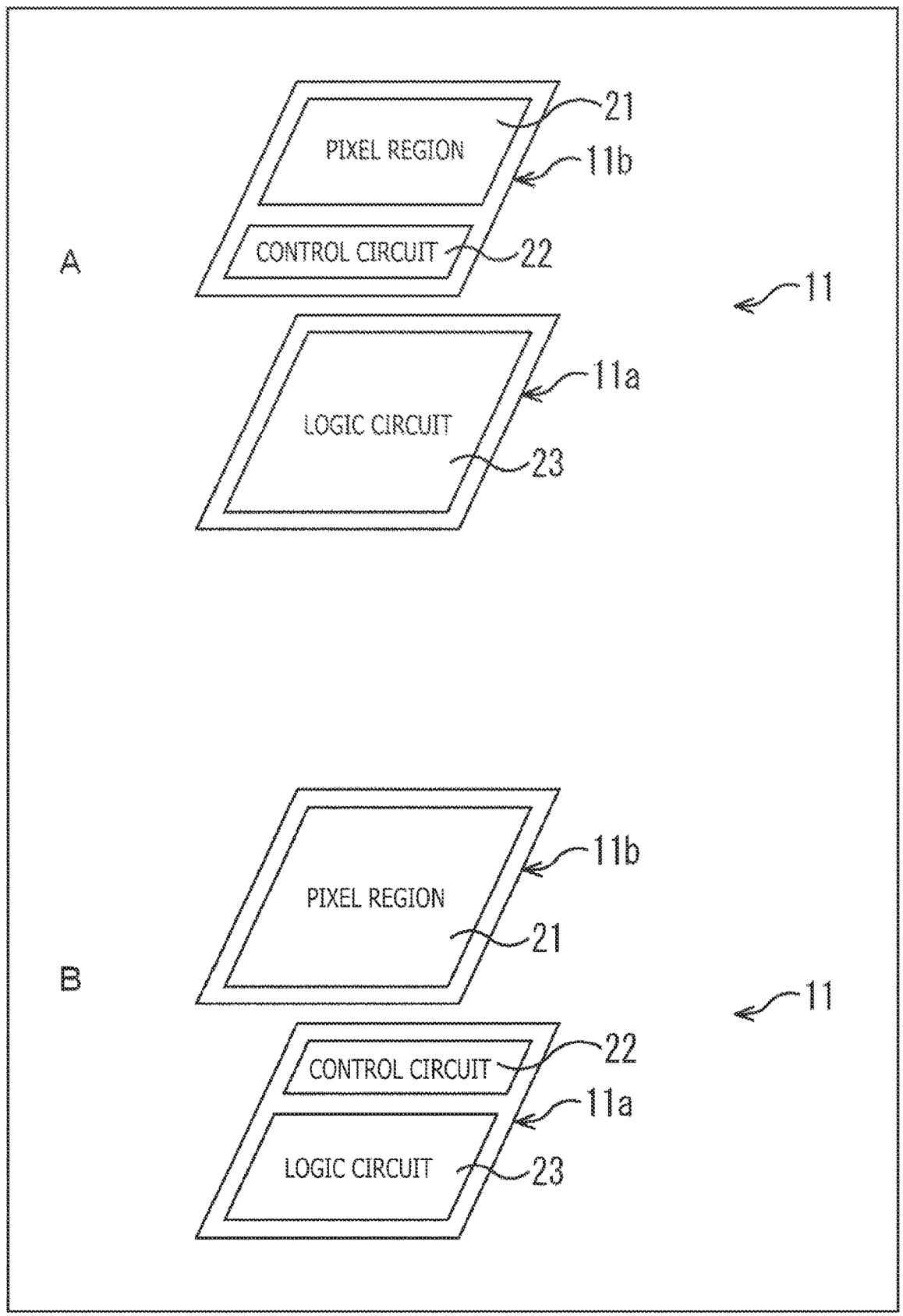
FIG. 3 depicts diagrams explaining a substrate configuration of the integrated configuration unit.

For example, as depicted in A of FIG. 3, a pixel region 21 where pixel units performing photoelectric conversion are two-dimensionally arranged in an array, and a control circuit 22 for controlling the pixel units are formed on the upper substrate 11b. On the other hand, a logic circuit 23 such as a signal processing circuit for processing pixel signals output from the pixel units is formed on the lower substrate 11a.

Alternatively, as depicted in B of FIG. 3, only the pixel region 21 may be formed on the upper substrate 11b, while the control circuit 22 and the logic circuit 23 may be formed on the lower substrate 11a.

As described above, the logic circuit 23, or both the control circuit 22 and the logic circuit 23 are formed and laminated on the lower substrate 11a different from the upper substrate 11b including the pixel region 21. In this manner, the size of the imaging device 1 can be more reduced than that size in a case where the pixel region 21, the control circuit 22, and the logic circuit 23 are disposed on one semiconductor substrate in a flat surface direction.

In the following description, the upper substrate 11b where at least the pixel region 21 is formed will be referred to as a pixel sensor substrate 11b, while the lower substrate 11a where at least the logic circuit 23 is formed will be referred to as a logic substrate 11a.

<Configuration Example of Laminated Substrate>

Figure 4:
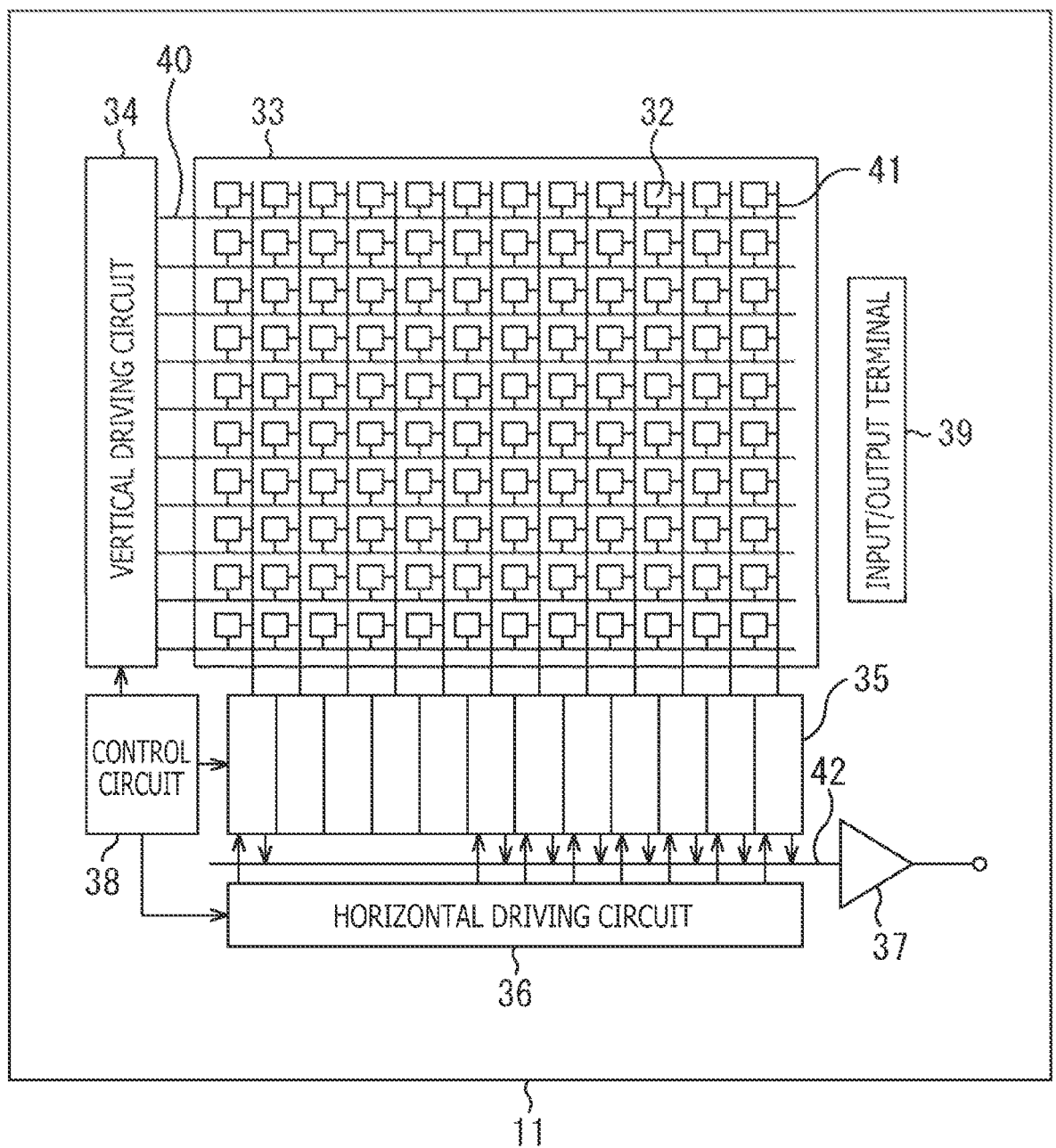
FIG. 4 is a diagram depicting a circuit configuration example of a laminated substrate.

FIG. 4 depicts a circuit configuration example of the solid-state imaging element 11.

The solid-state imaging element 11 includes a pixel array unit 33 where pixels 32 are arranged in a two-dimensional array, a vertical driving circuit 34, column signal processing circuits 35, a horizontal driving circuit 36, an output circuit 37, a control circuit 38, and an input/output terminal 39.

Each of the pixels 32 includes a photodiode as a photoelectric conversion element and a plurality of pixel transistors. A circuit configuration example of the pixels 32 will be described below with reference to FIG. 5.

In addition, each of the pixels 32 may have a shared pixel structure. This pixel shared structure includes a plurality of photodiodes, a plurality of transfer transistors, one shared floating diffusion (floating diffusion region), and shared other pixel transistors one for each. In other words, according to the configuration of the shared pixels, photodiodes and transfer transistors constituting a plurality of unit pixels have other shared pixel transistors one for each.

The control circuit 38 receives an input clock, and data for commanding an operation mode or the like, and also outputs data such as internal information associated with the solid-state imaging element 11. Specifically, the control circuit 38 generates a clock signal and a control signal as references for operations of the vertical driving circuit 34, the column signal processing circuits 35, the horizontal driving circuit 36, and the like on the basis of a vertical synchronized signal, a horizontal synchronized signal, and a master clock. Thereafter, the control circuit 38 outputs the generated clock signal and control signal to the vertical driving circuit 34, the column signal processing circuits 35, the horizontal driving circuit 36, and the like.

The vertical driving circuit 34 is constituted by a shift register, for example, and selects a designated pixel driving wire 40, supplies a pulse to the selected pixel driving wire 40 to drive the pixels 32, and drives the pixels 32 in units of row. Specifically, the vertical driving circuit 34 sequentially performs selective scanning of the respective pixels 32 of the pixel array unit 33 in units of row in the vertical direction, and supplies pixel signals based on signal charges generated by photoelectric conversion units of the respective pixels 32 according to light reception amounts, and supplies the generated pixel signals to the column signal processing circuits 35 via vertical signal lines 41.

Each of the column signal processing circuits 35 is disposed for the corresponding one of the columns of the pixels 32, and performs signal processing such as noise removal for signals output from one row of the pixels 32 for each pixel column. For example, each of the column signal processing circuits 5 performs signal processing such as CDS (Correlated Double Sampling) and AD conversion for removing fixed pattern noise peculiar to the pixels.

The horizontal driving circuit 36 is constituted by a shift register, for example, and sequentially selects each of the column signal processing circuits 35 by sequentially outputting a horizontal scanning pulse, and causes each of the column signal processing circuits 35 to output a pixel signal to the horizontal signal line 42.

The output circuit 37 performs signal processing for signals sequentially supplied from the respective column signal processing circuits 35 via the horizontal signal line 42, and outputs the processed signals. For example, the output circuit 37 performs only buffering in some cases, or performs black level adjustment, column variation correction, various digital signal processes, and the like in other cases. The input/output terminal 39 exchanges signals with the outside.

The solid-state imaging element 11 configured as above is a CMOS image sensor of what is generally called a column AD system where the column signal processing circuit 35 performing a CDS process and an AD conversion process is disposed for each of the pixel columns.

<Circuit Configuration Example of Pixel>

Figure 5:
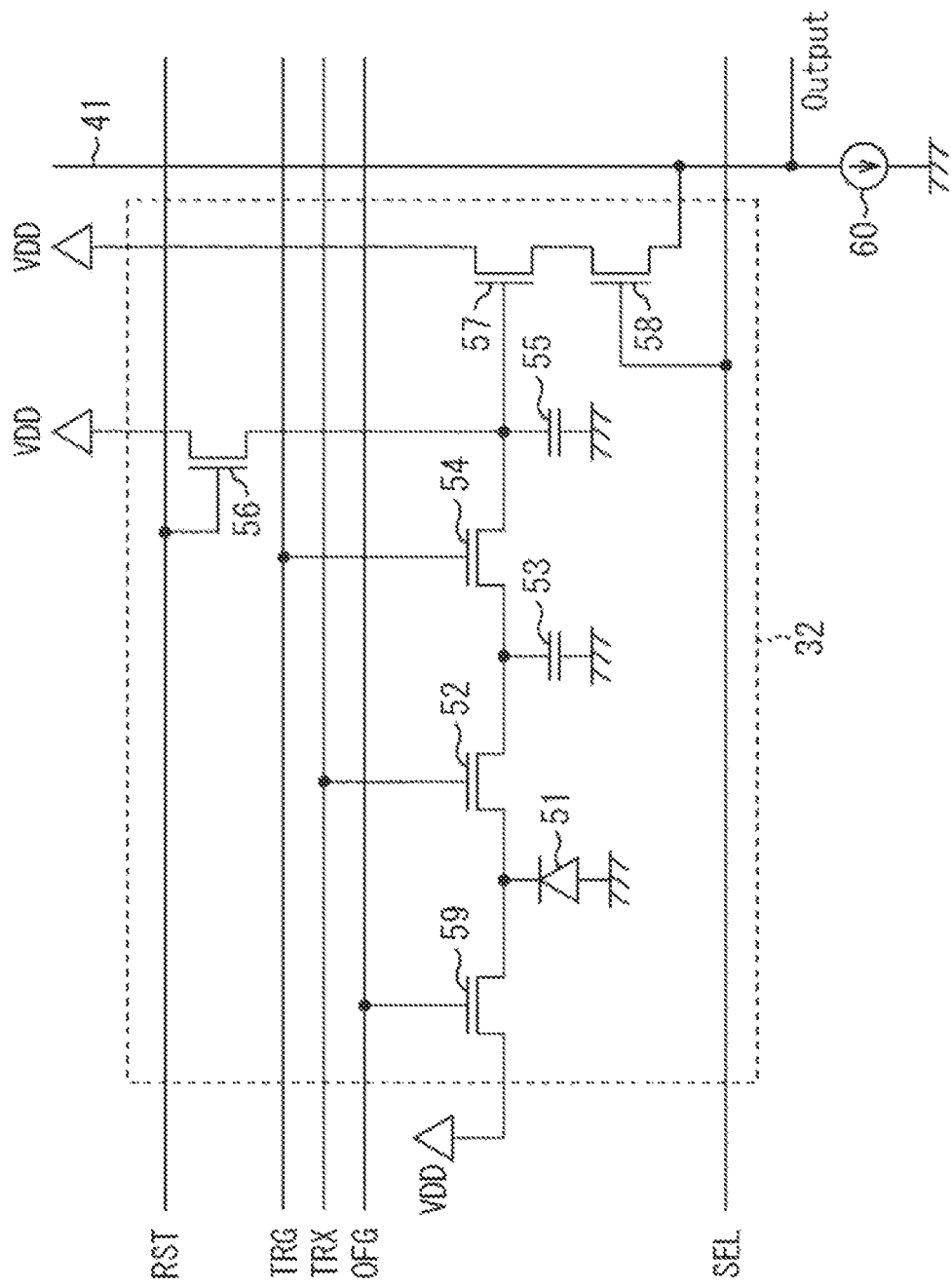
FIG. 5 is a diagram depicting an equivalent circuit of pixels.

FIG. 5 depicts an equivalent circuit of the pixel 32.

The pixel 32 depicted in FIG. 5 has a configuration for achieving an electronic type global shutter function.

The pixel 32 includes a photodiode 51 as a photoelectric conversion element, a first transfer transistor 52, a memory unit (MEM) 53, a second transfer transistor 54, an FD (floating diffusion region) 55, a reset transistor 56, an amplification transistor 57, a selection transistor 58, and a discharge transistor 59.

The photodiode 51 is a photoelectric conversion unit which generates a charge corresponding to a light reception amount (signal charge) and accumulates the charge. An anode terminal of the photodiode 51 is grounded, while a cathode terminal of the photodiode 51 is connected to the memory unit 53 via the first transfer transistor 52. Further, the cathode terminal of the photodiode 51 is also connected to the discharge transistor 59 for discharging an unnecessary charge.

The first transfer transistor 52 reads a charge generated by the photodiode 51 and transfers the charge to the memory unit 53 when the first transfer transistor 52 is turned on by a transfer signal TRX. The memory unit 53 is a charge retaining unit which temporarily retains a charge until transfer of the charge to the FD 55.

The second transfer transistor 54 reads a charge retained by the memory unit 53 and transfers the charge to the FD 55 when the second transfer transistor 54 is turned on by a transfer signal TRG.

The FD 55 is a charge retaining unit which retains a charge read from the memory unit 53 to read the charge as a signal. The reset transistor 56 resets a potential of the FD 55 by discharging a charge accumulated in the FD 55 to a constant voltage source VDD when the reset transistor 56 is turned on by a reset signal RST.

The amplification transistor 57 outputs a pixel signal corresponding to a potential of the FD 55. Specifically, the amplification transistor 57 constitutes a source follower circuit in cooperation with a load MOS 60 which is a constant current source. A pixel signal indicating a level of a charge accumulated in the FD 55 is output to the column signal processing circuit 35 (FIG. 4) from the amplification transistor 57 via the selection transistor 58. For example, the load MOS 60 is disposed within the column signal processing circuit 35.

The selection transistor 58 is turned on when the pixel 32 is selected by a selection signal SEL, and outputs a pixel signal of the pixel 32 to the column signal processing circuit 35 via the vertical signal line 41.

The discharge transistor 59 discharges an unnecessary load accumulated in the photodiode 51 to the constant voltage source VDD when the discharge transistor 59 is turned on by a discharge signal OFG.

The transfer signals TRX and TRG, the reset signal RST, the discharge signal OFG, and the selection signal SEL are supplied from the vertical driving circuit 34 via the pixel driving wire 40.

Operation of the pixels 32 will be briefly described.

Initially, the discharge transistors 59 are turned on by supplying the high-level discharge signal OFG to the discharge transistors 59 before an exposure start. Thereafter, charges accumulated in the photodiodes 51 are discharged to the constant voltage source VDD, and the photodiodes 51 of all the pixels are reset.

When the discharge transistors 59 are turned off by the low-level discharge signal OFG after the reset of the photodiodes 51, exposure of all the pixels of the pixel array unit 33 is started.

After an elapse of a predetermined exposure time determined beforehand, the first transfer transistors 52 of all the pixels of the pixel array unit 33 are turned on by the transfer signal TRX, and charges accumulated in the photodiodes 51 are transferred to the memory units 53.

After the first transfer transistors 52 are turned off, the charges retained in the memory units 53 of the respective pixels 32 are sequentially read by the column signal processing circuits 35 in units of row. In the reading operation, the second transfer transistor 54 of the pixel 32 in the reading row is turned on by the transfer signal TRG, and the charge retained in the memory unit 53 is transferred to the FD 55. Thereafter, the selection transistor 58 is turned on by the selection signal SEL. As a result, a signal indicating a level of the charge accumulated in the FD 55 is output to the column signal processing circuit 35 from the amplification transistor 57 via the selection transistor 58.

As described above, the pixel 32 including the pixel circuit of FIG. 5 is capable of performing operation (imaging) of a global shutter system which sets the same exposure time for all the pixels of the pixel array unit 33, temporarily retains charges in the memory units 53 after an exposure end, and sequentially reads the charges from the memory units 53 in units of row.

Note that the circuit configuration of each of the pixels 32 is not limited to the configuration depicted in FIG. 5, but may be a circuit configuration which does not have the memory unit 53 and performs operation of what is generally called a rolling shutter system, for example.

<Basic Structure Example of Solid-State Imaging Device>

Figure 6:
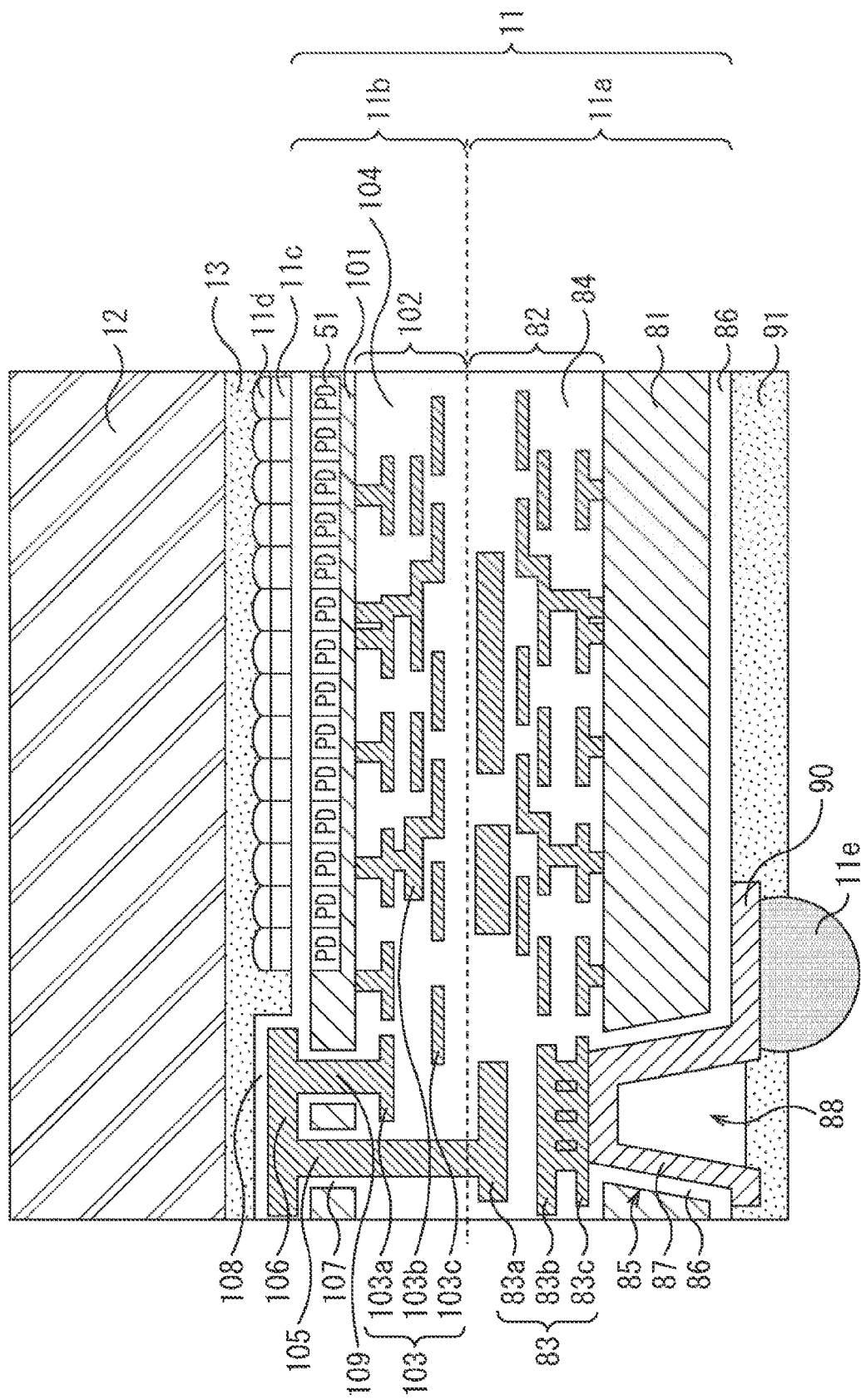
FIG. 6 is a diagram depicting a detailed structure of the laminated substrate.

A detailed structure of the solid-state imaging element 11 will be subsequently described with reference to FIG. 6. FIG. 6 is a cross-sectional diagram depicting an enlarged part of the solid-state imaging element 11.

For example, the logic substrate 11a includes a multilayer wiring layer 82 which is formed on the upper side (pixel sensor substrate 11b side) of a semiconductor substrate 81 constituted by a silicon (Si) (hereinafter referred to as silicon substrate 81), for example. The multilayer wiring layer 82 constitutes the control circuit 22 and the logic circuit 23 of FIG. 3.

The multilayer wiring layer 82 includes a plurality of wiring layers 83 constituted by a wiring layer 83a in an uppermost layer closest to the pixel sensor substrate 11b, a wiring layer 83b in a middle part, a wiring layer 83c in a lowermost layer closest to the silicon substrate 81, and others, and includes an interlayer dielectric 84 formed between the respective wiring layers 83.

The plurality of wiring layers 83 is made of copper (Cu), aluminum (Al), tungsten (W), or the like, for example, while the interlayer dielectric 84 is made of silicon oxide, silicon nitride, or the like, for example. Each of the plurality of wiring layers 83 and the interlayer dielectric 84 may be made of the same material for all the layers, or may be made of two or more materials different for each layer.

A silicon through hole 85 penetrating the silicon substrate 81 is formed at a predetermined position of the silicon substrate 81. A connection conductor 87 is embedded in an inner wall of the silicon through hole 85 via an insulation film 86 to form a silicon through electrode (TSV: Through Silicon Via) 88. For example, the insulation film 86 may be constituted by an SiO2 film, an SiN film or the like.

Note that the through electrode 88 depicted in FIG. 6 is configured such that the insulation film 86 and the connection conductor 87 are formed along the inner wall surface, and that the inside of the silicon through hole 85 is hollow. However, the inside of the silicon through hole 85 may be entirely embedded with the connection conductor 87 depending on the inner diameter of the through electrode 88. In other words, either the configuration where the inside of the through hole is embedded with conductor, or the configuration where a part of the through hole is hollow may be adopted. This is also applicable to a chip through electrode (TCV: Through Chip Via) 105 and others described below.

The connection conductor 87 of the silicon through electrode 88 is connected to rewiring 90 formed on the lower surface side of the silicon substrate 81. The rewiring 90 is connected to the solder ball lie. For example, each of the connection conductor 87 and the rewiring 90 may be made of copper (Cu), tungsten (W), polysilicon, or the like.

In addition, a solder mask (solder resist) 91 is formed in such a manner as to cover the rewiring 90 and the insulation film 86 on the lower surface side of the silicon substrate 81 except for a region where the solder ball lie is formed.

On the other hand, the pixel sensor substrate 11b includes a multilayer wiring layer 102 formed on the lower side (logic substrate 11a side) of a semiconductor substrate 101 made of silicon (Si) (hereinafter referred to as silicon substrate 101). The multilayer wiring layer 102 constitutes the pixel circuit of the pixel region 21 of FIG. 3.

The multilayer wiring layer 102 includes a plurality of wiring layers 103 constituted by a wiring layer 103a in an uppermost layer closest to the silicon substrate 101, a wiring layer 103b in a middle part, a wiring layer 103c in a lowermost layer closest to the logic substrate 11a, and others, and includes an interlayer dielectric 104 formed between the respective wiring layers 103.

Materials forming the plurality of wiring layers 103 and the interlayer dielectric 104 may be the same types of materials forming the wiring layers 83 and the interlayer dielectric 84 described above. In addition, similarly to the wiring layers 83 and the interlayer dielectric 84 described above, each of the plurality of wiring layers 103 and the interlayer dielectric 104 may be made of one material, or two or more materials different for each layer.

According to the example of FIG. 6, the multilayer wiring layer 102 of the pixel sensor substrate 11b is constituted by the three wiring layers 103, while the multilayer wiring layer 82 of the logic substrate 11a is constituted by the four wiring layers 83. However, note that the total numbers of the wiring layers are not limited to these numbers but may be any numbers of layers.

The photodiode 51 formed by pn junction is formed for each of the pixels 32 within the silicon substrate 101.

In addition, while not depicted in the figure, a plurality of pixel transistors such as the first transfer transistor 52 and the second transfer transistor 54, the memory unit (MEM) 53, and others are also included in the multilayer wiring layer 102 and the silicon substrate 101.

A silicon through electrode 109 connected to the wiring layer 103a of the pixel sensor substrate 11b, and a chip through electrode 105 connected to the wiring layer 83a of the logic substrate 11a are formed at predetermined positions of the silicon substrate 101 in a portion where the color filters 11c and the on-chip lenses 11d are not formed.

The chip through electrode 105 and the silicon through electrode 109 are connected by connection wiring 106 formed on an upper surface of the silicon substrate 101. In addition, an insulation film 107 is formed between the silicon substrate 101 and each of the silicon through electrode 109 and the chip through electrode 105. The color filters 11c and the on-chip lenses 11d are further formed on the upper surface of the silicon substrate 101 via a flattening film (insulation film) 108.

As described above, the solid-state imaging element 11 depicted in FIG. 2 has a laminated structure produced by affixing the multilayer wiring layer 102 side of the logic substrate 11a and the multilayer wiring layer 82 side of the pixel sensor substrate 11b. In FIG. 6, an affixing plane of the multilayer wiring layer 102 side of the logic substrate 11a and the multilayer wiring layer 82 side of the pixel sensor substrate 11b is indicated by a broken line.

In addition, according to the solid-state imaging element 11 of the imaging device 1, the wiring layer 103 of the pixel sensor substrate 11b and the wiring layer 83 of the logic substrate 11a are connected by two through electrodes constituted by the silicon through electrode 109 and the chip through electrode 105, while the wiring layer 83 of the logic substrate 11a and the solder ball (back electrode) lie are connected by the silicon through electrode 88 and the rewiring 90. In this manner, a plane area of the imaging device 1 can be reduced to a minimum.

Moreover, the solid-state imaging element 11 and the glass substrate 12 are affixed by a non-cavity structure using the adhesive 13 to reduce a length in a height direction.

Accordingly, the imaging device 1 depicted in FIG. 1 is capable of actualizing a more miniaturized semiconductor device (semiconductor package).

According to the configuration of the imaging device 1 described above, the IRCF 14 is provided above the solid-state imaging element 11 and the glass substrate 12. Accordingly, generation of a flare and a ghost caused by internal diffused reflection of light can be reduced.

Specifically, in a case where the IRCF 14 is provided in the vicinity of an intermediate position between the lens (Lens) 16 and the glass substrate (Glass) 12 away from the glass substrate 12 as depicted in a left part of FIG. 7, incident light is converged as indicated by a solid line, enters the solid-state imaging element 11 (CIS) at a position F0 via the IRCF 14, the glass substrate 12, and the adhesive 13, and then is reflected at the position F0 as indicated by dotted lines to be produced as reflection light.

As indicated by dotted lines, for example, a part of the reflection light reflected at the position F0 is reflected on a rear surface R1 of the IRCF 14 (lower surface in FIG. 7) disposed at a position away from the glass substrate 12 via the adhesive 13 and the glass substrate 12, and again enters the solid-state imaging element 11 at a position F1 again via the glass substrate 12 and the adhesive 13.

In addition, as indicated by dotted lines, for example, another part of the reflection light reflected at the focus F0 passes through the adhesive 13, the glass substrate 12, and the IRCF 14 disposed at a position away from the glass substrate 12, and is reflected on an upper surface R2 of the IRCF 14 (upper surface in FIG. 7), and again enters the solid-state imaging element 11 at a position F2 via the IRCF 14, the glass substrate 12, and the adhesive 13.

The lights again entering at the positions F1 and F2 produce a flare or a ghost caused by internal diffused reflection. More specifically, as depicted in an image P1 of FIG. 8, a flare or a ghost appears as indicated by reflection lights R21 and R22 during imaging an illumination L by the solid-state imaging element 11.

On the other hand, when the IRCF 14 is provided on the glass substrate 12 as that in the imaging device 1 depicted in a right part of FIG. 7 and corresponding to the configuration of the imaging device 1 of FIG. 1, incident light indicated by solid lines is converged, enters the solid-state imaging element 11 at a position F0 via the IRCF 14, the adhesive 15, the glass substrate 12, and the adhesive 13, and then is reflected as indicated by dotted lines. Thereafter, the reflected light is reflected on a lens surface R11 in the lowermost layer on the lens group 16 via the adhesive 13, the glass substrate 12, the adhesive 15, and the IRCF 14. However, in a state where the lens group 16 is located sufficiently away from the IRCF 14, this light is reflected in such a range as not to be sufficiently received by the solid-state imaging element 11.

The solid-state imaging element 11, the glass substrate 12, and the IRCF 14 surrounded by a one-dot chain line in the figure here are affixed to each other by the adhesives 13 and 15 having substantially the same refractive index to constitute the integrated configuration unit 10 as an integrated configuration. According to the integrated configuration unit 10, internal diffused reflection caused at a boundary between layers having different refractive indexes is reduced by equalizing refractive indexes to reduce reentrance of light at the positions F1 and F2 located close to the position F0 in the left part of FIG. 7, for example.

In this manner, for imaging the illumination L, the imaging device 1 of FIG. 1 is capable of capturing an image where a flare or a ghost caused by internal diffused reflection, such as the reflection lights R21 and R22 in the image P1, is reduced as indicated by an image P2 of FIG. 8.

As a result, reduction of a flare of a ghost caused by internal diffused reflection can be achieved as well as miniaturization and height reduction of the device configuration by the configuration of the imaging device 1 in the first embodiment depicted in FIG. 1.

Note that the image P1 of FIG. 8 is a captured image of the illumination L at night by using the imaging device 1 having the configuration in the left part of FIG. 7, while the image P2 is a captured image of the illumination L at night by the imaging device 1 (of FIG. 1) having the configuration in the right part of FIG. 7.

In addition, while the example described above is the configuration which achieves auto-focusing by adjusting a focal distance according to a distance to an object by moving the lens group 16 in the up-down direction in FIG. 1 using the actuator 18, a function of what is generally called a single focus lens may be performed while eliminating the actuator 18 and adjustment of the focal distance by the lens group 16.

2. Second Embodiment

According to the example presented in the first embodiment described above, the IRCF 14 is affixed onto the glass substrate 12 affixed to the imaging surface side of the solid-state imaging element 11. In this case, the lens in the lowermost layer constituting the lens group 16 may be further provided on the IRCF 14.

Figure 9:
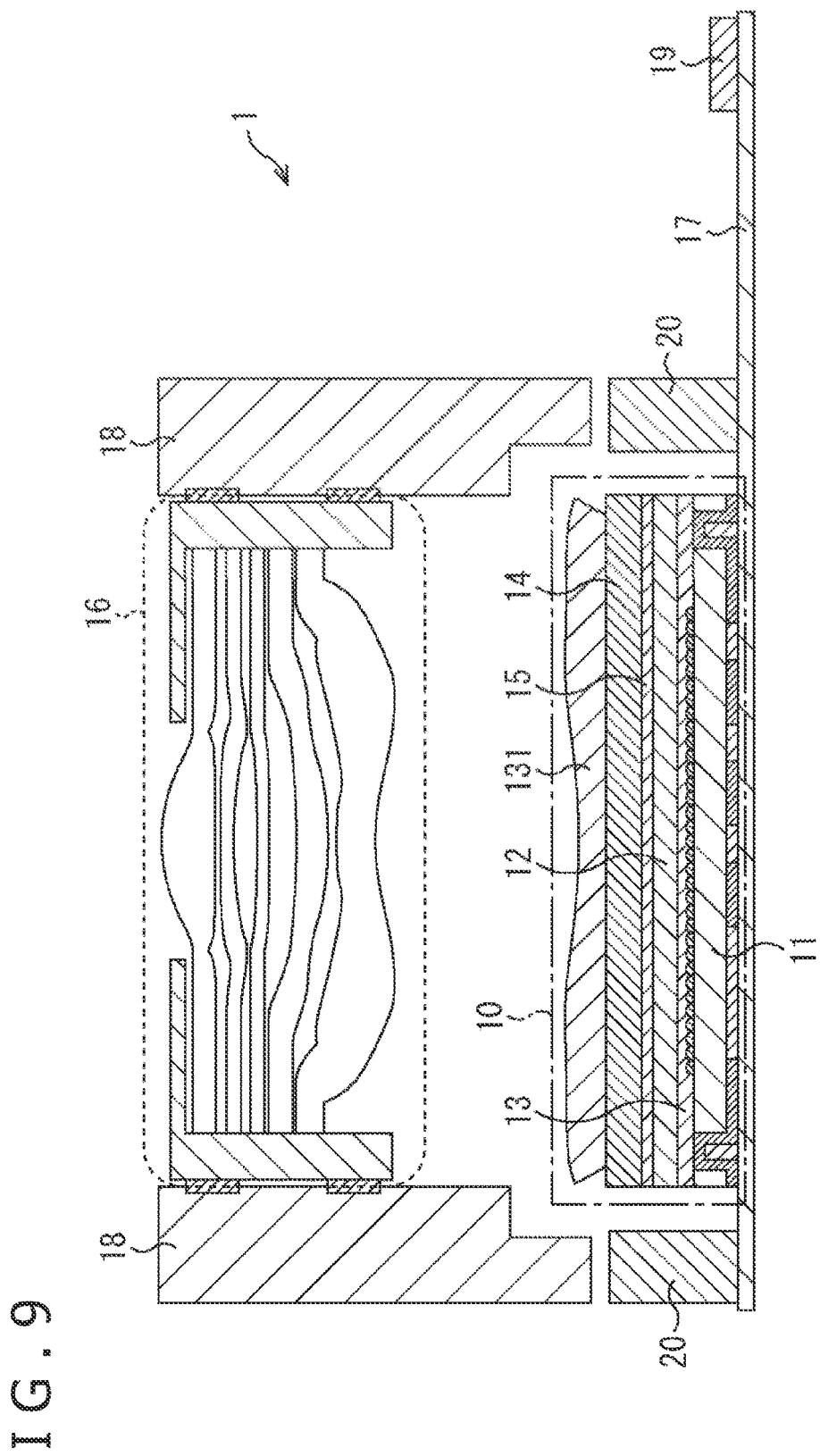
FIG. 9 is a diagram explaining a configuration example of an imaging device according to a second embodiment of the present disclosure.

FIG. 9 depicts a configuration example of the imaging device 1 which separates, from the lens group 16, the lens in the lowermost layer with respect to a light incident direction in the lens group 16 constituted by a plurality of lenses forming the imaging device 1 of FIG. 1, and provides the separated lens on the IRCF 14. Note that configurations depicted in FIG. 5 and having functions basically identical to the functions of the configurations of FIG. 1 are given identical reference signs. Description of those configurations will be omitted where appropriate.

Specifically, the imaging device 1 of FIG. 9 is different from the imaging device 1 of FIG. 1 in that a lens 131 in the lowermost layer with respect to a light incident direction in the plurality of lenses constituting the lens group 16 is further separated from the lens group 16 and provided on the upper surface of the IRCF 14 in the figure. Note that the lens group 16 of FIG. 9 is given a reference sign identical to the reference sign of the lens group 16 of FIG. 1, but is different from the lens group 16 of FIG. 1 in a strict sense in a point that the lens 131 located in the lowermost layer with respect to the light incident direction is not included.

According to the configuration of the imaging device 1 as depicted in FIG. 9, the IRCF 14 is provided on the glass substrate 12 formed on the solid-state imaging element 11. Further, the lens 131 in the lowermost layer constituting the lens group 16 is provided on the IRCF 14. Accordingly, generation of a flare and a ghost caused by internal diffused reflection of light can be reduced.

Figure 10:
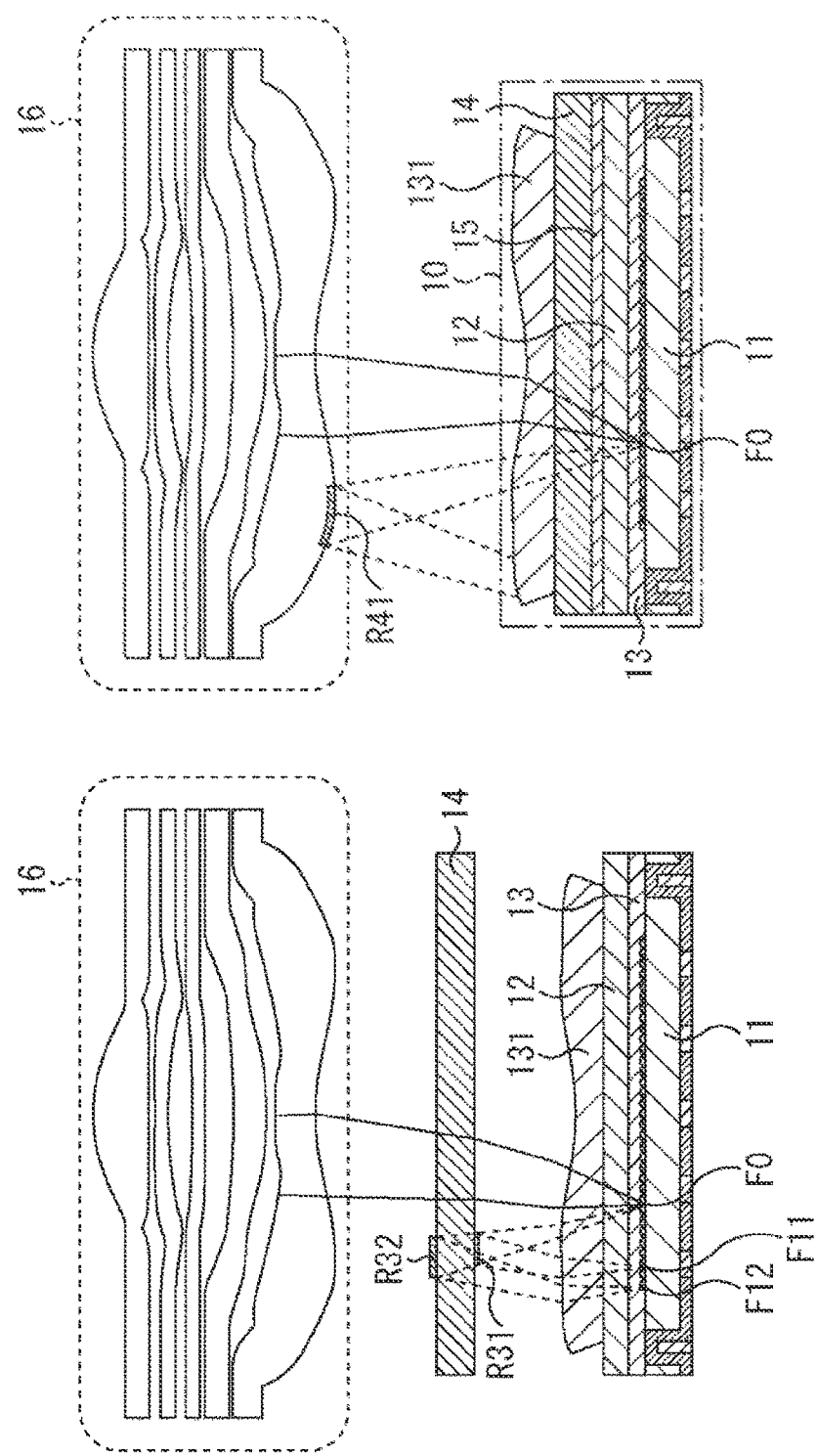
FIG. 10 is a diagram explaining that a ghost and a flare caused by internal diffused reflection are not generated in the imaging device of FIG. 9.

Specifically, in a case where the lens 131 in the lowermost layer of the lens group 16 with respect to the light incident direction is provided on the glass substrate 12 in a state where the IRCF 14 is provided in the vicinity of an intermediate position between the lens group 16 and the lens 131 and away from the lens 131 as depicted in a left part of FIG. 10, incident light indicated by solid lines is converged, enters the solid-state imaging element 11 at the position F0 via the IRCF 14, the lens 131, the glass substrate 12, and the adhesive 13, and then is reflected from the position F0 as indicated by dotted lines to be produced as reflection light.

As indicated by dotted lines, for example, a part of the reflection light reflected at the position F0 is reflected on a rear surface R31 of the IRCF 14 (lower surface in FIG. 2) disposed at a position away from the lens 131 via the adhesive 13, the glass substrate 12, and the lens 131, and again enters the solid-state imaging element 11 at a position F11 via the lens 131, the glass substrate 12, and the adhesive 13.

In addition, as indicated by dotted lines, for example, another part of the reflection light reflected at the focus F0 passes through the adhesive 13, the glass substrate 12, the lens 131, and the IRCF 14 disposed at a position away from the lens 131, and is reflected on an upper surface R32 of the IRCF 14 (upper surface in FIG. 7), and again enters the solid-state imaging element 11 at a position F12 via the IRCF 14, the lens 131, the glass substrate 12, and the adhesive 13.

The light again entering at the positions F11 and F12 appears as a flare or a ghost in the solid-state imaging element 11. A principle applicable to this point is basically similar to the principle of the case where the reflection lights R21 and R21 of the illumination L in the image P1 described with reference to FIG. 8 reenter at the positions F1 and F2 of FIG. 7.

On the other hand, similarly to the configuration of the imaging device 1 of FIG. 9, when the lens 131 in the lowermost layer of the lens group 16 is provided on the IRCF 14 as depicted in a right part of FIG. 10, incident light is converged and enters the solid-state imaging element 11 at the position F0 via the lens 131, the IRCF 14, the adhesive 15, the glass substrate 12, and the adhesive 13 as indicated by solid lines, and then is reflected and produced as reflection light reflected on a surface R41 on the lens group 16 at a position sufficiently away via the adhesive 13, the glass substrate 12, the adhesive 15, the IRCF 14, and the lens 131 as indicated by dotted lines. In this case, the reflection light is reflected in a range substantially unreceivable by the solid-state imaging element 11. Accordingly, generation of a flare or a ghost can be reduced.

Specifically, the solid-state imaging element 11, the adhesive 13, the glass substrate 12, and the IRCF 14 are affixed to each other by the adhesives 13 and 15 having substantially the same refractive index to constitute an integrated configuration. In this case, the refractive index of the integrated configuration unit 10 as an integrated configuration surrounded by a one-dot chain line in the figure is equalized. Accordingly, internal diffused reflection caused at a boundary of layers having different refractive indexes is reduced, and entrance of reflection light to the positions F11 and F12 close to the position F0 is reduced as depicted in a left part of FIG. 10, for example.

As a result, reduction of a flare of a ghost caused by internal diffused reflection can be achieved as well as miniaturization and height reduction of the device configuration by the configuration of the imaging device 1 in the second embodiment depicted in FIG. 10.

3. Third Embodiment

According to the example presented in the second embodiment described above, the lens 131 in the lowermost layer is provided on the IRCF 14. In this case, the lens 131 in the lowermost layer and the IRCF 14 may be affixed to each other by an adhesive.

Figure 11:
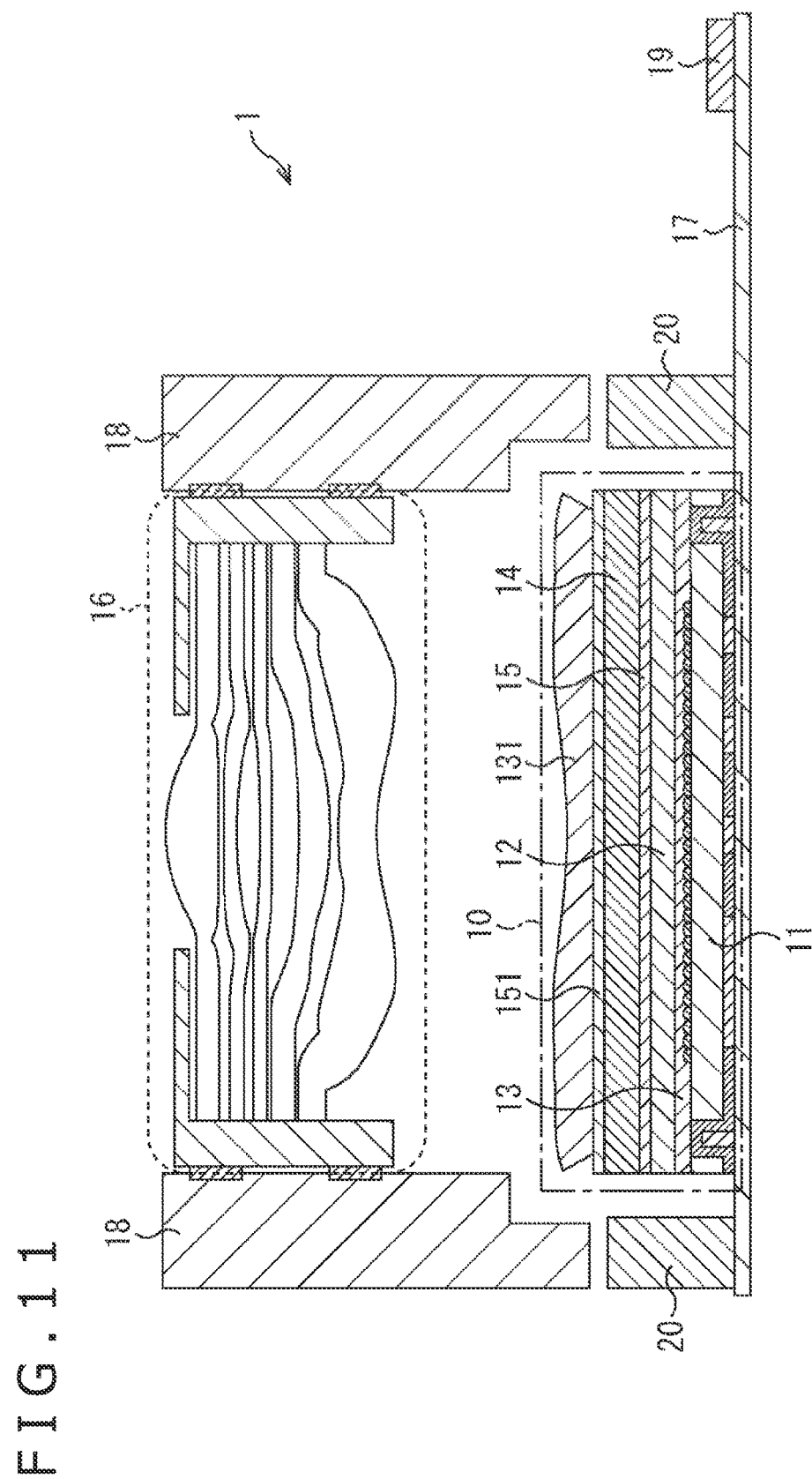
FIG. 11 is a diagram explaining a configuration example of an imaging device according to a third embodiment of the present disclosure.

FIG. 11 depicts a configuration example of the imaging device 1 where the lens 131 in the lowermost layer and the IRCF 14 are affixed to each other by an adhesive. Note that configurations included in the imaging device 1 of FIG. 11 and having functions basically identical to the functions of the configurations of the imaging device 1 of FIG. 9 are given identical reference signs. Description of those configurations will be omitted where appropriate.

Specifically, the imaging device 1 of FIG. 11 is different from the imaging device 1 of FIG. 9 in that the lens 131 in the lowermost layer and the IRCF 14 are affixed to each other by an adhesive 151 which is transparent, i.e., has substantially the same refractive index.

According to the configuration of the imaging device 1 of FIG. 11, generation of a flare and a ghost can be reduced similarly to the imaging device 1 of FIG. 9.

Moreover, in a case where the lens 131 does not have high flatness, the IRCF 14 may deviate from an optical axis of the lens 131 when fixation to the IRCF 14 without using the adhesive 151 is attempted. However, by affixing the lens 131 and the IRCF 14 to each other by the adhesive 151, the IRCF 14 can be fixed without deviation from the optical axis of the lens 131 even when the lens 131 does not have high flatness. Accordingly, reduction of distortion of an image generated by deviation of the optical axis is achievable.

4. Fourth Embodiment

According to the example presented in the second embodiment described above, the lens 131 in the lowermost layer with respect to the light incident direction is provided on the IRCF 14. However, not only the lens 131 in the lowermost layer but also a plurality of lenses constituting the lowermost layer of the lens group 16 may be provided on the IRCF 14.

Figure 12:
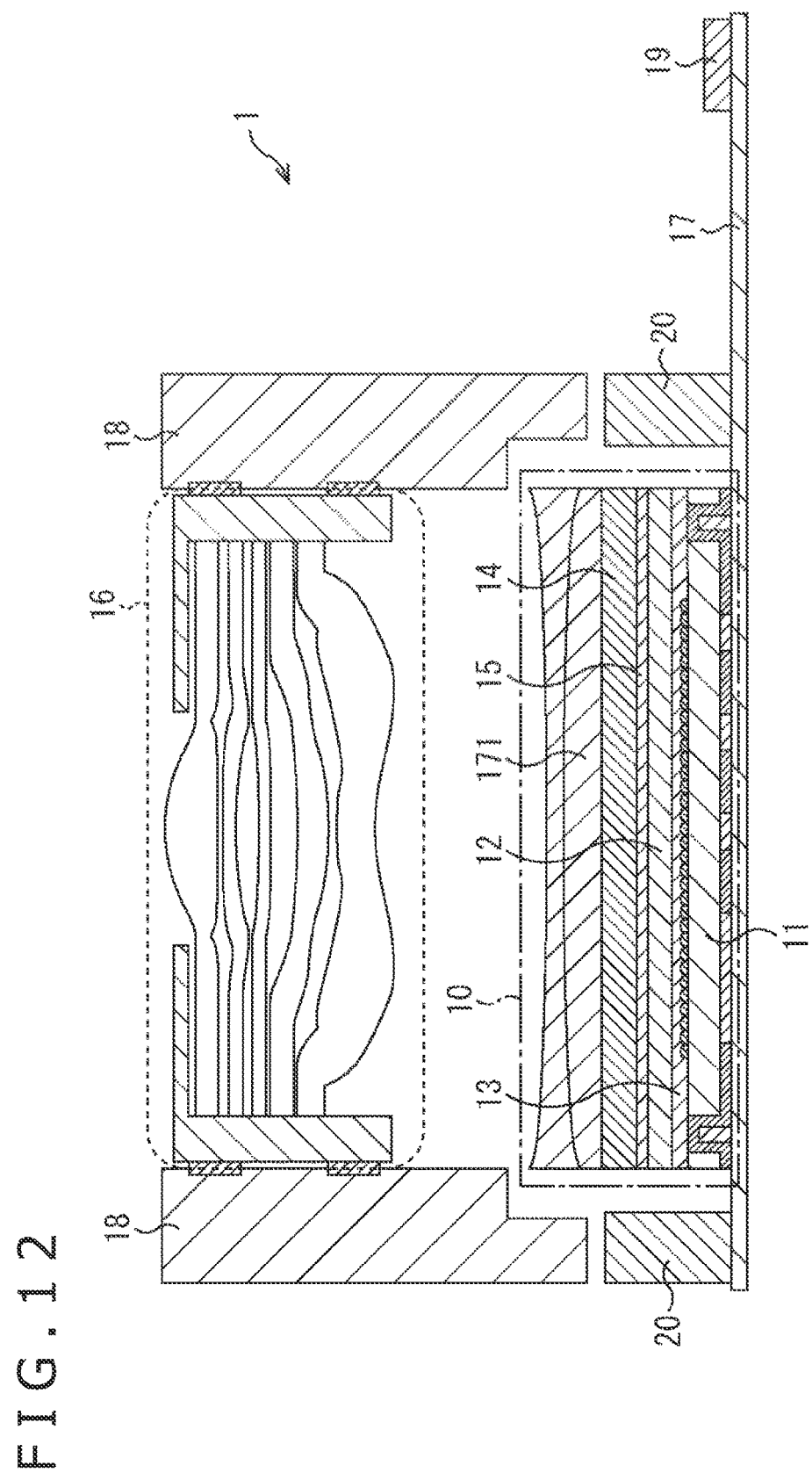
FIG. 12 is a diagram explaining a configuration example of an imaging device according to a fourth embodiment of the present disclosure.

FIG. 12 depicts a configuration example of the imaging device 1 which includes a lens group included in the lens group 16 and constituted by a plurality of lenses forming the lowermost layer with respect to the incident direction, as a lens group disposed on the IRCF 14. Note that configurations included in the imaging device 1 of FIG. 12 and having functions basically identical to the functions of the configurations of the imaging device 1 of FIG. 9 are given identical reference signs. Description of those configurations will be omitted where appropriate.

Specifically, the imaging device 1 of FIG. 12 is different from the imaging device 1 of FIG. 9 in that, instead of the lens 131, a lens group 171 included in the lens group 16 and constituted by a plurality of lenses forming the lowermost layer with respect to the light incident direction is provided on the IRCF 14. Note that, while FIG. 12 depicts an example of the lens group 171 constituted by two lenses, the lens group 171 may be constituted by a larger number of lenses.

According to such a configuration, generation of a flare and a ghost can be reduced similarly to the imaging device 1 of FIG. 9.

Moreover, the lens group 171 which is included in the plurality of lenses constituting the lens group 16 and forms the lowermost layer is provided on the IRCF 14. In this case, the number of lenses constituting the lens group 16 is allowed to decrease, and the lens group 16 thus becomes lightweight. Accordingly, a driving amount used by the actuator 18 for auto-focusing is allowed to decrease, and therefore miniaturization and power reduction of the actuator 18 are achievable.

Note that the lens 131 included in the imaging device 1 of FIG. 11 in the third embodiment may be affixed to the IRCF 14 by using the adhesive 151 which is transparent, instead of the lens group 171.

5. Fifth Embodiment

According to the example presented in the second embodiment described above, the glass substrate 12 is affixed onto the solid-state imaging element 11 via the adhesive 13, while the IRCF 14 is affixed onto the glass substrate 12 via the adhesive 15. However, each of the glass substrate 12, the adhesive 15, and the IRCF 14 may be replaced with a configuration having both the function of the glass substrate 12 and the function of the IRCF 14, and affixed onto the solid-state imaging element 11 via the adhesive 13.

Figure 13:
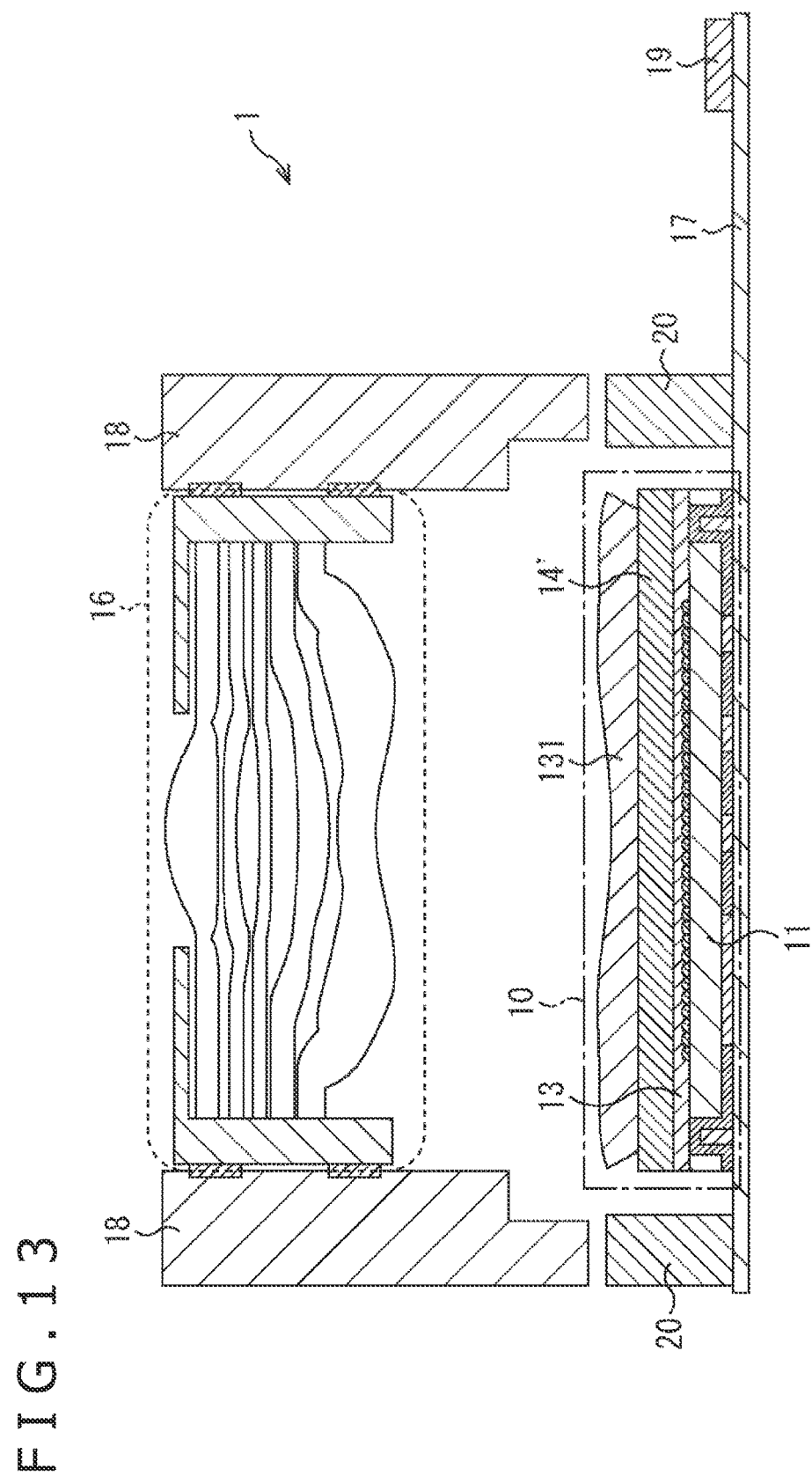
FIG. 13 is a diagram explaining a configuration example of an imaging device according to a fifth embodiment of the present disclosure.

FIG. 13 depicts a configuration example of the imaging device 1 in which the glass substrate 12, the adhesive 15, and the IRCF 14 are replaced with a configuration having both the function of the glass substrate 12 and the function of the IRCF 14, and affixed onto the solid-state imaging element 11 via the adhesive 13. The lens 131 in the lowermost layer is provided on this configuration. Note that configurations included in the imaging device 1 of FIG. 13 and having functions basically identical to the functions of the configurations of the imaging device 1 of FIG. 9 are given identical reference signs. Description of those configurations will be omitted where appropriate.

Specifically, the imaging device 1 of FIG. 13 is different from the imaging device 1 of FIG. 9 in that the glass substrate 12 and the IRCF 14 are replaced with an IRCF glass substrate 14' having the function of the glass substrate 12 and the function of the IRCF 14. The IRCF glass substrate 14' is affixed onto the solid-state imaging element 11 via the adhesive 13, and the lens 131 in the lowermost layer is provided on the IRCF 14'.

According to such a configuration, generation of a flare and a ghost can be reduced similarly to the imaging device 1 of FIG. 9.

Specifically, at present, for miniaturization of the solid-state imaging element 11, the glass substrate 12 called a CSP (Chip Size Package) structure and the solid-state imaging element 11 are bonded to each other, and the solid-state imaging element 11 is thinned with the glass substrate designated as a basic substrate. In this manner, a miniaturized solid-state imaging element is realizable. In FIG. 13, the IRCF glass substrate 14' performs the function of the glass substrate 12 having high flatness as well as the function of the IRCF 14. Accordingly, height reduction is achievable.

Note that the glass substrate 12, the adhesive 15, and the IRCF 14 included in the imaging device 1 of FIGS. 1, 11, and 12 in the first embodiment, the third embodiment, and the fourth embodiment may be replaced with the IRCF glass substrate 14' having both the function of the glass substrate 12 and the function of the IRCF 14.

6. Sixth Embodiment

According to the example presented in the fourth embodiment described above, the glass substrate 12 is affixed onto the solid-state imaging element 11 having the CSP structure via the adhesive 13. In addition, the IRCF 14 is affixed onto the glass substrate 12 via the adhesive 15, and also the lens group 171 constituted by the plurality of lenses in the lowermost layer in the plurality of lenses constituting the lens group 16 is provided on the IRCF 14. However, the solid-state imaging element 11 having a COB (Chip on Board) structure may be used instead of the solid-state imaging element 11 having the CSP structure.

Figure 14:
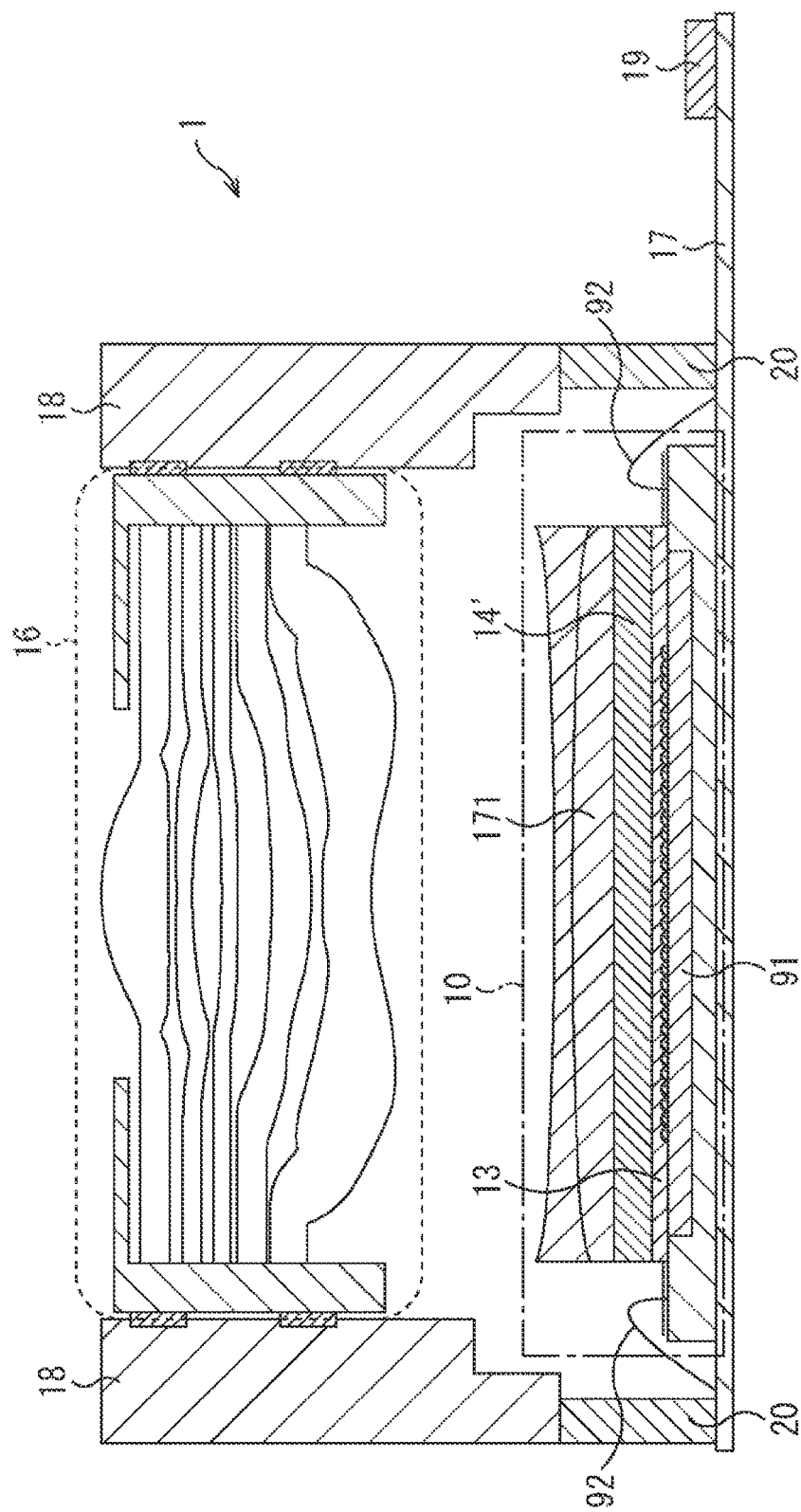
FIG. 14 is a diagram explaining a configuration example of an imaging device according to a sixth embodiment of the present disclosure.

According to a configuration example depicted in FIG. 14, the glass substrate 12 and the IRCF 14 included in the imaging device 1 of FIG. 12 are replaced with the IRCF glass substrate 14' having the function of the glass substrate 12 and the function of the IRCF 14, and the solid-state imaging element 11 having the COB (Chip on Board) structure is used instead of the solid-state imaging element 11 having the CSP structure. Note that configurations included in the imaging device 1 of FIG. 14 and having functions basically identical to the functions of the configurations of the imaging device 1 of FIG. 12 are given identical reference signs. Description of those configurations will be omitted where appropriate.

Specifically, the imaging device 1 of FIG. 14 is different from the imaging device 1 of FIG. 12 in that the glass substrate 12 and the IRCF 14 are replaced with the IRCF glass substrate 14' having the function of the glass substrate 12 and the function of the IRCF 14, and that a solid-state imaging element 91 having the COB (Chip on Board) structure is used instead of the solid-state imaging element 11 having the CSP structure.

According to such a configuration, generation of a flare and a ghost can be reduced similarly to the imaging device 1 of FIG. 12.

Moreover, in recent years, the CSP structure has been generally adopted for miniaturization of the solid-state imaging element 11 and miniaturization of the imaging device 1. However, the CSP structure requires complicated processing, such as affixation with the glass substrate 12 or the IRCF glass substrate 14', and wiring of terminals of the solid-state imaging element 11 on the back side of the light receiving surface. Accordingly, the CSP structure is more expensive than the solid-state imaging element 11 having the COB structure. Accordingly, the solid-state imaging element 91 having the COB structure and connected with the circuit board 17 via a wire bond 92 or the like may be used as well as the CSP structure.

Connection to the circuit board 17 is facilitated by using the solid-state imaging element 91 having the COB structure. Accordingly, simplification of processing and cost reduction are achievable.

Note that the solid-state imaging element 11 having the CSP structure and included in the imaging device 1 of FIGS. 1, 9, 11, and 13 in the first to third embodiments and the fifth embodiment may be replaced with the solid-state imaging element 11 having the COB (Chip on Board) structure.

7. Seventh Embodiment

According to the example presented in the second embodiment described above, the glass substrate 12 is provided on the solid-state imaging element 11, and the IRCF 14 is further provided on the glass substrate. However, the IRCF 14 may be provided on the solid-state imaging element 11, and the glass substrate 12 may be further provided on the IRCF 14.

Figure 15:
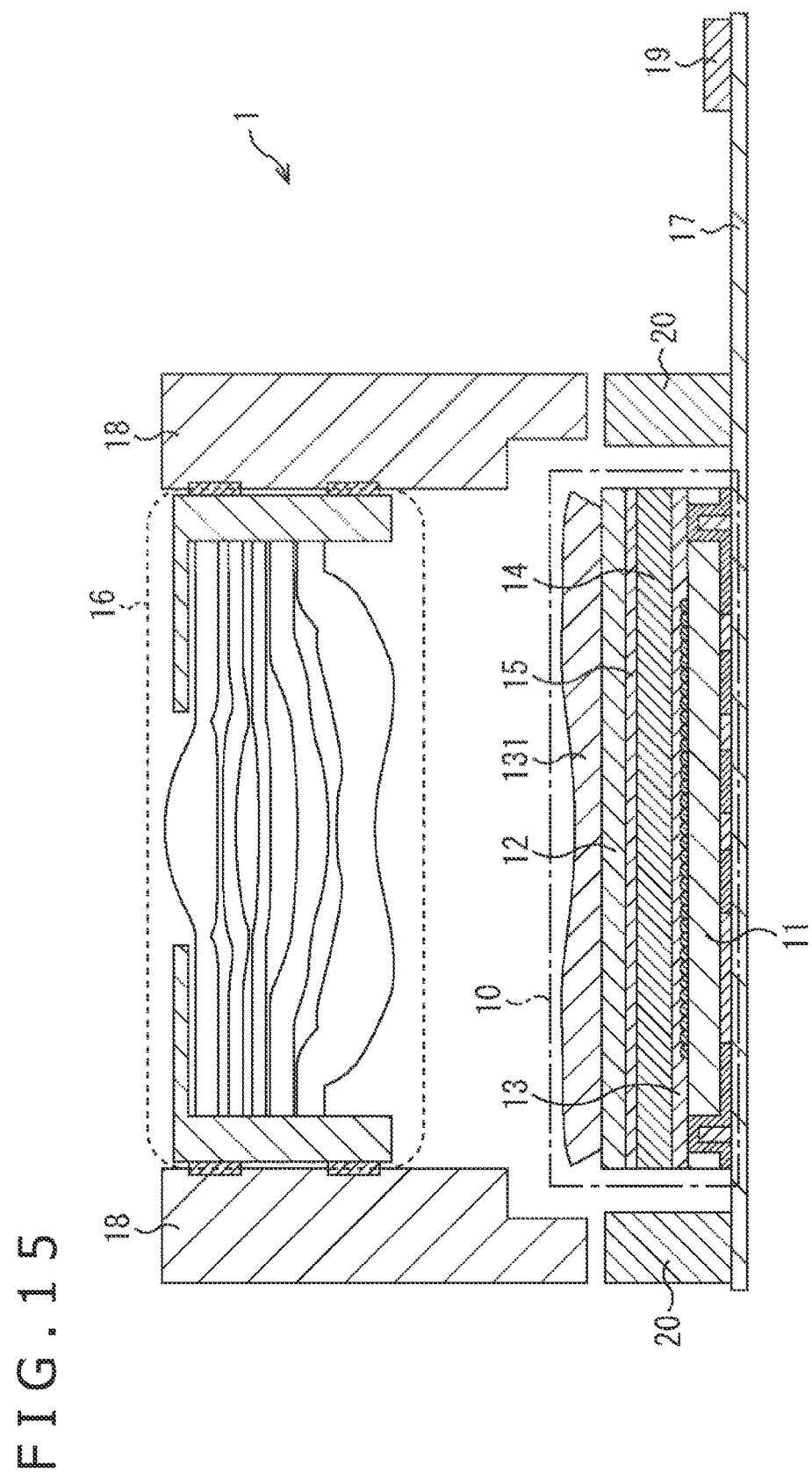
FIG. 15 is a diagram explaining a configuration example of an imaging device according to a seventh embodiment of the present disclosure.

FIG. 15 is a configuration example of the imaging device 1 in a case where the glass substrate 12 is provided. In this case, the IRCF 14 is provided on the solid-state imaging element 11, and the glass substrate 12 is further provided on the IRCF 14.

The imaging device 1 of FIG. 15 is different from the imaging device 1 of FIG. 9 in that the order of the glass substrate 12 and the IRCF 14 is changed. In this case, the IRCF 14 is affixed onto the solid-state imaging element 11 via the adhesive 13 which is transparent, the glass substrate 12 is further affixed onto the IRCF 14 via the adhesive 15 which is transparent, and the lens 131 is provided on the glass substrate 12.

According to such a configuration, generation of a flare and a ghost can be reduced similarly to the imaging device 1 of FIG. 9.

In addition, according to the characteristics of the IRCF 14, flatness of the IRCF 14 is generally lowered by an effect of a temperature and a disturbance. In this case, distortion may be produced in an image on the solid-state imaging element 11.

Accordingly, a special material for maintaining flatness is generally adopted, such as a material of coating applied on both surfaces of the IRCF 14, for example. However, this material raises costs.

On the other hand, according to the imaging device 1 of FIG. 15, the IRCF 14 having low flatness is sandwiched between the solid-state imaging element 11 and the glass substrate 12 both having high flatness. In this manner, flatness can be secured at low costs, and therefore distortion of an image can be reduced.

Accordingly, the imaging device 1 of FIG. 15 achieves reduction of a flare or a ghost, and also reduction of distortion in an image produced by the characteristics of the IRCF 14. Further, the necessity of coating made of a special material for maintaining flatness is eliminated, and therefore cost reduction is achievable.

Note that the glass substrate 12 and the IRCF 14 may be also affixed to each other via the adhesives 13 and 15 in the state of the change of the order of the glass substrate 12 and the IRCF 14 in the imaging device 1 of FIGS. 1, 11, and 12 in the first embodiment, the third embodiment, and the fourth embodiment.

8. Eighth Embodiment

According to the example presented in the first embodiment described above, the IRCF 14 is used as a configuration for cutting off infrared light. However, configurations other than the IRCF 14 may be adopted as long as cut-off of infrared light is achievable. For example, infrared cut resin may be applied and used instead of the IRCF 14.

Figure 16:
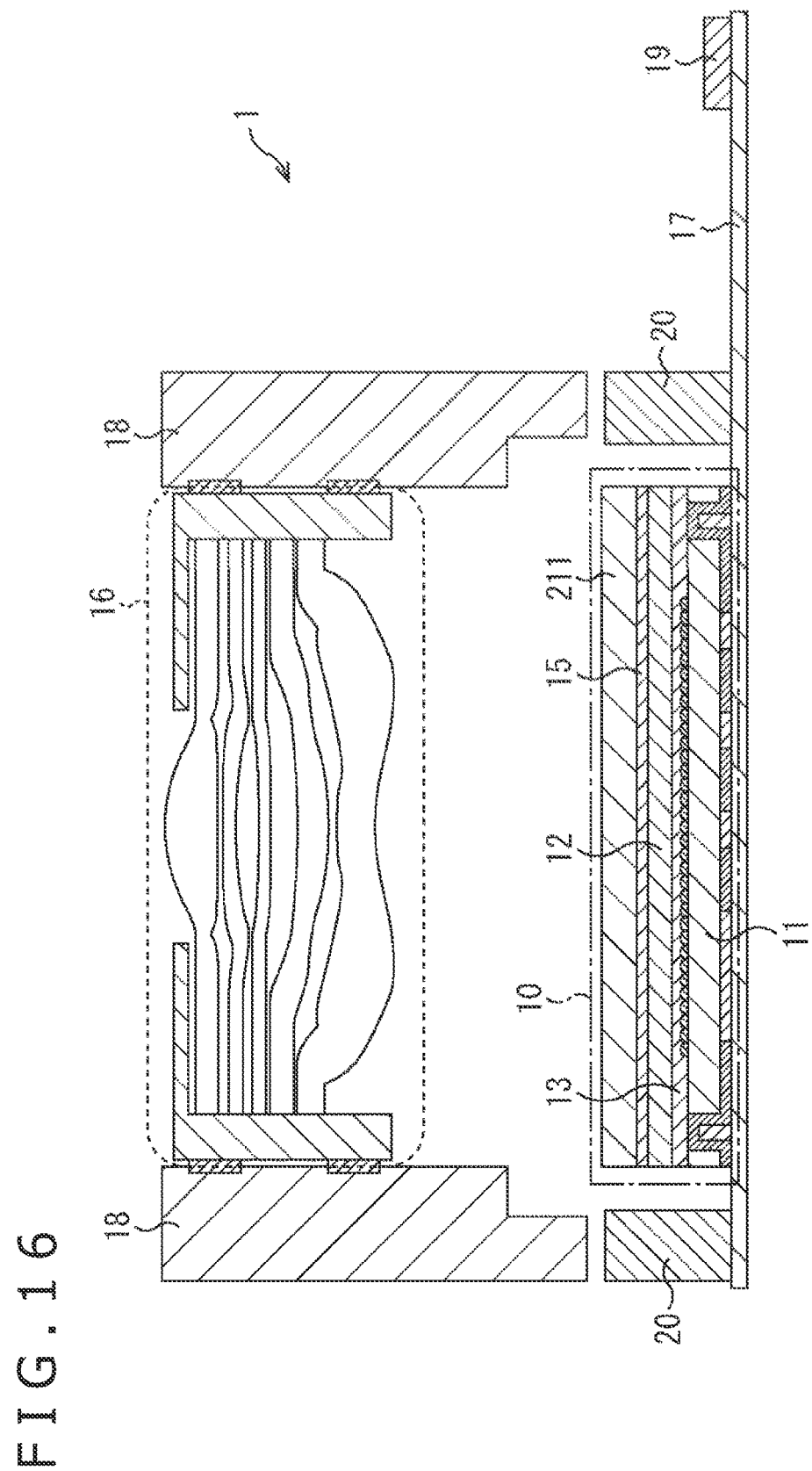
FIG. 16 is a diagram explaining a configuration example of an imaging device according to an eighth embodiment of the present disclosure.

FIG. 16 depicts a configuration example of the imaging device 1 using infrared cut resin instead of the IRCF 14. Note that configurations included in the imaging device 1 of FIG. 16 and having functions basically identical to the functions of the configurations of the imaging device 1 of FIG. 1 are given identical reference signs. Description of those configurations will be omitted where appropriate.

Specifically, the imaging device 1 of FIG. 16 is different from the imaging device 1 of FIG. 1 in that an infrared cut resin 211 is provided instead of the IRCF 14. For example, the infrared cut resin 211 is provided by coating.

According to such a configuration, generation of a flare and a ghost can be reduced similarly to the imaging device 1 of FIG. 1.

Moreover, resin with infrared cut effect is generally adopted with recent improvement of resin. It is known that the glass substrate 12 can be coated with the infrared cut resin 211 during production of the CSP type solid-state imaging element 11.

Note that the infrared cut resin 211 may be adopted instead of the IRCF 14 included in the imaging device 1 of FIGS. 9, 11, 12, and 15 in the second to fourth embodiments and the seventh embodiment.

9. Ninth Embodiment

According to the example presented in the second embodiment described above, the glass substrate 12 having a flat plate shape is provided in a state of close contact with the solid-state imaging element 11 without cavities in a case of use of the glass substrate 12. However, cavities may be provided between the glass substrate 12 and the solid-state imaging element 11.

FIG. 17 is a configuration example of the imaging device 1 which includes cavities between the glass substrate 12 and the solid-state imaging element 11. Note that configurations included in the imaging device 1 of FIG. 17 and having functions basically identical to the functions of the configurations of the imaging device 1 of FIG. 9 are given identical reference signs. Description of those configurations will be omitted where appropriate.

Specifically, the imaging device 1 of FIG. 17 is different from the imaging device 1 of FIG. 9 in that a glass substrate 231 including protrusions 231a in a periphery is provided instead of the glass substrate 12. The protrusions 231a in the periphery are brought into contact with the solid-state imaging element 11, and bonded by an adhesive 232 which is transparent. In this manner, cavities 231b each constituted by an air layer are formed between the imaging surface of the solid-state imaging element 11 and the glass substrate 231.

According to such a configuration, generation of a flare and a ghost can be reduced similarly to the imaging device 1 of FIG. 9.

Note that the glass substrate 231 may be used instead of the glass substrate 12 included in the imaging device 1 of FIGS. 1, 11, 12, and 16 in the first embodiment, the third embodiment, the fourth embodiment, and the eighth embodiment to form the cavities 231b by bonding only the protrusions 231a via the adhesive 232.

10. Tenth Embodiment

According to the example presented in the second embodiment described above, the lens 131 in the lowermost layer in the lens group 16 is provided on the IRCF 14 formed on the glass substrate 12. However, a coating agent constituted by an organic multilayer film and having an infrared cut function may be used instead of the IRCF 14 on the glass substrate 12.

Figure 18:
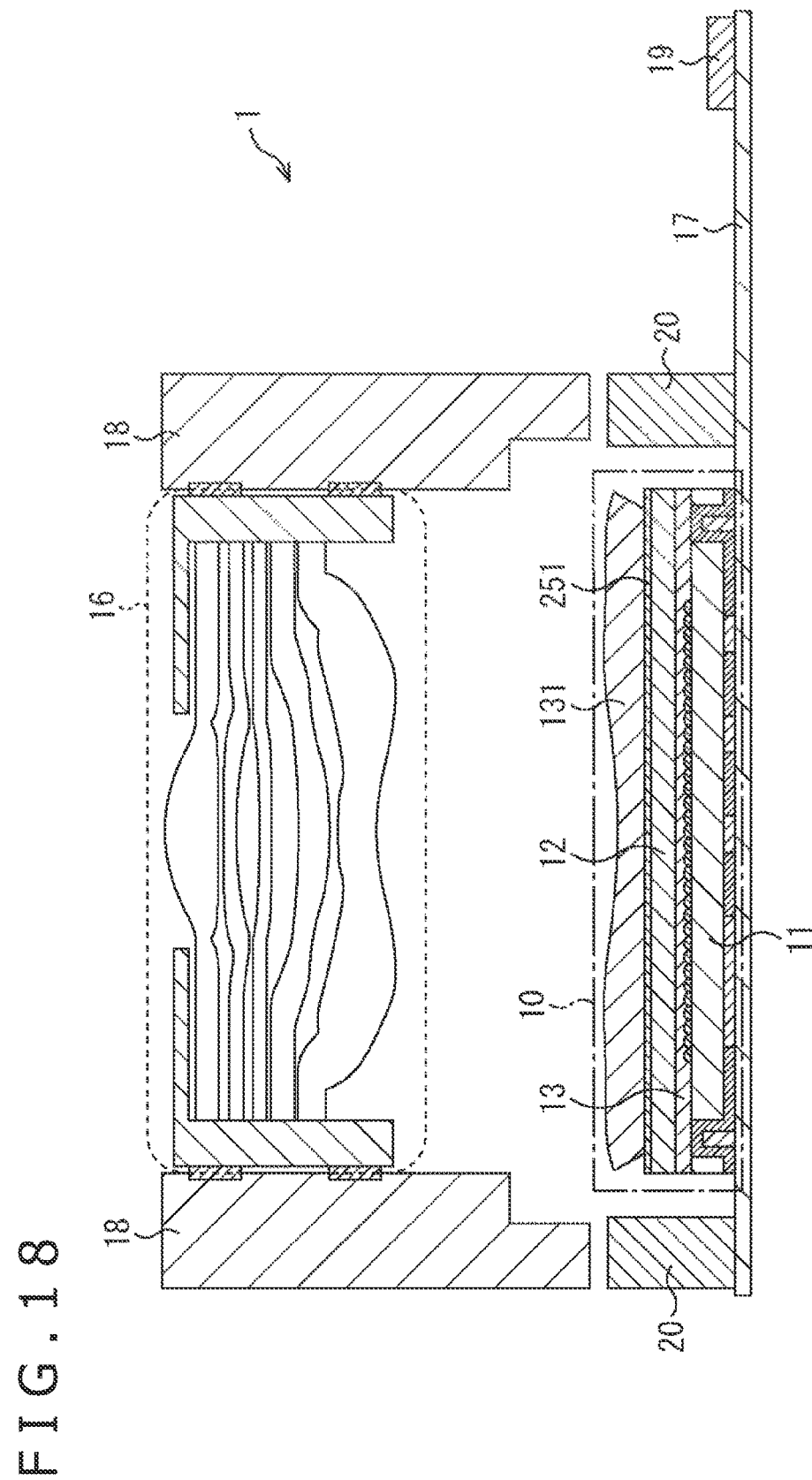
FIG. 18 is a diagram explaining a configuration example of an imaging device according to a tenth embodiment of the present disclosure.

FIG. 18 depicts a configuration example of the imaging device 1 which includes a coating agent constituted by an organic multilayer film and having an infrared cut function instead of the IRCF 14 on the glass substrate 12.

The imaging device 1 of FIG. 18 is different from the imaging device 1 of FIG. 9 in that the coating agent 251 constituted by the organic multilayer film and having the infrared cut function is provided instead of the IRCF 14 on the glass substrate 12.

According to such a configuration, generation of a flare and a ghost can be reduced similarly to the imaging device 1 of FIG. 9.

Note that the coating agent 251 constituted by the organic multilayer film and having the infrared cut function may be adopted instead of the IRCF 14 included in the imaging device 1 of FIGS. 1, 6, 7, 10, and 12 in the first embodiment, the third embodiment, the fourth embodiment, the seventh embodiment, and the ninth embodiment.

11. Eleventh Embodiment

According to the example presented in the tenth embodiment described above, the lens 131 in the lowermost layer in the lens group 16 is provided on the coating agent 251 constituted by the organic multilayer film and having the infrared cut function instead of the IRCF 14 on the glass substrate 12. In this case, the lens 131 may be further coated with an AR (Anti Reflection) coating.

Figure 19:
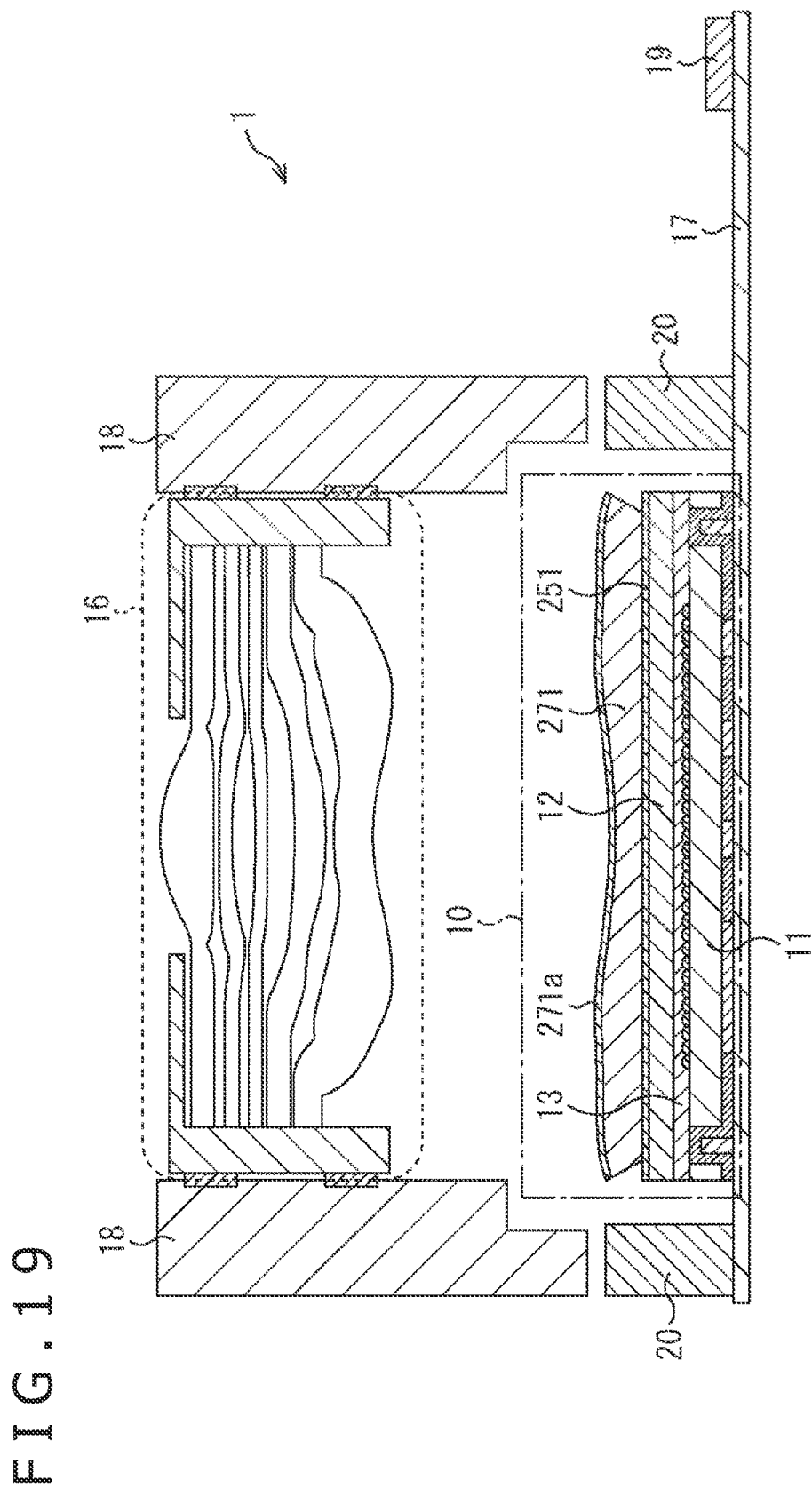
FIG. 19 is a diagram explaining a configuration example of an imaging device according to an eleventh embodiment of the present disclosure.

FIG. 19 is a configuration example of the imaging device 1 which includes the lens 131 coated with an AR coating in the imaging device 1 of FIG. 13.

Specifically, the imaging device 1 of FIG. 19 is different from the imaging device 1 of FIG. 18 in that a lens 271 included in the lowermost layer of the lens group 16 and coated with an AR coating 271a is provided instead of the lens 131. For example, vacuum deposition, sputtering, WET coating, or the like may be adopted for the AR coating 271a.

According to such a configuration, generation of a flare and a ghost can be reduced similarly to the imaging device 1 of FIG. 9.

Further, the AR coating 271a of the lens 271 reduces internal diffused reflection of reflection light from the solid-state imaging element 11. Accordingly, reduction of generation of a flare or a ghost is achievable with higher accuracy.

Note that the lens 271 coated with the AR coating 271a may be adopted instead of the lens 131 included in the imaging device 1 of FIGS. 9, 11, 13, 15, 17, and 18 in the second embodiment, the third embodiment, the fifth embodiment, the seventh embodiment, the ninth embodiment, and the tenth embodiment. In addition, a surface of the lens group 171 (the uppermost surface in the figure) included in the imaging device 1 of FIGS. 12 and 14 in the fourth embodiment and the sixth embodiment may be coated with an AR coating similar to the AR coating 271a.

It is preferable that the AR coating 271a is a single-layered or multi-layered structure film constituted as follows. Specifically, for example, the AR coating 271a is a transparent resin such as silicon resin, acrylic resin, epoxy resin, and styrene resin, an insulation film (e.g., SiCH, SiCOH, and SiCNH) chiefly containing Si (silicon), C (carbon), and H (hydrogen), an insulation film (e.g., SiON and SiN) chiefly containing Si (silicon) and N (nitrogen), or an $SiO_2$ film, a P—SiO film, or HDP-SiO film formed using an oxidant and an material gas which is at least any one of silicon hydroxide, alkylsilane, alkoxysilane, polysiloxane, or the like.

12. Twentieth Embodiment

According to the example presented in the eleventh embodiment described above, the lens 271 coated with the AR (Anti Reflection) coating 271a is used instead of the lens 131. However, a configuration other than AR coating may be used as long as an anti-reflection function can be performed. For example, a moth eye structure including minute recesses and protrusions for preventing reflection may be adopted.

Figure 20:
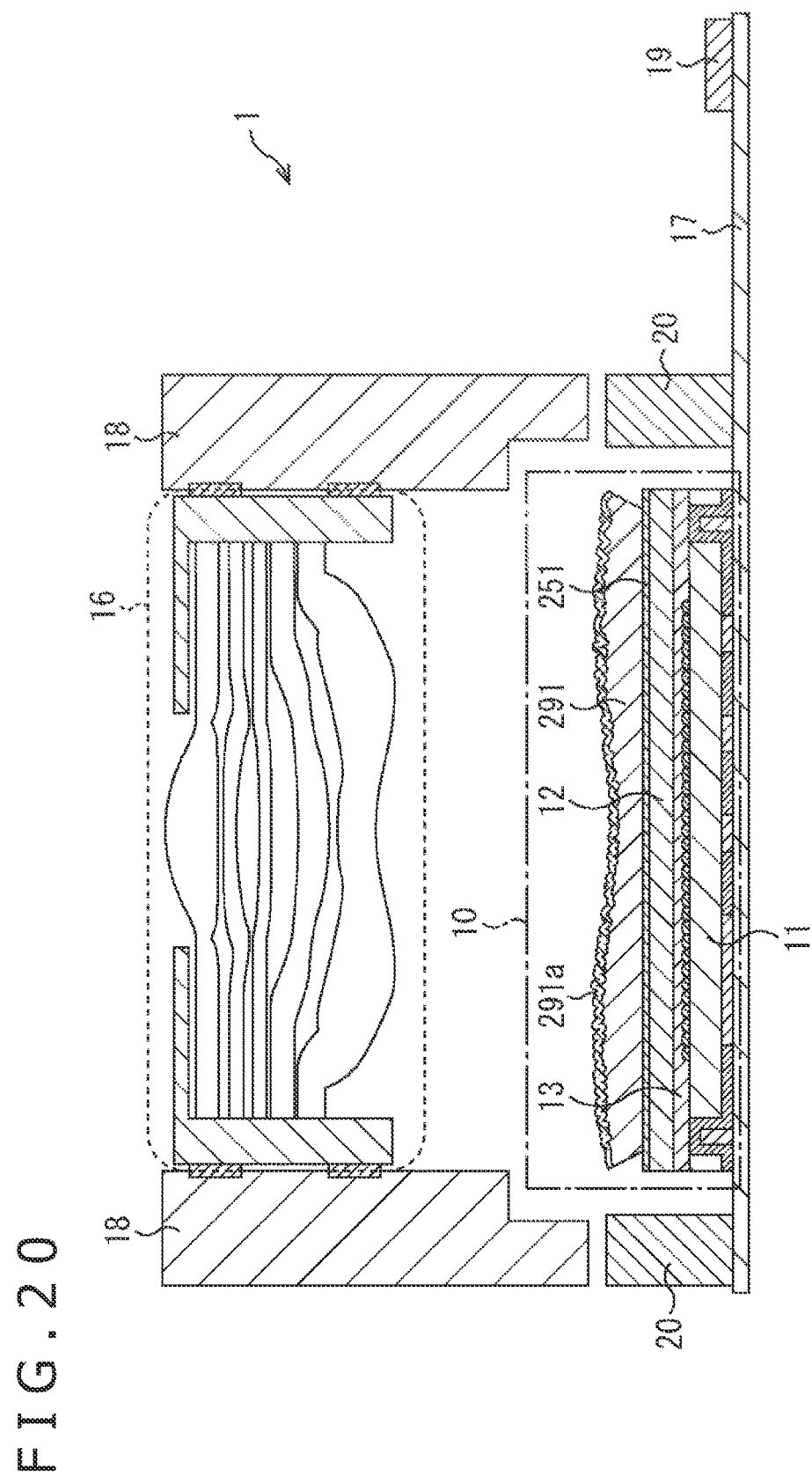
FIG. 20 is a diagram explaining a configuration example of an imaging device according to a twelfth embodiment of the present disclosure.

FIG. 20 is a configuration example of the imaging device 1 which includes a lens 291 to which an anti-reflection function having a moth eye structure is added instead of the lens 131 included in the imaging device 1 of FIG. 19.

Specifically, the imaging device 1 of FIG. 20 is different from the imaging device 1 of FIG. 18 in that the lens 291 in the lowermost layer of the lens group 16 is provided instead of the lens 131. The lens 291 includes an anti-reflection treatment portion 291a subjected to a moth eye structure treatment.

According to such a configuration, generation of a flare and a ghost can be reduced similarly to the imaging device 1 of FIG. 18.

Moreover, the anti-reflection treatment portion 291a included in the lens 291 and subjected to the moth eye structure treatment reduces internal diffused reflection of reflection light from the solid-state imaging element 11. Accordingly, reduction of generation of a flare or a ghost is achievable with higher accuracy. Note that the anti-reflection treatment portion 291a may be subjected to anti-reflection treatments other than the moth eye structure as long as the anti-reflection function can be achieved.

It is preferable that the anti-reflection treatment portion 291a is a single-layered or multi-layered structure film constituted as follows. Specifically, for example, the anti-reflection treatment portion 291a is a transparent resin such as silicon resin, acrylic resin, epoxy resin, and styrene resin, an insulation film (e.g., SiCH, SiCOH, and SiCNH) chiefly containing Si (silicon), C (carbon), and H (hydrogen), an insulation film (e.g., SiON and SiN) chiefly containing Si (silicon) and N (nitrogen), or an SiO2 film, a P—SiO film, or HDP-SiO film formed using an oxidant and an material gas which is at least any one of silicon hydroxide, alkylsilane, alkoxysilane, polysiloxane, or the like.

Note that the lens 291 to which the anti-reflection treatment portion 291a is added may be adopted instead of the lens 131 included in the imaging device 1 of FIGS. 9, 11, 13, 15, 17, and 18 in the second embodiment, the third embodiment, the fifth embodiment, the seventh embodiment, the ninth embodiment, and the tenth embodiment. In addition, the surface of the lens group 171 included in the imaging device 1 of FIGS. 12 and 14 in the fourth embodiment and the sixth embodiment may be subjected to anti-reflection treatment similar to the treatment of the anti-reflection treatment portion 291a.

13. Thirteenth Embodiment

Figure 21:
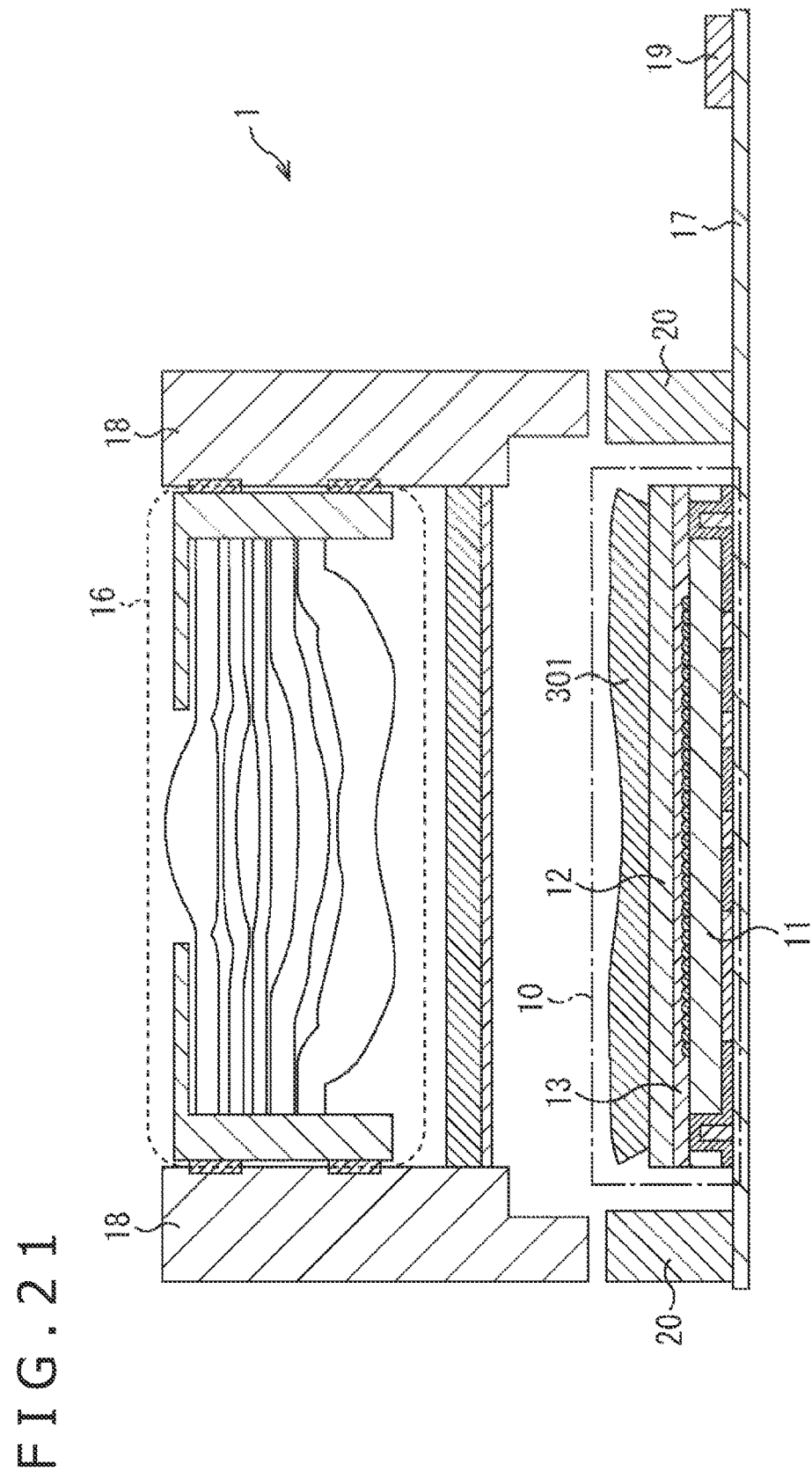
FIG. 21 is a diagram explaining a configuration example of an imaging device according to a thirteenth embodiment of the present disclosure.

According to the example presented in the fourth embodiment described above, the lens 131 in the lowermost layer of the lens group 16 is provided on the IRCF 14. However, this configuration may be replaced with a configuration having an infrared cut function, and a function similar to the function of the lens 131 in the lowermost layer. FIG. 21 depicts a configuration example of the imaging device 1 which includes an infrared cut lens having an infrared cut function, and a function similar to the function of the lens in the lowermost layer of the lens group 16, instead of the IRCF 14 and the lens 131 in the lowermost layer of the lens group 16 included in the imaging device 1 of FIG. 9.

Specifically, the imaging device 1 of FIG. 21 is different from the imaging device 1 of FIG. 9 in that an infrared cut lens 301 having an infrared cut function is provided instead of the IRCF 14 and the lens 131 in the lowermost layer of the lens group 16.

According to such a configuration, generation of a flare and a ghost can be reduced similarly to the imaging device 1 of FIG. 9.

Moreover, the infrared cut lens 301 is configured to have both the infrared cut function and the function of the lens 131 in the lowermost layer of the lens group 16. In this case, the necessity of separately providing the IRCF 14 and the lens 131 is eliminated. Accordingly, further miniaturization and height reduction of the device configuration of the imaging device 1 are achievable. Furthermore, the lens group 171 and the IRCF 14 included in the imaging device 1 of FIG. 12 in the fourth embodiment may be replaced with an infrared cut lens having both the infrared cut function and the function of the lens group 171 constituted by a plurality of lenses in the lowermost layer of the lens group 16.

14. Fourteenth Embodiment

It is known that stray light easily enters from a peripheral edge portion of the light receiving surface of the solid-state imaging element 11. Accordingly, a black mask may be provided in the peripheral edge portion of the light receiving surface of the solid-state imaging element 11 to reduce entrance of stray light and thereby reduce generation of a flare or a ghost.

Figure 22:
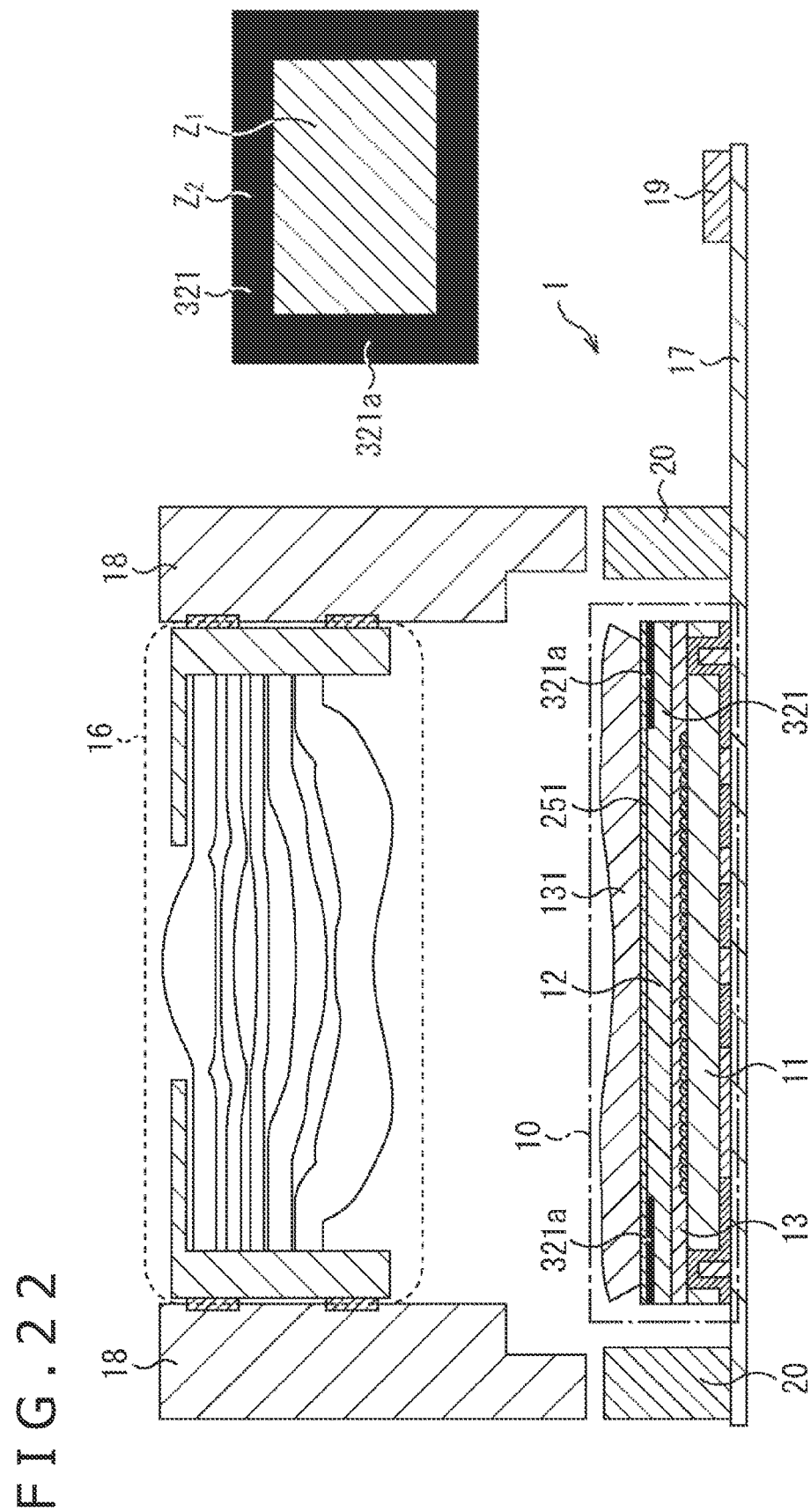
FIG. 22 is a diagram explaining a configuration example of an imaging device according to a fourteenth embodiment of the present disclosure.

A left part of FIG. 22 depicts a configuration example of the imaging device 1 which includes a glass substrate 321 equipped with a black mask 321a for light shield of the peripheral edge portion of the light receiving surface of the solid-state imaging element 11, instead of the glass substrate 12 included in the imaging device 1 of FIG. 18.

Specifically, the imaging device 1 in the left part of FIG. 22 is different from the imaging device 1 of FIG. 18 in that, instead of the glass substrate 12, the glass substrate 321 equipped with the black mask 321a constituted by a light shielding film is provided at a peripheral edge portion Z2 as indicated in a right part of FIG. 22. The black mask 321a is formed on the glass substrate 321 by photolithography or the like. Note that the black mask is not provided at a central portion Z1 of the glass substrate 321 in the right part of FIG. 22.

According to such a configuration, generation of a flare and a ghost can be reduced similarly to the imaging device 1 of FIG. 9.

In addition, the glass substrate 321 equipped with the black mask 321a in the peripheral edge portion Z2 can reduce entrance of stray light from the peripheral edge portion, thereby reducing generation of a flare or a ghost caused by stray light.

Note that the black mask 321a may be provided not only on the glass substrate 321 but also on configurations other than the glass substrate 321 as long as entrance of stray light into the solid-state imaging element 11 can be prevented. For example, the black mask 321a may be provided on the coating agent 251 constituted by the organic multilayer film and having the infrared light cut function or the lens 131, or may be provided on the IRCF 14, the IRCF glass substrate 14', the glass substrate 231, the lens group 171, the lenses 271 and 291, the infrared cut resin 211, the infrared cut lens 301, or others. In this case, note that the black mask may be provided on a surface having low flatness by ink jet, for example, in a case where the black mask is difficult to form by photolithography due to low flatness of the surface.

As described above, according to the present disclosure, a flare and a ghost caused by internal diffused reflection of light from a solid-state imaging element as a result of miniaturization can be reduced. Moreover, high pixelization, high image quality, and miniaturization are achievable without deteriorating performance of the imaging device.

15. Fifteenth Embodiment

According to the examples described above, the lens 131, 271, or 291, the lens group 171, or the infrared cut lens 301 is joined onto the solid-state imaging element 11 having a square shape by bonding, affixing, or other methods.

However, when any one of the lenses 131, 271, and 291, the lens group 171, and the infrared cut lens 301 each having a square shape is bonded or affixed onto the solid-state imaging element 11 having substantially the same size, portions close to corners are easily separated. The separation of the corners of the lens 131 prevents appropriate entrance of incident light into the solid-state imaging element 11, and may cause generation of a flare or a ghost.

Accordingly, in a case where any one of the lenses 131, 271, and 291, the lens group 171, and the infrared cut lens 301 each having a square shape is bonded or affixed to the solid-state imaging element 11, an external size of the bonded or affixed lens or lens group may be set to a size smaller than an external size of the solid-state imaging element 11. Further, an effective region may be defined in the vicinity of the center of the lens, and a non-effective region may be defined in an outer peripheral portion of the lens. In this manner, likeliness of separation may be lowered, or incident light may be effectively converged even with slight separation of end portions.

Figure 23:
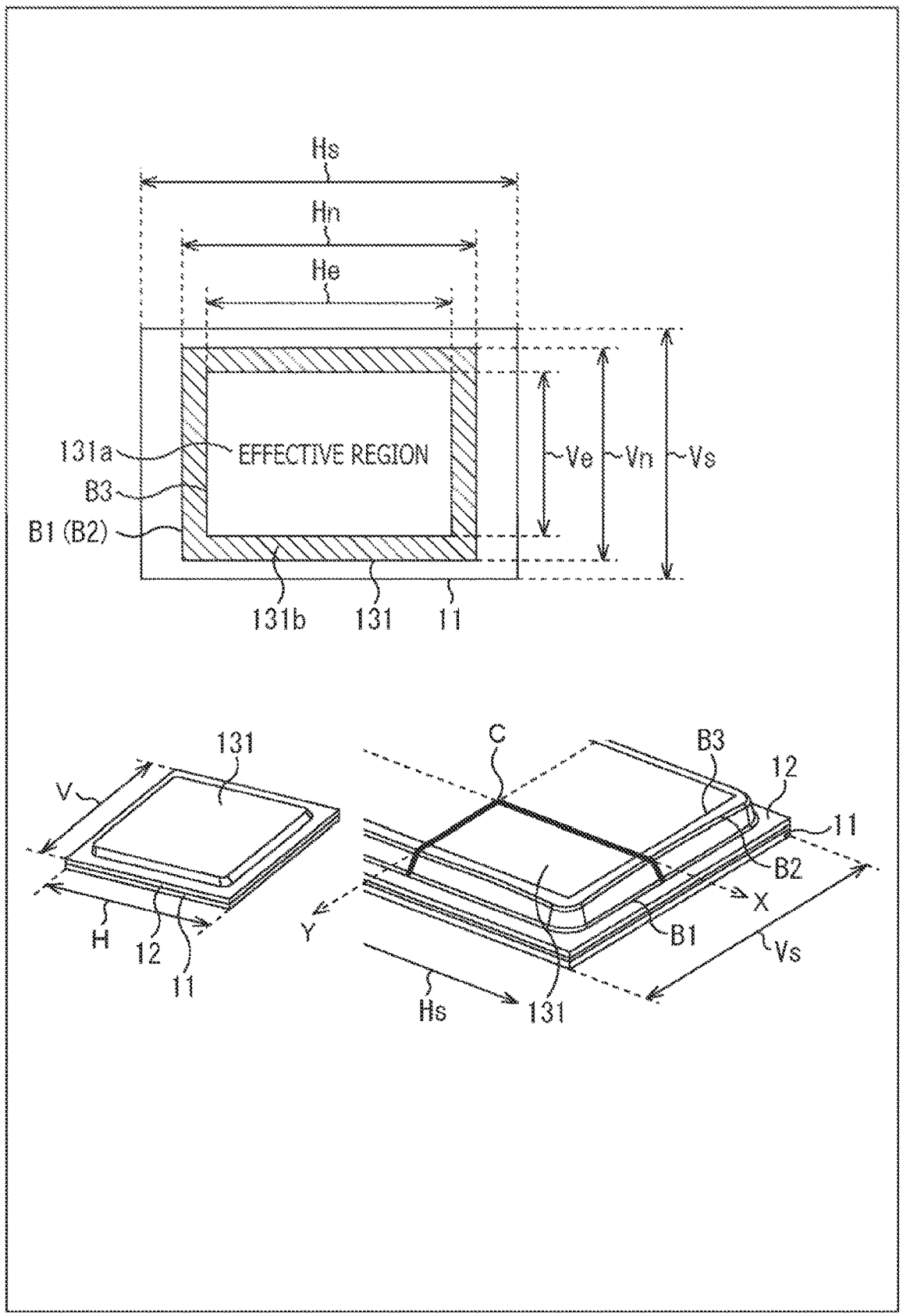
FIG. 23 is a diagram explaining a configuration example of an imaging device according to a fifteenth embodiment of the present disclosure.

Specifically, in a case where the lens 131 is bonded or affixed to the glass substrate 12 provided on the solid-state imaging element 11, the external size of the lens 131 is made smaller than the external size of the glass substrate 12 on the solid-state imaging element 11 as depicted in FIG. 23, for example. In addition, a non-effective region 131b is defined in an outer peripheral portion of the lens 131, and an effective region 131a is defined inside the non-effective region 131b. Note that the glass substrate 231 may be provided on the solid-state imaging element 11 instead of the glass substrate 12.

Moreover, the configuration of FIG. 23 is a configuration where the IRCF 14 and the adhesive 15 are eliminated from the integrated configuration unit 10 of the imaging device 1 of FIG. 9. However, this elimination is made only for convenience of explanation. Needless to say, the IRCF 14 and the adhesive 15 may be provided between the lens 131 and the glass substrate 12.

Furthermore, the effective region 131a here is a region having an aspherical shape and included in a region into which incident light of the lens 131 enters, and effectively performs a function of converging incident light on a region where photoelectric conversion is allowed in the solid-state imaging element 11. In other words, the effective region 131a is a region which has a concentric structure including an aspherical lens structure, circumscribes the lens outer peripheral portion, and converges incident light on the imaging surface where photoelectric conversion is allowed in the solid-state imaging element 11.

On the other hand, the non-effective region 131b is a region which does not necessarily functions as a lens for converging light having entered the lens 131 on the region where photoelectric conversion is performed in the solid-state imaging element 11.

However, it is preferable that the non-effective region 131b has an extended structure functioning as an aspherical lens at a part of a boundary with the effective region 131a. By providing the extended structure functioning as a lens in the non-effective region 131b in the vicinity of the boundary with the effective region 131a, incident light can be appropriately converged on the imaging surface of the solid-state imaging element 11 even when positional deviation is produced at the time of bonding or affixing of the lens 131 to the glass substrate 12 on the solid-state imaging element 11.

Note that the glass substrate 12 on the solid-state imaging element 11 is sized to have a height Vsx in the vertical direction (Y direction), and a width Hs in the horizontal direction (X direction) in FIG. 23, and that the lens 131 sized to have a height Vnx in the vertical direction and a width Hn in the horizontal direction, both sizes smaller than the corresponding sizes of the solid-state imaging element 11 (glass substrate 12), is bonded or affixed to a central portion inside the glass substrate 12 on the solid-state imaging element 11. Further, the non-effective region 131b not functioning as a lens is defined in the outer peripheral portion of the lens 131, and the effective region 131a sized to have a height Vex in the vertical direction and a width He in the horizontal direction is defined inside the non-effective region 131b.

In other words, a relation of "the width and the length of the effective region 131a of the lens 131<the width and the length of the non-effective region 131b<the width and the length of the external size of (the glass substrate 12) on the solid-state imaging element 11" holds for each of the width in the horizontal direction and the height in the vertical direction. Center positions of the lens 131, the effective region 131a, and the non-effective region 131b are substantially identical.

Further, in FIG. 23, an upper part of the figure is a top view as viewed from the incident side when the lens 131 is bonded or affixed to the glass substrate 12 on the solid-state imaging element 11, while a lower left part of the figure is an external appearance perspective view when the lens 131 is bonded or affixed to the glass substrate 12 on the solid-state imaging element 11.

Further, a lower right part of FIG. 23 is an external appearance perspective view when the lens 131 is bonded or affixed to the glass substrate 12 on the solid-state imaging element 11. This figure depicts an end portion including a boundary B1 between a side surface portion of the lens 131 and the glass substrate 12, a boundary B2 on the outside of the non-effective region 131b, and a boundary B3 between the outside of the effective region 131a and the inside of the non-effective region 131b.

FIG. 23 here depicts an example where a side end portion of the lens 131 is perpendicular to the glass substrate 12 on the solid-state imaging element 11. In the top view of FIG. 23, therefore, the boundary B2 on the outside of the non-effective region 131b is formed in a top surface portion of the lens 131, while the boundary B1 between the effective region 131a and the non-effective region 131b is formed in a bottom surface portion of the lens 131. In this case, the boundary B1 and the boundary B2 have the same size. Accordingly, in the upper part of FIG. 23, the outer peripheral portion (boundary B1) of the lens 131, and the outer peripheral portion (boundary B2) of the non-effective region 131b are expressed as an identical external shape.

According to such a configuration, a space is produced between the side surface forming the outer peripheral portion of the lens 131 and the outer peripheral portion of the glass substrate 12 on the solid-state imaging element 11. In this case, interference between the side surface portion of the lens 131 and another object can be reduced. Accordingly, likeliness of separation from the glass substrate 12 on the solid-state imaging element 11 can be lowered in this configuration.

Moreover, the effective region 131a of the lens 131 is defined inside the non-effective region 131b. Accordingly, incident light can be appropriately converged on the imaging surface of the solid-state imaging element 11 even when the peripheral portion is slightly separated. Furthermore, interface reflection increases when the lens 131 is separated. In this case, a flare or a ghost becomes worse. Accordingly, reduction of separation can consequently reduce generation of a flare or a ghost.

While the example where the lens 131 is bonded or affixed to the glass substrate 12 on the solid-state imaging element 11 has been described with reference to FIG. 23, any one of the lenses 271 and 291, the lens group 171, and the infrared cut lens 301 may be obviously bonded or affixed instead of the lens 131.

<Modification of Lens External Shape>

According to the example described above, the effective region 131a is defined at the central portion of the lens 131, the non-effective region 131b is defined in the outer peripheral portion of the lens 131, and the size of the effective region 131a is smaller than the outer peripheral size of (the glass substrate 12 on) the solid-state imaging element 11. In addition, each of the four corners of the external shape of the lens 131 has an acute angle.

However, the external shape may be other shapes as long as the external shape is formed such that the size of the lens 131 is smaller than the size of (the glass substrate 12 on) the solid-state imaging element 11, that the effective region 131*a* is defined at the central portion of the lens 131, and that the non-effective region 131*b* is defined in the outer peripheral portion of the lens 131.

Figure 24:
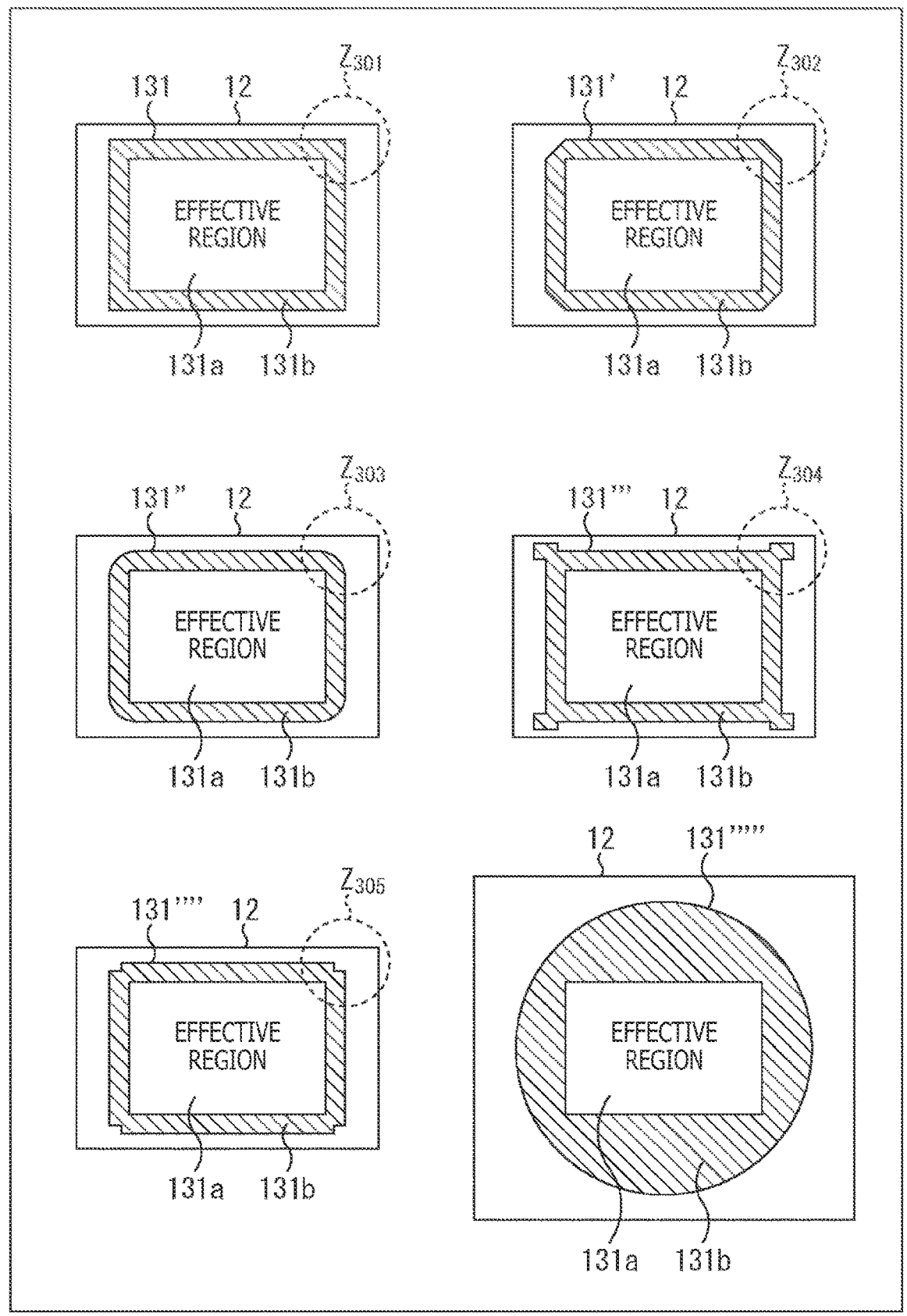
FIG. 24 is a diagram explaining modified examples of a lens external shape of FIG. 23.

In other words, as depicted in an upper left part of FIG. 24 (corresponding to FIG. 23), a region Z301 at each of the four corners of the external shape of the lens 131 may have a shape having an acute angle. Further, as depicted in a lens 131' in an upper right part of FIG. 24, a region Z302 at each of the four corners may have a polygonal shape having an obtuse angle.

Further, as depicted in a lens 131" in a middle left part of FIG. 24, a region Z303 at each of the four corners of the external shape may have a circular shape.

Further, as depicted in a lens 131''' in a middle right part of FIG. 24, a region Z304 at each of the four corners of the external shape may have a small square portion protruded from the corresponding one of the four corners. Besides, the protruded portion may have shapes other than the square shape, such as a circular shape, an elliptical shape, and a polygonal shape.

Moreover, as depicted in a lens 131'''' in a lower left part of FIG. 24, a region Z305 at each of the four corners of the external shape may have a square recess.

Furthermore, as depicted in a lens 131''''' in a lower right part of FIG. 24, the effective region 131*a* may have a square shape, and the peripheral portion outside the non-effective region 131*b* may have a circular shape.

Generally, the corners of the lens 131 are more easily separated from the glass substrate 12 as the angles of the corners become acuter. In this case, optically adverse effects may be produced. Accordingly, as depicted in the lenses 131' to 131''''' in FIG. 24, the corners each have a polygonal shape having an obtuse angle larger than 90 degrees, a round shape, a recessed shape, a protruding shape, or the like to produce a configuration lowering likeliness of separation of the lens 131 from the glass substrate 12. In this manner, a risk of optically adverse effects can be lowered.

<Modified Examples of Lens End Portion Structure>

According to the example described above, the end portion of the lens 131 is formed perpendicularly to the imaging surface of the solid-state imaging element 11. However, other shapes may be adopted as long as the external shape is formed such that the size of the lens 131 is smaller than the size of the solid-state imaging element 11, that the effective region 131*a* is defined at the central portion of the lens 131, and that the non-effective region 131*b* is defined in the outer peripheral portion of the lens 131.

Figure 25:
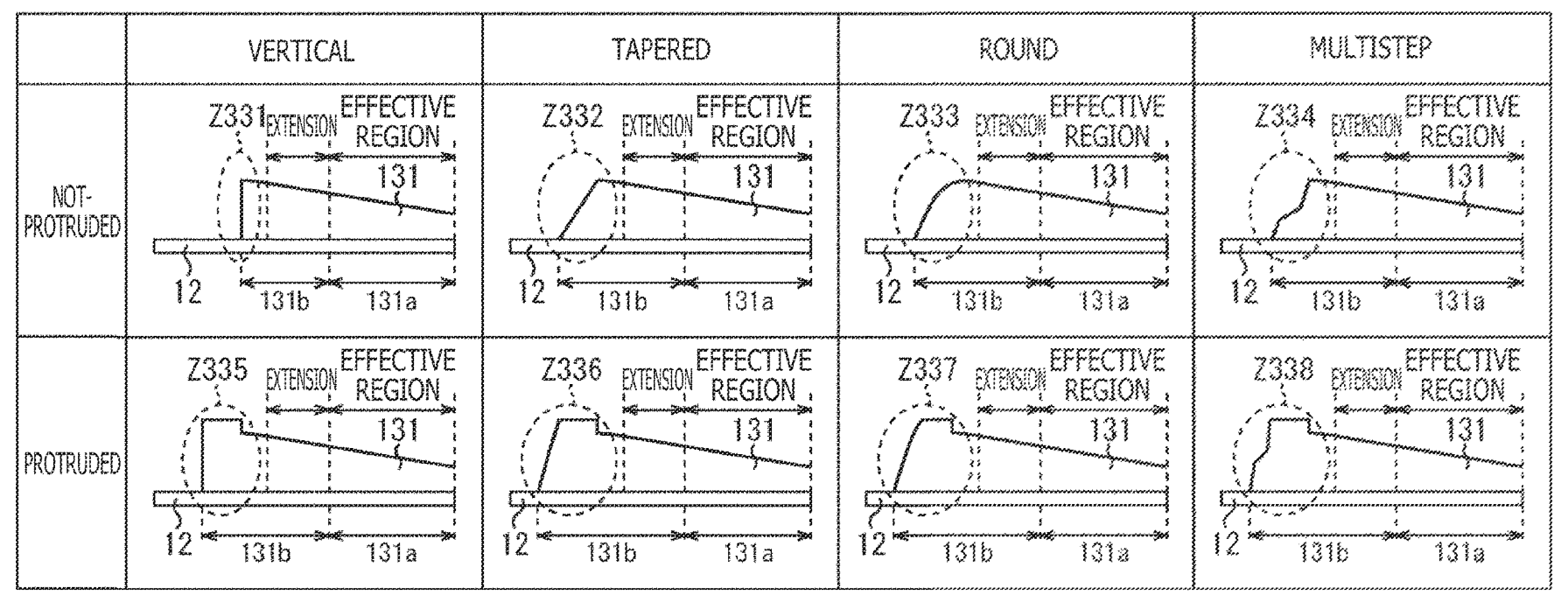

Specifically, as depicted in an upper left part of FIG. 25, a configuration similar to the effective region 131*a* as an aspherical lens may be extended in the non-effective region 131*b* at the boundary with the effective region 131*a*, and the end portion may be perpendicularly formed as indicated by an end portion Z331 of the non-effective region 131*b* (corresponding to the configuration of FIG. 23).

In addition, as depicted in an upper second part from the left in FIG. 25, a configuration similar to the effective region 131*a* as an aspherical lens may be extended in the non-effective region 131*b* at the boundary with the effective region 131*a*, and the end portion may have a tapered shape as indicated by an end portion Z332 of the non-effective region 131*b*.

Further, as depicted in an upper third part from the left in FIG. 25, a configuration similar to the effective region 131*a* as an aspherical lens may be extended in the non-effective region 131*b* at the boundary with the effective region 131*a*, and the end portion may have a round shape as indicated by an end portion Z333 of the non-effective region 131*b*.

Further, as depicted in an upper right part in FIG. 25, a configuration similar to the effective region 131*a* as an aspherical lens may be extended in the non-effective region 131*b* at the boundary with the effective region 131*a*, and the end portion may be a side surface having a multistep structure as indicated by an end portion Z334 of the non-effective region 131*b*.

Further, as depicted in a lower left part in FIG. 25, a configuration similar to the effective region 131*a* as an aspherical lens may be extended in the non-effective region 131*b* at the boundary with the effective region 131*a*, and the end portion may have a flat surface portion in the horizontal direction as indicated by an end portion Z335 of the non-effective region 131*b*. In addition, a protruding portion having a bank shape and protruding in a direction opposite to the incident direction of incident light from the effective region 131*a* may be formed, and a side surface of this protruding portion may be perpendicularly formed.

Moreover, as depicted in a lower second part from the left in FIG. 25, a configuration similar to the effective region 131*a* as an aspherical lens may be extended in the non-effective region 131*b* at the boundary with the effective region 131*a*, and the end portion may have a flat surface portion in the horizontal direction as indicated by an end portion Z336 of the non-effective region 131*b*. In addition, a protruding portion having a bank shape and protruding in a direction opposite to the incident direction of incident light from the effective region 131*a* may be formed, and a side surface of this protruding portion may have a tapered shape.

Additionally, as depicted in a lower third part from the left in FIG. 25, a configuration similar to the effective region 131*a* as an aspherical lens may be extended in the non-effective region 131*b* at the boundary with the effective region 131*a*, and an end portion may have a flat surface portion in the horizontal direction as indicated by an end portion Z337 of the non-effective region 131*b*. In addition, a protruding portion having a bank shape and protruding in a direction opposite to the incident direction of incident light from the effective region 131*a* may be formed, and a side surface of this protruding portion may have a round shape.

Furthermore, as depicted in a lower right part in FIG. 25, a configuration similar to the effective region 131*a* as an aspherical lens may be extended in the non-effective region 131*b* at the boundary with the effective region 131*a*, and the end portion may have a flat surface portion in the horizontal direction as indicated by an end portion Z338 of the non-effective region 131*b*. In addition, a protruding portion having a bank shape and protruding in a direction opposite to the incident direction of incident light from the effective region 131*a* may be formed, and a side surface of this protruding portion may have a multistep structure.

Note that the upper part of FIG. 25 depicts structure examples each of which does not include a protruding portion having a flat surface portion in the horizontal direction at the end portion of the lens 131 and having a bank shape which protrudes in the direction opposite to the incident direction of incident light from the effective region 131*a*, while the lower part of FIG. 25 depicts structure examples each of which does not include a protruding portion having a flat surface portion in the horizontal direction at the end portion of the lens 131. Further, each of the upper part and the lower part of FIG. 25 depicts a configuration example where the end portion of the lens 131 is perpendicular to the glass substrate 12, a configuration example where the end portion has a tapered shape, a configuration example where the end portion has a round shape, and a configuration example where the end portion has a multistep forming a plurality of side surfaces.

Further, as depicted in an upper part of FIG. 26, a configuration similar to the effective region 131a as an aspherical lens may be extended in the non-effective region 131b at the boundary with the effective region 131a, and a protruding portion may be perpendicularly formed with respect to the glass substrate 12 as indicated by an end portion Z351 of the non-effective region 131b. In addition, a boundary structure Es having a square shape may be left at the boundary with the glass substrate 12 on the solid-state imaging element 11.

Besides, as depicted in a lower part of FIG. 26, a configuration similar to the effective region 131a as an aspherical lens may be extended in the non-effective region 131b at the boundary with the effective region 131a, and a protruding portion may be perpendicularly formed with respect to the glass substrate 12 as indicated by an end portion Z352 of the non-effective region 131b. In addition, a boundary structure Er having a round shape may be left at the boundary with the glass substrate 12 on the solid-state imaging element 11.

In each of the boundary structure Es having a square shape and the boundary structure Er having a round shape, the lens 131 and the glass substrate 12 can be more tightly joined to each other by increasing a contact area between the lens 131 and the glass substrate 12. As a result, separation of the lens 131 from the glass substrate 12 can be reduced.

Note that each of the boundary structure Es having a square shape and the boundary structure Er having a round shape may be adopted in any of the case where the end portion has a tapered shape, the case where the end portion has a round shape, and the case where the end portion has a multistep structure.

Further, as depicted in FIG. 27, a configuration similar to the effective region 131a as an aspherical lens may be extended in the non-effective region 131b at the boundary with the effective region 131a, and the side surface of the lens 131 may be perpendicularly formed with respect to the glass substrate 12 as indicated by an end portion Z371 of the non-effective region 131b. In addition, a refractive film 351 having a predetermined refractive index may be formed at substantially the same height as the height of the lens 131 on the glass substrate 12 in the outer peripheral portion of the side surface.

In this manner, in a case where the refractive film 351 has a higher refractive index than a predetermined refractive index, for example, incident light coming from the outer peripheral portion of the lens 131 is reflected to the outside of the lens 131 as indicated by a solid arrow in an upper part of FIG. 27. In addition, incident light toward the side surface portion of the lens 131 is decreased as indicated by a dotted arrow. As a result, entrance of stray light into the lens 131 is reduced, and therefore generation of a flare or a ghost is reduced.

Further, in a case where the refractive film 351 has a lower refractive index than the predetermined refractive index, light not entering the incident surface of the solid-state imaging element 11 but attempting to pass through the side surface of the lens 131 to the outside of the lens 131 is transmitted as indicated by a solid arrow in a lower part of FIG. 27. In addition, reflection light coming from the side surface of the lens 131 is decreased as indicated by a dotted arrow. As a result, entrance of stray light into the lens 131 is reduced, and therefore reduction of generation of a flare or a ghost is achievable.

Further, according to the example described above with reference to FIG. 27, the refractive film 351 is formed at the same height as the height of the lens 131 on the glass substrate 12, and the end portion of the refractive film 351 is perpendicularly formed. However, other shapes may be adopted.

Figure 28:
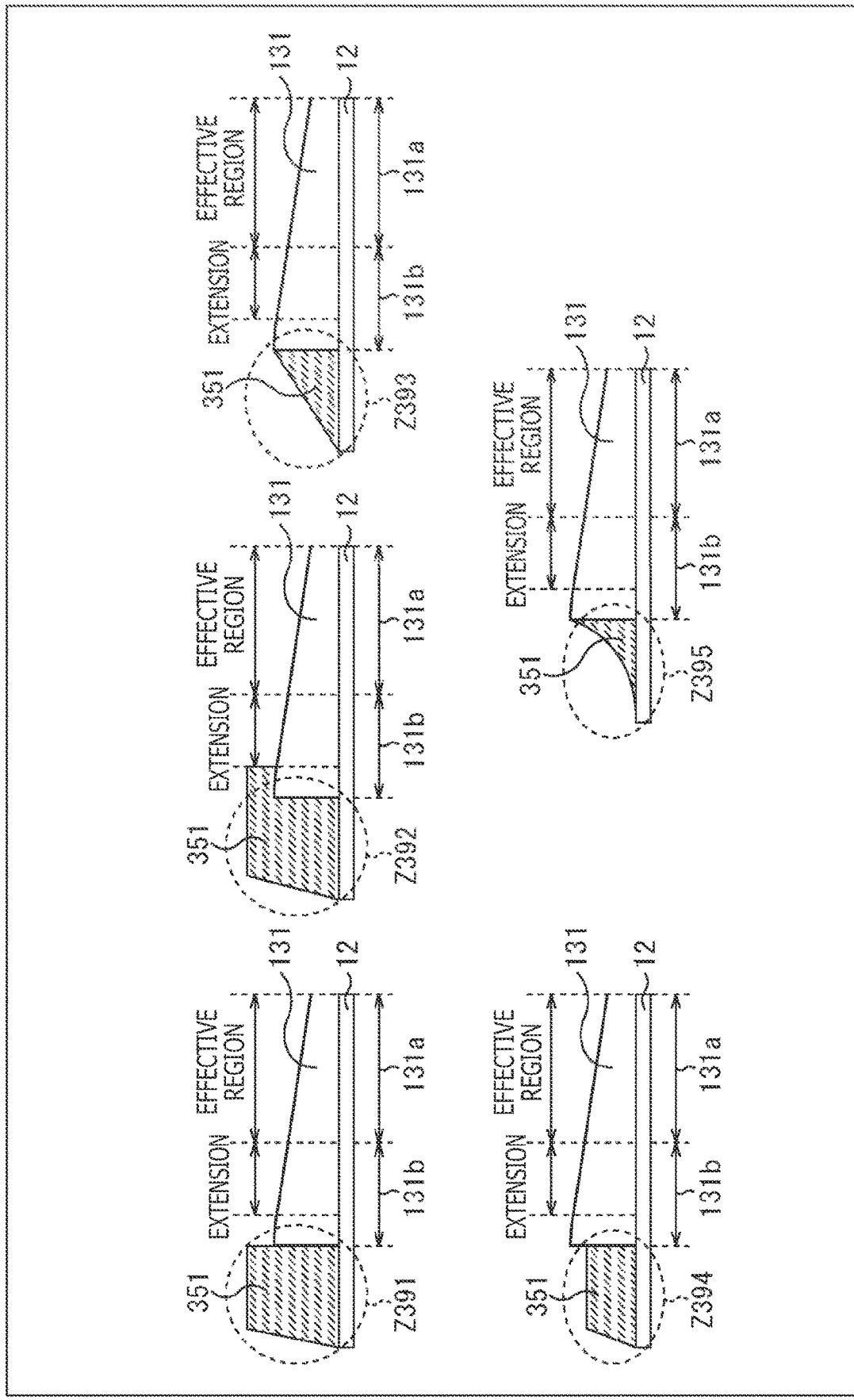
FIG. 28 is a yet another diagram explaining modified examples of the structure of the lens end portion of FIG. 23.

For example, as depicted in a region Z391 in an upper left part of FIG. 28, the refractive film 351 may have a tapered end portion on the glass substrate 12, and have a thickness to become higher than the height of the end portion of the lens 131.

Further, for example, as depicted in a region Z392 in an upper center part of FIG. 28, the refractive film 351 may have a tapered end portion, and have a thickness to become higher than the height of the end portion of the lens 131. Further, a part of the refractive film 351 may overlap with the non-effective region 131b of the lens 131.

Moreover, for example, as depicted in a region Z393 in an upper right part of FIG. 28, the refractive film 351 may have a tapered shape extending from the height of the end portion of the lens 131 to the end portion of the glass substrate 12.

Additionally, for example, as depicted in a region Z394 in a lower left part of FIG. 28, the refractive film 351 may have a tapered portion at the end portion of the glass substrate 12, and have a thickness to become lower than the height of the end portion of the lens 131.

Furthermore, for example, as depicted in a region Z395 in a lower right part of FIG. 28, the refractive film 351 may have a portion recessed toward the glass substrate 12 from the height of the end portion of the lens 131, and have a round shape.

Any configurations of FIGS. 27 and 28 reduces entrance of stray light into the lens 131. Accordingly, reduction of generation of a flare or a ghost is achievable.

16. Sixteenth Embodiment

According to the example described above, a flare or a ghost is reduced by lowering likeliness of separation of the lens 131 from the glass substrate 12 or reducing entrance of stray light. However, a flare or a ghost may be reduced by decreasing a burr of an adhesive produced during processing.

Figure 29:
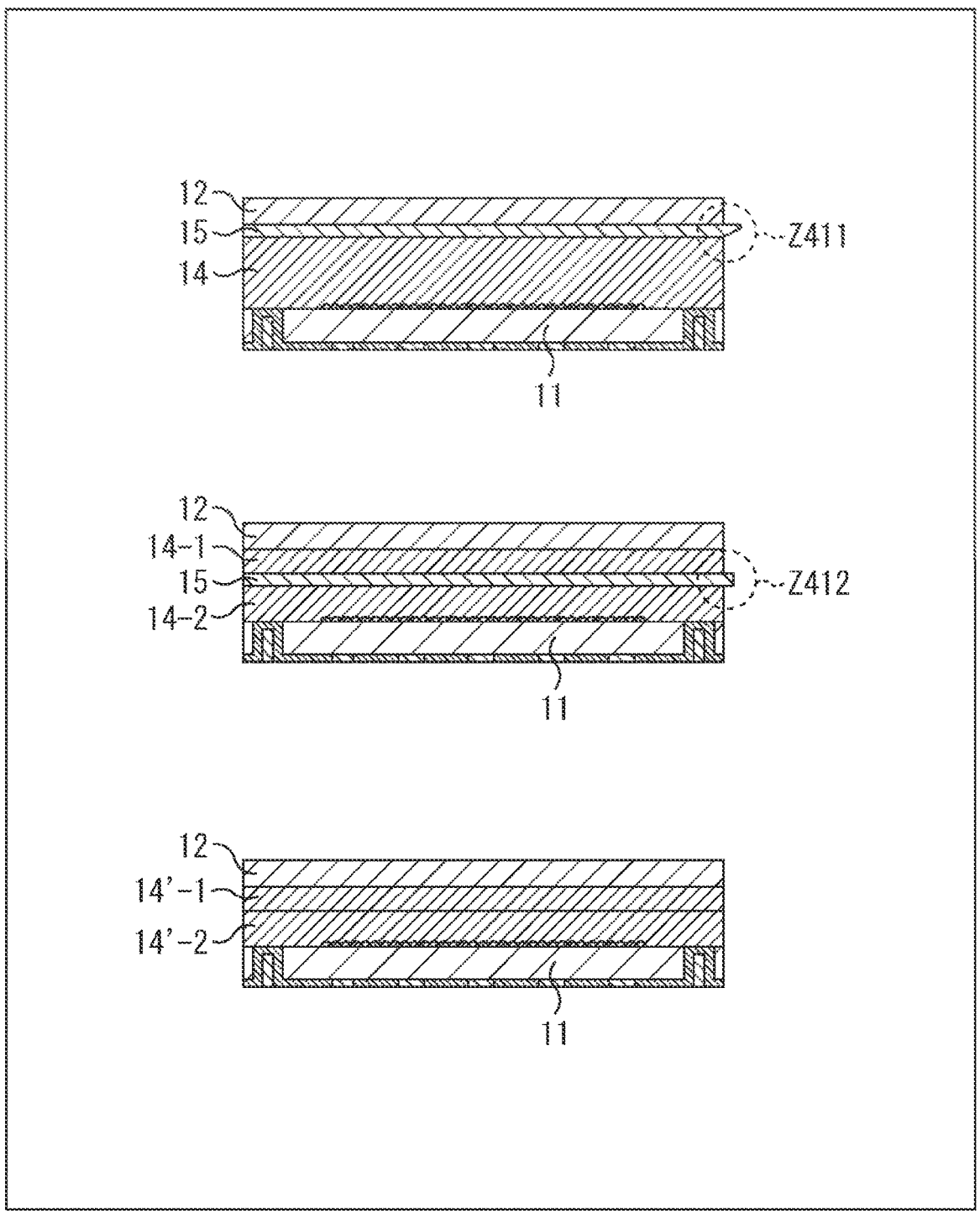
FIG. 29 is a diagram explaining a configuration example of an imaging device according to a sixteenth embodiment of the present disclosure.

Specifically, considered here is a case where the glass substrate 12 is bonded onto the IRCF 14 via the adhesive 15 in a state where the IRCF 14 is formed on the solid-state imaging element 11 (for example, the configuration of the seventh embodiment of FIG. 15) as depicted in an upper part of FIG. 29. Note that the configuration of FIG. 29 corresponds to the configuration of the integrated configuration unit 10 included in the imaging device 1 of FIG. 15 other than the lens.

In this case, the IRCF 14 requires a predetermined film thickness. However, viscosity of the material of the IRCF 14 is generally difficult to increase, and a desired film thickness is difficult to obtain at a time. However, overcoating produces microvoids or air entrainment, and may deteriorate optical characteristics.

Further, the glass substrate 12 is bonded via the adhesive 15 after the IRCF 14 is formed on the solid-state imaging element 11. In this case, a warp is produced by cure shrinkage of the IRCF 14, and a junction failure may be caused between the glass substrate 12 and the IRCF 14. Further, the warp of the IRCF 14 is difficult to correct only by the glass substrate 12. Accordingly, the entire device is warped, and optical characteristics may be deteriorated.

Further, particularly in a case where the glass substrate 12 and the IRCF 14 are joined to each other via the adhesive 15, a resin burr is produced from the adhesive 15 during individualization as indicated by a range Z411 in an upper part of FIG. 29. In this case, working accuracy may be lowered during mounting such as picking up.

Accordingly, as depicted in a middle part of FIG. 29, the IRCF 14 is divided into two parts constituted by IRCFs 14-1 and 14-2, and the IRCFs 14-1 and 14-2 are bonded to each other via the adhesive 15.

According to such a configuration, each of the IRCF 14-1 and 14-2 can be divided and formed into a thin film during film formation. Accordingly, thick film formation for obtaining desired spectral characteristics (divisional formation) is facilitated.

In addition, when the glass substrate 12 is joined to the solid-state imaging element 11, a step on the solid-state imaging element 11 (sensor step such as PAD) can be flattened by the IRCF 14-2 before joining the glass substrate 12. Accordingly, the film thickness of the adhesive 15 can be reduced, and consequently the height of the imaging device 1 can be reduced.

Further, a warp is cancelled by the IRCFs 14-1 and 14-2 formed on the glass substrate 12 and the solid-state imaging element 11, respectively. Accordingly, a warp of a device chip can be reduced.

Moreover, elastic modulus of glass is higher than that of the IRCFs 14-1 and 14-2. When the elastic modulus of the IRCFs 14-1 and 14-2 is higher than the elastic modulus of the adhesive 15, the upper side and the lower side of the adhesive 15 having low elasticity are covered by the IRCFs 14-1 and 14-2 having higher elasticity than that of the adhesive 15 during individualization. Accordingly, generation of a resin burr can be reduced during individualization (expansion) as indicated as a range Z412 in an upper part of FIG. 29.

Furthermore, as depicted in a lower part of FIG. 29, IRCFs 14'-1 and 14'-2 each having a function of an adhesive may be formed for direct affixation in a mutually opposed state. In such a manner, generation of a resin burr from the adhesive 15 during individualization can be reduced.

<Manufacturing Method>

Described next with reference to FIG. 30 will be a manufacturing method which joins the glass substrate 12 to the solid-state imaging element 11 depicted in the middle part of FIG. 29 using the IRCFs 14-1 and 14-2 with the adhesive 15 interposed.

Figure 30:
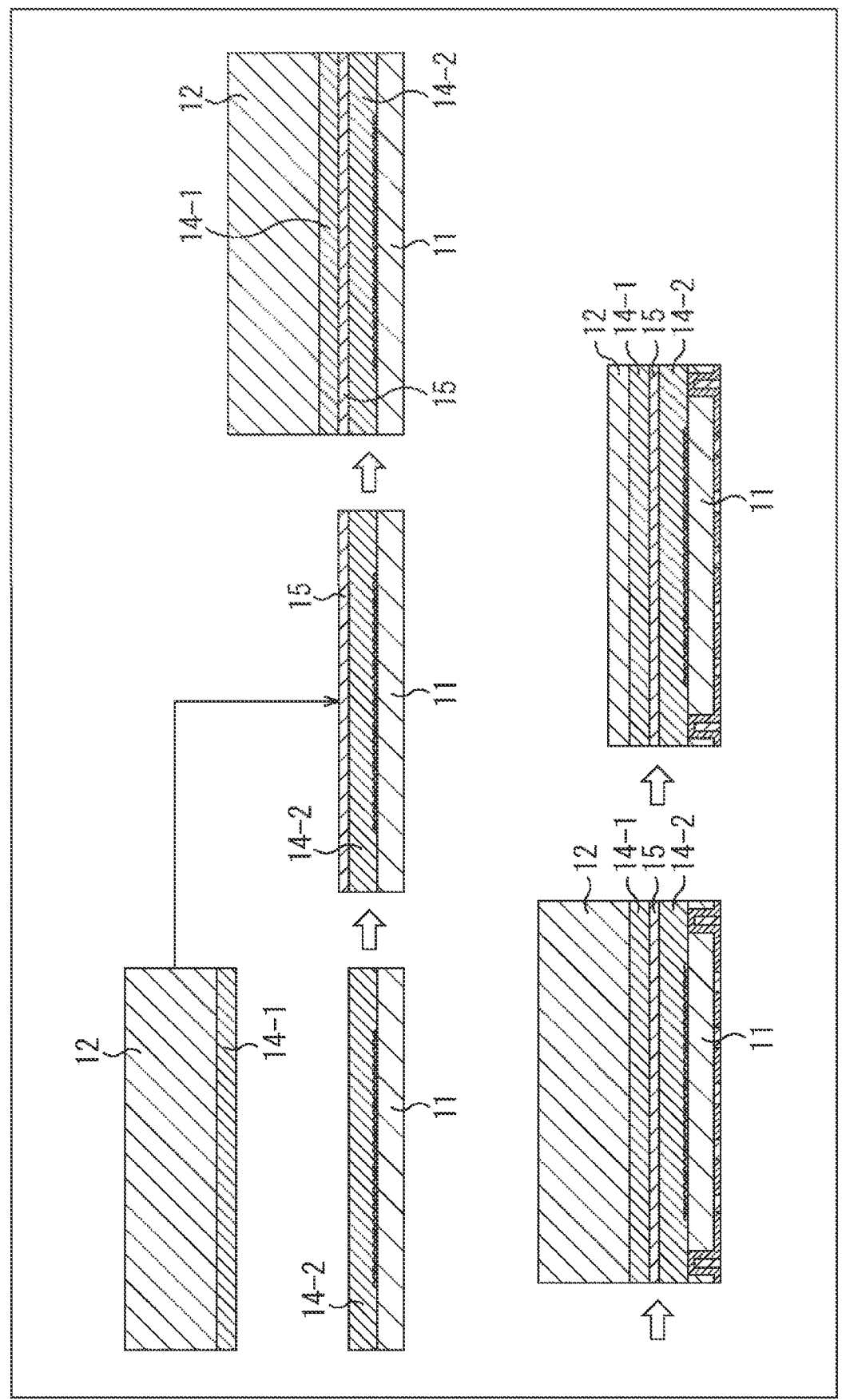
FIG. 30 is a diagram explaining a manufacturing method of the imaging device of FIG. 29.

In a first step, the IRCF 14-1 is applied to and formed on the glass substrate 12 as depicted in an upper left part of FIG. 30. In addition, the IRCF 14-2 is applied to and formed on the solid-state imaging element 11. Note that the glass substrate 12 in the upper left part of FIG. 30 is depicted in a state that the top and the bottom are reversed after the IRCF 14-2 is applied.

In a second step, the adhesive 15 is applied onto the IRCF 14-2 as depicted in an upper center part of FIG. 30.

In a third step, the IRCF 14-1 on the glass substrate 12 is affixed onto the adhesive 15 depicted in the upper center part of FIG. 30 in such a manner as to face the surface to which the adhesive 15 has been applied as depicted in an upper right part of FIG. 30.

In a fourth step, an electrode is formed on the back side of the solid-state imaging element 11 as depicted in a lower left part of FIG. 30.

In a fifth step, the glass substrate 12 is thinned by polishing as depicted in a center lower part of FIG. 30.

Subsequently, after the fifth step, end portions are cut by a blade or the like for individualization to complete the solid-state imaging element 11 which includes the IRCFs 14-1 and 14-2 laminated on the imaging surface, and the glass substrate 12 formed on the lamination of the IRCFs 14-1 and 14-2.

The adhesive 15 is sandwiched between the IRCFs 14-1 and 14-2 by the above steps. Accordingly, a burr produced by individualization can be reduced.

Further, each of the IRCFs 14-1 and 14-2 is allowed to constitute a half of a necessary film thickness. In this case, a thickness requiring overcoating can be reduced, or the necessity of overcoating is eliminated. Accordingly, deterioration of optical characteristics can be reduced by reduction of microvoids or air entrainment.

Further, with the decrease in each film thickness of the IRCFs 14-1 and 14-2, a warp caused by cure shrinkage is allowed to decrease. Accordingly, deterioration of optical characteristics caused by a warp can be reduced by reduction of a junction failure between the glass substrate 12 and the IRCF 14.

Note that only a step of applying the adhesive 15 is skipped in a case of use of the IRCFs 14'-1 and 14'-2 having a function of an adhesive as depicted in a lower part of FIG. 29. Accordingly, description of this case is omitted.

<Modified Examples of Side Surface Shape after Individualization>

It is assumed that the end portion of the solid-state imaging element 11 is cut by a blade or the like such that a side surface cross section becomes perpendicular to the imaging surface at the time of individualization of the solid-state imaging element 11 where the IRCFs 14-1 and 14-2 and further the glass substrate 12 are formed by the manufacturing method described above.

However, an effect of falling wastes produced by the glass substrate 12, the IRCFs 14-1 and 14-2, and the adhesive 15 may be further reduced by adjusting shapes of side surface cross sections of the IRCFs 14-1 and 14-2 and the glass substrate 12 formed on the solid-state imaging element 11.

For example, as depicted in an upper let part of FIG. 31, the side surface cross sections may be formed such that the external shape of the solid-state imaging element 11 in the horizontal direction becomes the largest, and that the glass substrate 12, the IRCFs 14-1 and 14-2, and the adhesive 15 are equalized and become smaller than the solid-state imaging element 11.

In addition, as depicted in an upper right part of FIG. 31, the side surface cross sections may be formed such that the external shape of the solid-state imaging element 11 in the horizontal direction becomes the largest, that the external shapes of the IRCFs 14-1 and 14-2 and the adhesive 15 are equalized and become largest next to the solid-state imaging element 11, and that the external shape of the glass substrate 12 becomes the smallest.

Moreover, as depicted in a lower left part of FIG. 31, the side surface cross sections may be formed such that the sizes of the external shapes in the horizontal direction change in a descending order of the solid-state imaging element 11, the IRCFs 14-1 and 14-2, the adhesive 15, and the glass substrate 12.

Furthermore, as depicted in a lower right part of FIG. 31, the side surface cross sections may be formed such that the external shape of the solid-state imaging element 11 in the horizontal direction becomes the largest, that the external shape of the glass substrate 12 becomes the largest next to the solid-state imaging element 11, and that the external shapes of the IRCFs 14-1 and 14-2 and the adhesive 15 are equalized and become the smallest.

<Individualization Method of Upper Left Part of FIG. 31>

An individualization method of the upper left part of FIG. 31 will be subsequently described with reference to FIG. 32.

Figure 32:
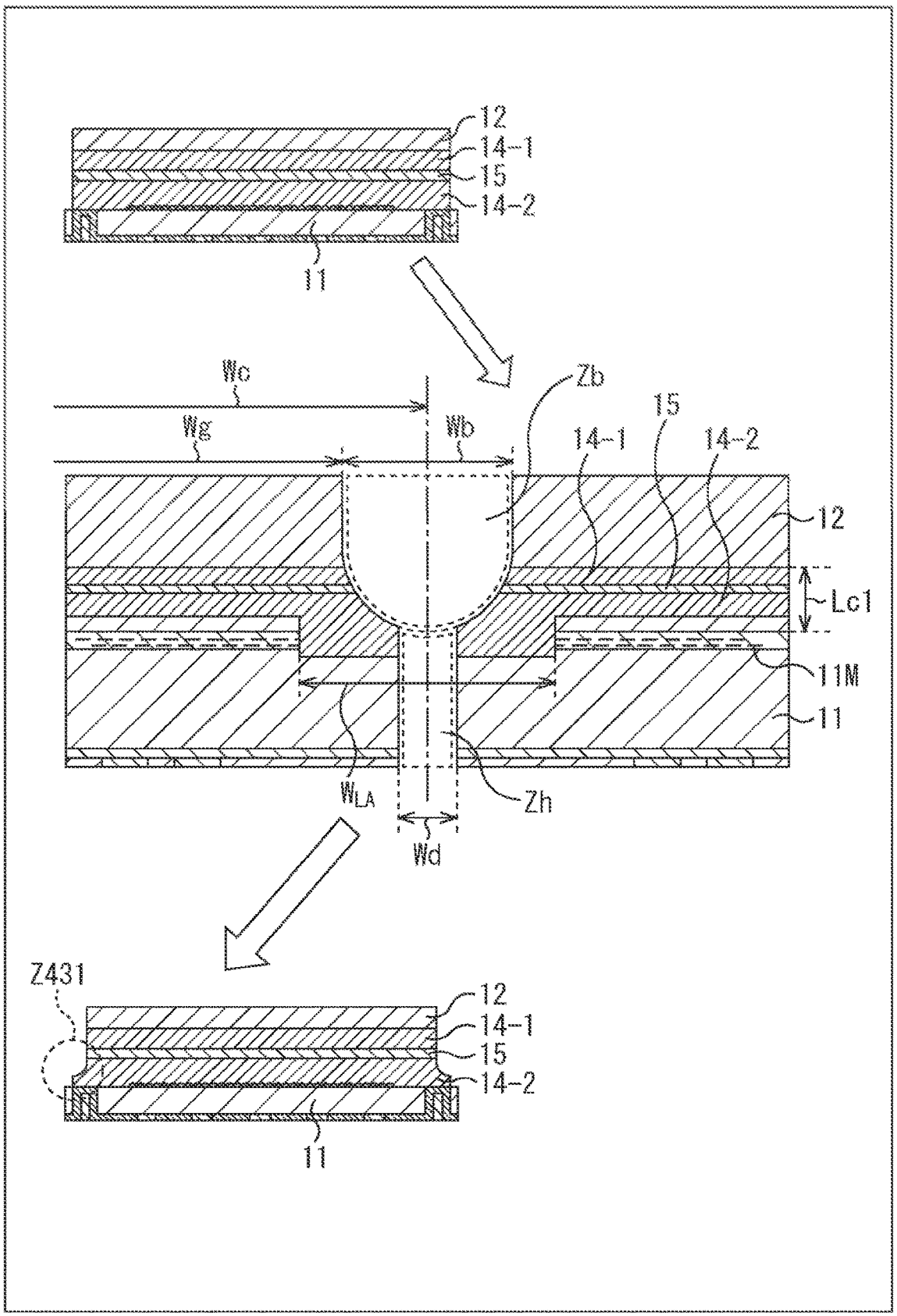
FIG. 32 is a diagram explaining a manufacturing method of an imaging device in an upper left part of FIG. 31.

A diagram depicted in an upper part of FIG. 32 is a diagram explaining the side surface cross section depicted in the upper left part of FIG. 31. Specifically, as depicted in the side surface cross section in the upper part of FIG. 32, the external shape of the solid-state imaging element 11 in the horizontal direction is the largest, and the glass substrate 12, the IRCFs 14-1 and 14-2, and the adhesive 15 are equalized in size and are smaller than the solid-state imaging element 11.

A forming method of the side surface cross section depicted in the upper left part of FIG. 31 will be here described with reference to a middle part of FIG. 32. Note that the middle part of FIG. 32 is an enlarged diagram of a boundary between the adjoining solid-state imaging elements 11 cut for individualization as viewed from the side surface.

In a first step, a range Zb constituted by the glass substrate 12, the IRCFs 14-1 and 14-2, and the adhesive 15 is cut from a surface layer of the IRCF 14-1 up to a depth Lc1 by using a blade having a predetermined width Wb (e.g., approximately 100 µm) at the boundary between the adjoining solid-state imaging elements 11.

A position corresponding to the depth Lc from the surface layer of the IRCF 14-1 in a center part of FIG. 32 here is defined as a position in a surface layer of the solid-state imaging element 11 and up to a wiring layer 11M formed by CU-CU junction or the like. However, the position is only required to reach the surface layer of the solid-state imaging element 11. Accordingly, the depth Lc1 may be a position cut up to a surface layer of the semiconductor substrate 81 of FIG. 6.

Further, as depicted in the center part of FIG. 32, the blade cuts the boundary in such a state as to be centered at a center position of the adjoining solid-state imaging elements 11 as indicated by a one-dot chain line. Further, a width WLA in the figure is a width where wiring layers formed at ends of the adjoining two solid-state imaging elements 11 are formed. In addition, a width up to a center of a scribe line of one of chips of the solid-state imaging elements 11 is a width Wc, while a width up to an end of the glass substrate 12 is a width Wg.

Moreover, the range Zb corresponds to a shape of the blade. An upper portion of the range Zb is defined by the width Wb of the blade, while the lower portion is expressed as a semispherical shape. The shape of the range Zb corresponds to the shape of the blade.

In a second step, an Si substrate (semiconductor substrate 81 of FIG. 6) of the solid-state imaging element 11 is cut in a range Zh having a predetermined width Wd (e.g., approximately 35 µm) smaller than the width of the blade having cut the glass substrate 12 by dry etching, laser dicing, or using a blade, for example, for individualization of the solid-state imaging element 11. However, in a case of laser dicing, the width Wd becomes substantially zero. Moreover, a cutting shape is adjustable to a desired shape by dry etching, laser dicing, or using the blade.

As a result, as depicted in a lower part of FIG. 32, the side surface cross section is formed such that the external shape of the solid-state imaging element 11 in the horizontal direction becomes the largest, and that the glass substrate 12, the IRCFs 14-1 and 14-2, and the adhesive 15 are equalized and become smaller than the solid-state imaging element 11.

Note that a part of the IRCF 14-2 in the horizontal direction in the vicinity of the boundary with the solid-state imaging element 11 has a larger width than the width of the IRCF 14-1 in the horizontal direction as depicted in a range Z431 in the lower part of FIG. 32, and has a shape different from each shape of the side surface cross sections of the glass substrate 12, the IRCFs 14-1 and 14-2, and the adhesive 15 in the upper part of FIG. 32.

However, this difference is produced as a result of deformation of the cutting shape using the blade. The configuration in the lower part of FIG. 32 can be made substantially equivalent to the configuration in the upper part of FIG. 32 by adjusting the cutting shape using dry etching, laser dicing, or using the blade.

Moreover, the process of cutting the Si substrate (semiconductor substrate 81 of FIG. 6) constituting the solid-state imaging element 11 in the range Zh may be executed prior to the work of cutting the range Zb. At this time, the work may be performed in a state that the top and the bottom are reversed with respect to the state in the middle part of FIG. 32.

Furthermore, generation of cracks or film separation of the wiring layer is likely to occur during blade dicing. Accordingly, the range Zh may be cut by abrasion processing using short pulse laser.

<Individualization Method of Upper Right Part of FIG. 31>

An individualization method of the upper right part of FIG. 31 will be subsequently described with reference to FIG. 33.

Figure 33:
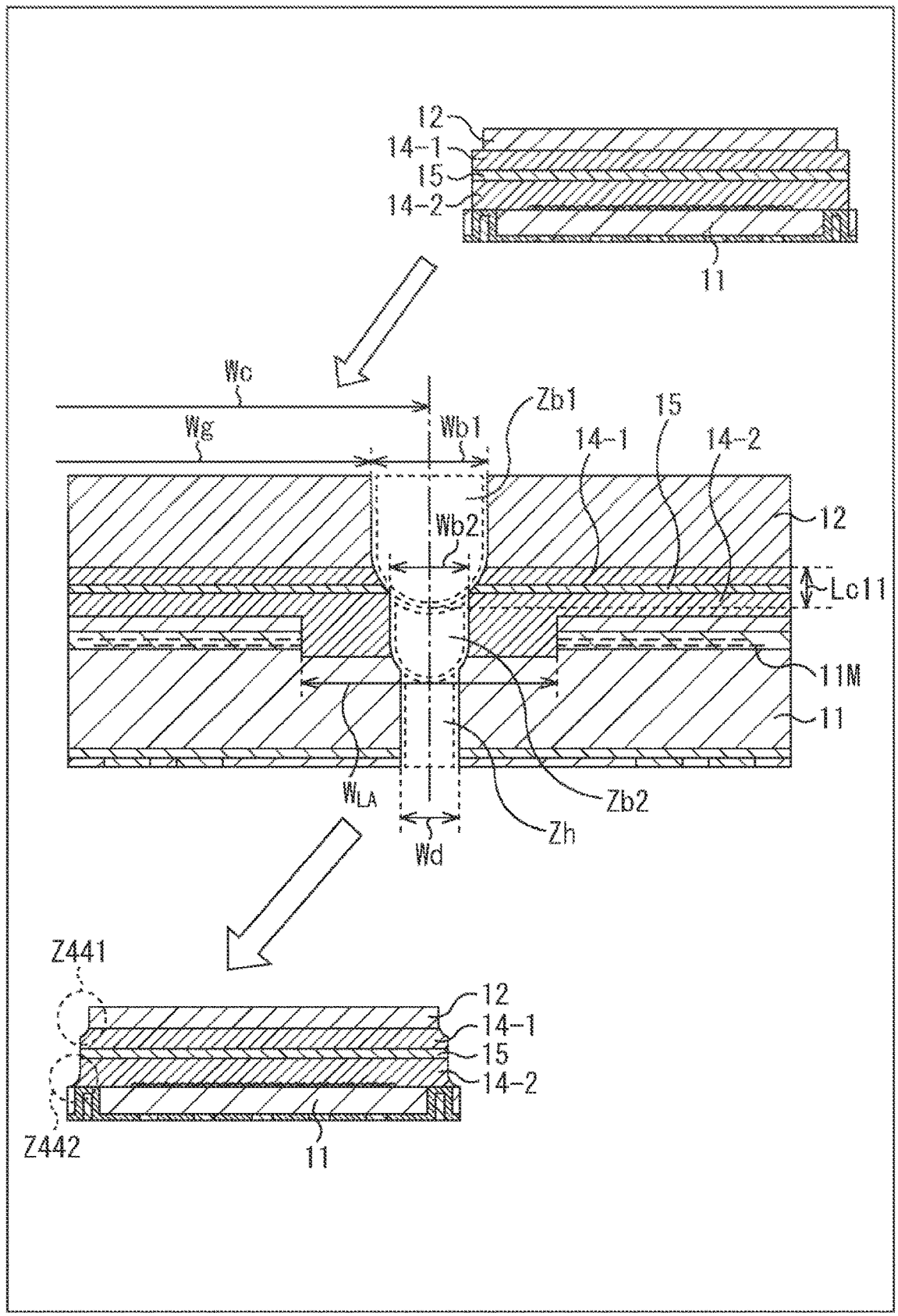
FIG. 33 is a diagram explaining a manufacturing method of an imaging device in a lower left part of FIG. 31.

A diagram depicted in an upper part of FIG. 33 is a diagram explaining the side surface cross section depicted in the upper right part of FIG. 31. Specifically, as depicted in the side surface cross section in the upper part of FIG. 33, the external shape of the solid-state imaging element 11 in the horizontal direction is the largest, the external shapes of the IRCFs 14-1 and 14-2 and the adhesive 15 are equalized and are the largest next to the solid-state imaging element 11, and the external shape of the glass substrate 12 is the smallest.

A forming method of the side surface cross section depicted in the upper right part of FIG. 31 will be here described with reference to a middle part of FIG. 33. Note that the middle part of FIG. 33 is an enlarged diagram of a boundary between the adjoining solid-state imaging elements 11 cut for individualization as viewed from the side surface.

In a first step, a range Zb1 constituted by the glass substrate 12, the IRCFs 14-1 and 14-2, and the adhesive 15 is cut from the surface layer of the IRCF 14-1 up to a depth Lc11 by using a blade having a predetermined width Wb1 (e.g., approximately 100 µm) at the boundary of the adjoining solid-state imaging elements 11.

In a second step, a range Zb2 having a depth exceeding the wiring layer 11M is cut by a blade having a predetermined width Wb2 (<width Wb1).

In a third step, the Si substrate (semiconductor substrate 81 in FIG. 6) is cut in the range Zh having the predetermined width Wd (e.g., approximately 35 µm) smaller than the width Wb2 by dry etching, laser dicing, or using a blade, for example, for individualization of the solid-state imaging element 11. However, in a case of laser dicing, the width Wd becomes substantially zero. Moreover, a cutting shape is adjustable to a desired shape by dry etching, laser dicing, or using the blade.

As a result, as depicted in a lower part of FIG. 33, the side surface cross section is formed such that the external shape of the solid-state imaging element 11 in the horizontal direction becomes the largest, that the IRCFs 14-1 and 14-2 and the adhesive 15 are equalized and become the largest next to the solid-state imaging element 11, and that the glass substrate 12 becomes the smallest.

Note that a part of the IRCF 14-1 in the horizontal direction has the same width as the width of the glass substrate 12 in the horizontal direction as indicated by a range Z441 in the lower part of FIG. 33. In addition, a part of the IRCF 14-2 in the horizontal direction has a larger width than the width of the IRCF 14-1 as indicated by a range Z442.

Accordingly, the shapes of the side cross sections of the glass substrate 12, the IRCFs 14-1 and 14-2, and the adhesive 15 are different from the corresponding shapes in the upper part of FIG. 33.

However, this difference is produced as a result of deformation of the cutting shape using the blade. The configuration in the lower part of FIG. 32 can be made substantially equivalent to the configuration in the upper part of FIG. 32 by adjusting the cutting shape using dry etching, laser dicing, or using the blade.

Moreover, the process of cutting the Si substrate (semiconductor substrate 81 of FIG. 6) constituting the solid-state imaging element 11 in the range Zh may be executed prior to the work of cutting the ranges Zb1 and Zb2. At this time, the work may be performed in a state where the top and the bottom are reversed with respect to the state in the middle part of FIG. 33.

Furthermore, generation of cracks or film separation of the wiring layer is likely to occur during blade dicing. Accordingly, the range Zh may be cut by abrasion processing using short pulse laser.

<Individualization Method of Lower Left Part of FIG. 31>

An individualization method of the lower left part of FIG. 31 will be subsequently described with reference to FIG. 34.

Figure 34:
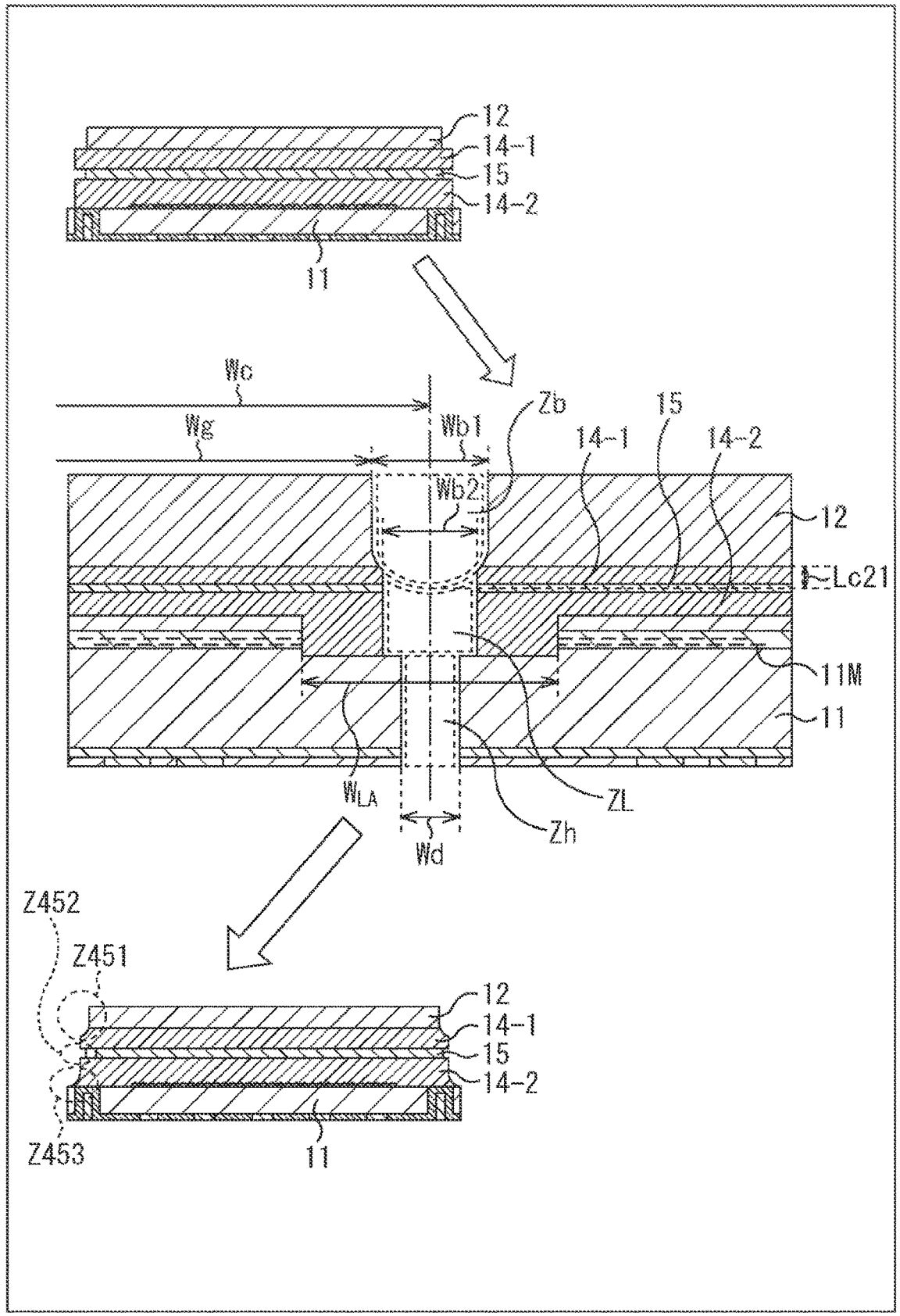
FIG. 34 is a diagram explaining a manufacturing method of an imaging device in an upper right part of FIG. 31.

A diagram depicted in an upper part of FIG. 34 is a diagram explaining the side surface cross section depicted in the lower left part of FIG. 31. Specifically, as depicted in the side surface cross section in the upper left part of FIG. 34, the size of the external shape decreases in an order of the external shape of the solid-state imaging element 11 in the horizontal direction, the IRCFs 14-1 and 14-2, the adhesive 15, and the glass substrate 12.

A forming method of the side surface cross section depicted in the upper right part of FIG. 31 will be here described with reference to a middle part of FIG. 34. Note that the middle part of FIG. 34 is an enlarged diagram of a boundary between the adjoining solid-state imaging elements 11 cut for individualization as viewed from the side surface.

In a first step, the range Zb constituted by the glass substrate 12, the IRCFs 14-1 and 14-2, and the adhesive 15 is cut from the surface layer of the IRCF 14-2 up to a depth Lc2*l* by using a blade having the predetermined width Wb1 (e.g., approximately 100 μm).

In a second step, a range ZL having a depth exceeding the wiring layer 11M is cut by abrasion processing using laser by the predetermined width Wb2 (<width Wb1).

In this step, the IRCFs 14-1, 14-2, and the adhesive 15 cause thermal contraction as a result of absorption of laser beams in the vicinity of the processing surface. In this case, the adhesive 15 moves backward from the cutting surfaces of the IRCFs 14-1 and 14-2 and has a recessed shape according to wavelength dependence.

In a third step, the Si substrate (semiconductor substrate 81 in FIG. 6) is cut in the range Zh having a predetermined width Wd (e.g., approximately 35 μm) smaller than the width Wb2 by dry etching, laser dicing, or using a blade, for example, for individualization of the solid-state imaging element 11. However, in a case of laser dicing, the width Wd becomes substantially zero. Moreover, a cutting shape is adjustable to a desired shape by dry etching, laser dicing, or using the blade.

As a result, as depicted in a lower part of FIG. 34, the side surface cross section is formed such that the external shape of the solid-state imaging element 11 in the horizontal direction becomes the largest, that the external shapes of the IRCFs 14-1 and 14-2 become the largest next to the solid-state imaging element 11, that the external shape of the adhesive 15 becomes the largest next to the IRCFs 14-1 and 14-2, and that the glass substrate 12 becomes the smallest. In other words, as indicated by a range Z452 in a lower part of FIG. 34, the external shape of the adhesive 15 is smaller than the external shapes of the IRCFs 14-1 and 14-2.

In the lower part of FIG. 34, note that a part of the IRCF 14-2 in the horizontal direction has a larger width than the width of the IRCF 14-1 in the horizontal direction as indicated by a range Z453. In addition, a part of the IRCF 14-1 in the horizontal direction has the same width as the width of the glass substrate 12 in the horizontal direction as indicated by a range Z451.

Accordingly, the shapes of the side cross sections of the glass substrate 12, the IRCFs 14-1 and 14-2, and the adhesive 15 in the lower part of FIG. 34 are different from the corresponding shapes in the upper part of FIG. 34.

However, this difference is produced as a result of deformation of the cutting shape using the blade. The configuration in the lower part of FIG. 32 can be made substantially equivalent to the configuration in the upper part of FIG. 32 by adjusting the cutting shape using dry etching, laser dicing, or using the blade.

Moreover, the process of cutting the Si substrate (semiconductor substrate 81 of FIG. 6) constituting the solid-state imaging element 11 in the range Zh may be executed prior to the work of cutting the ranges Zb and ZL. At this time, the work may be performed in a state where the top and the bottom are reversed with respect to the state in the middle part of FIG. 34.

Furthermore, generation of cracks or film separation of the wiring layer is likely to occur during blade dicing. Accordingly, the range Zh may be cut by abrasion processing using short pulse laser.

<Individualization Method of Lower Right Part of FIG. 31>

An individualization method of the lower right part of FIG. 31 will be subsequently described with reference to FIG. 35.

Figure 35:
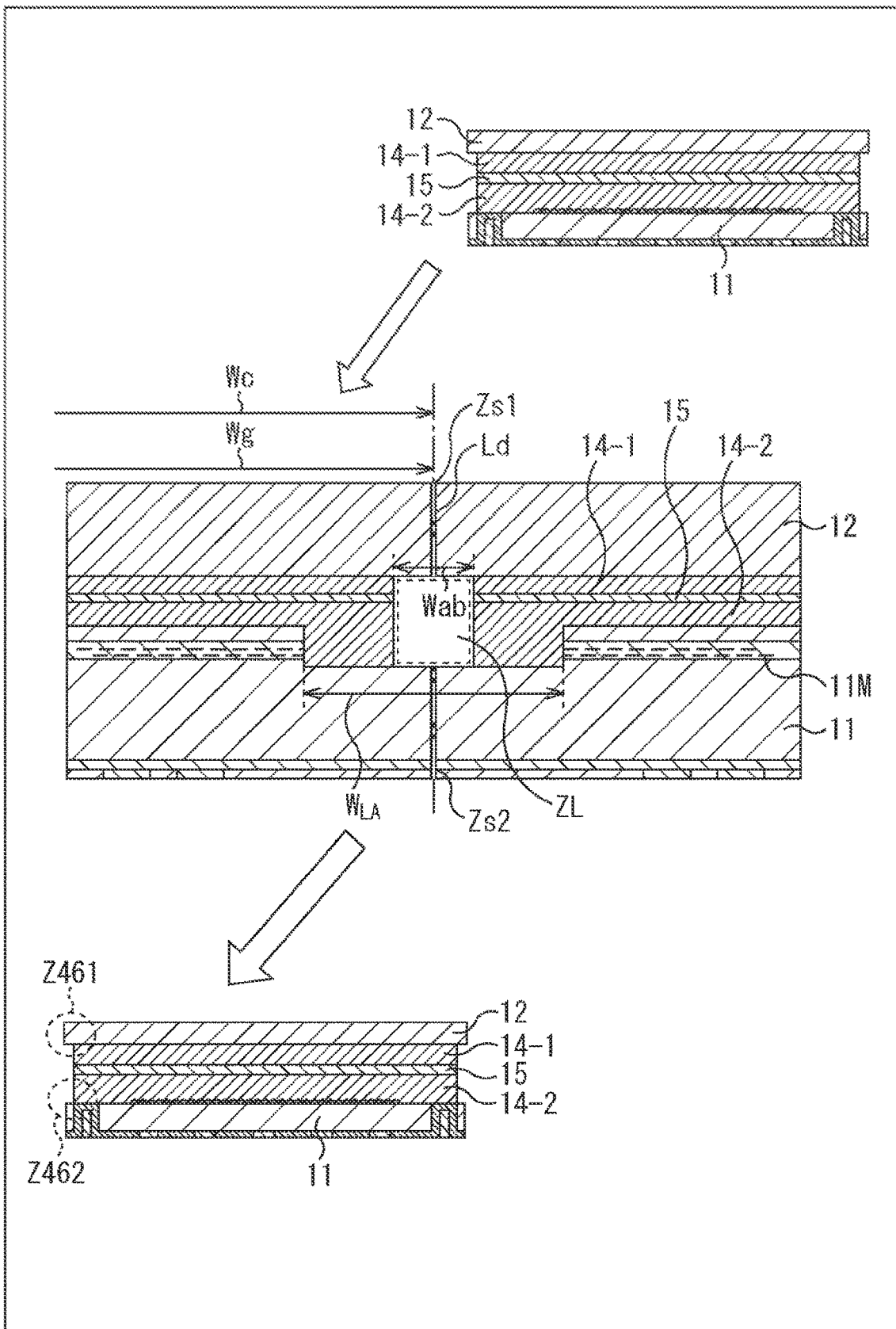
FIG. 35 is a diagram explaining a manufacturing method of an imaging device in a lower right part of FIG. 31.

A diagram depicted in an upper part of FIG. 35 is a diagram explaining the side surface cross section depicted in the lower right part of FIG. 31. Specifically, as depicted in the side surface cross section in the upper part of FIG. 35, the external shape of the solid-state imaging element 11 in the horizontal direction is the largest, the external shape of the glass substrate 12 is the largest next to the solid-state imaging element 11, and the external shapes of the IRCFs 14-1 and 14-2 and the adhesive 15 are equalized and are the smallest.

A forming method of the side surface cross section depicted in the lower right part of FIG. 31 will be here described with reference to a middle part of FIG. 35. Note that the middle part of FIG. 35 is an enlarged diagram of a boundary between the adjoining solid-state imaging elements 11 cut for individualization as viewed from the side surface.

In a first step, the glass substrate 12 in a range Zs1 having a width Ld of substantially zero is cut by what is generally called stealth (laser) dicing using laser.

In a second step, abrasion processing using laser is performed for only a predetermined width Wab to cut the range ZL included in the IRCFs 14-1 and 14-2 and the solid-state imaging element 11 and reaching a depth exceeding the wiring layer 11M.

In this step, processing is performed such that cutting surfaces of the IRCFs 14-1 and 14-2 and the adhesive 15 are equalized by adjusting abrasion processing using laser.

In a third step, a range Zs2 having a width of substantially zero is cut by what is generally called stealth (laser) dicing using laser to individualize the solid-state imaging element 11. At this time, organic matters produced by abrasion are discharged to the outside via a groove formed by stealth dicing.

As a result, as depicted in ranges Z461 and Z462 in a lower part of FIG. 35, the side surface cross section is formed such that the external shape of the solid-state imaging element 11 in the horizontal direction becomes the largest, that the external shape of the glass substrate 12 becomes the largest next to the solid-state imaging element 11, and that the external shapes of the IRCFs 14-1 and 14-2 and the adhesive 15 are equalized and become the smallest.

In addition, the order of the stealth dicing processing for the glass substrate 12 and the stealth dicing processing for the solid-state imaging element 11 may be switched. In this case, working may be performed in a state where the top and the bottom are reversed with respect to the state depicted in the middle part of FIG. 35.

<Addition of Anti-Reflection Film>

According to the example described above, as depicted in an upper left part of FIG. 36, the IRCFs 14-1 and 14-2 are bonded to and formed on the solid-state imaging element 11 via the adhesive 15, and the glass substrate 12 is formed on the IRCF 14-1. In this manner, generation of a burr and deterioration of optical characteristics are reduced. In this case, an added film having the anti-reflection function may be further formed.

Figure 36:
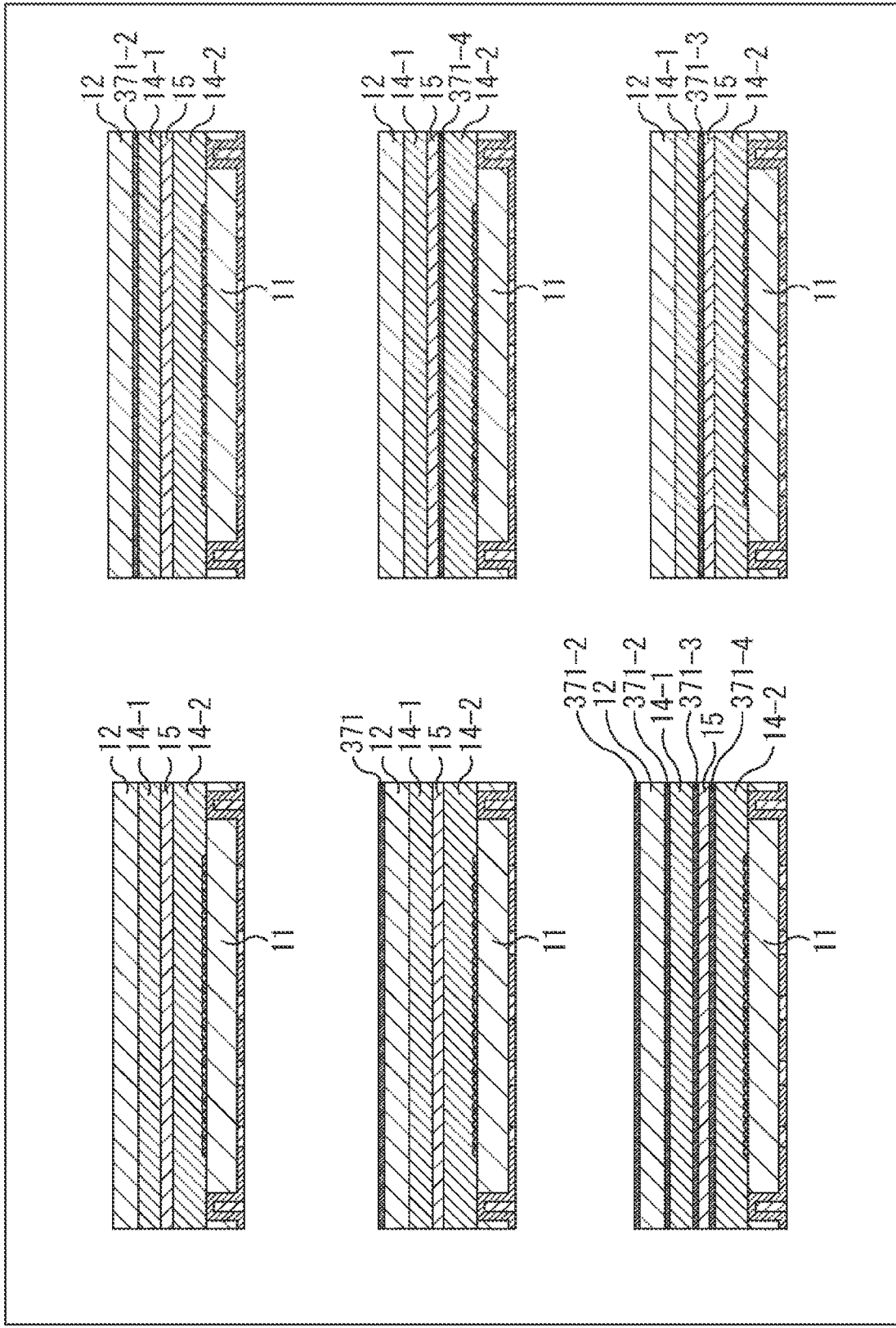
FIG. 36 is a diagram explaining modified examples which add an anti-reflection film to the configuration of FIG. 29.

Specifically, for example, an added film 371 having an anti-reflection function may be formed on the glass substrate 12 as depicted in a middle left part of FIG. 36.

Moreover, for example, added films 371-1 to 371-4 each having the anti-reflection function may be formed on the glass substrate 12, the boundary between the glass substrate 12 and the IRCF 14-1, the boundary between the IRCF 14-1 and the adhesive 15, and the boundary between the adhesive 15 and the IRCF 14-2, respectively, as depicted in a lower left part of FIG. 36.

Furthermore, any one of the added films 371-2, 371-4, and 371-3 each having the anti-reflection function may be formed as depicted in an upper right part, a middle right part, and a lower right part of FIG. 36, or the added films 371-2, 371-4, and 371-3 may be combined and formed.

Note that each of the added films 371 and 371-1 to 371-4 may be constituted by a film which has a function equivalent to the function of the AR coating 271a described above or the function of the anti-reflection treatment portion (moth eye) 291a, for example.

The added films 371 and 371-1 to 371-4 prevent entrance of unnecessary light, thereby reducing generation of a flare or a ghost.

<Addition to Side Surface Portion>

According to the example described above, at least any one of the glass substrate 12, the boundary between the glass substrate 12 and the IRCF 14-1, the boundary between the IRCF 14-1 and the adhesive 15, or the boundary between the adhesive 15 and the IRCF 14-2 is equipped with the corresponding one of the added films 371-1 to 371-4 each having the anti-reflection function. However, the side surface portion may be equipped with an added film functioning as an anti-reflection film or a light absorbing film.

Figure 37:
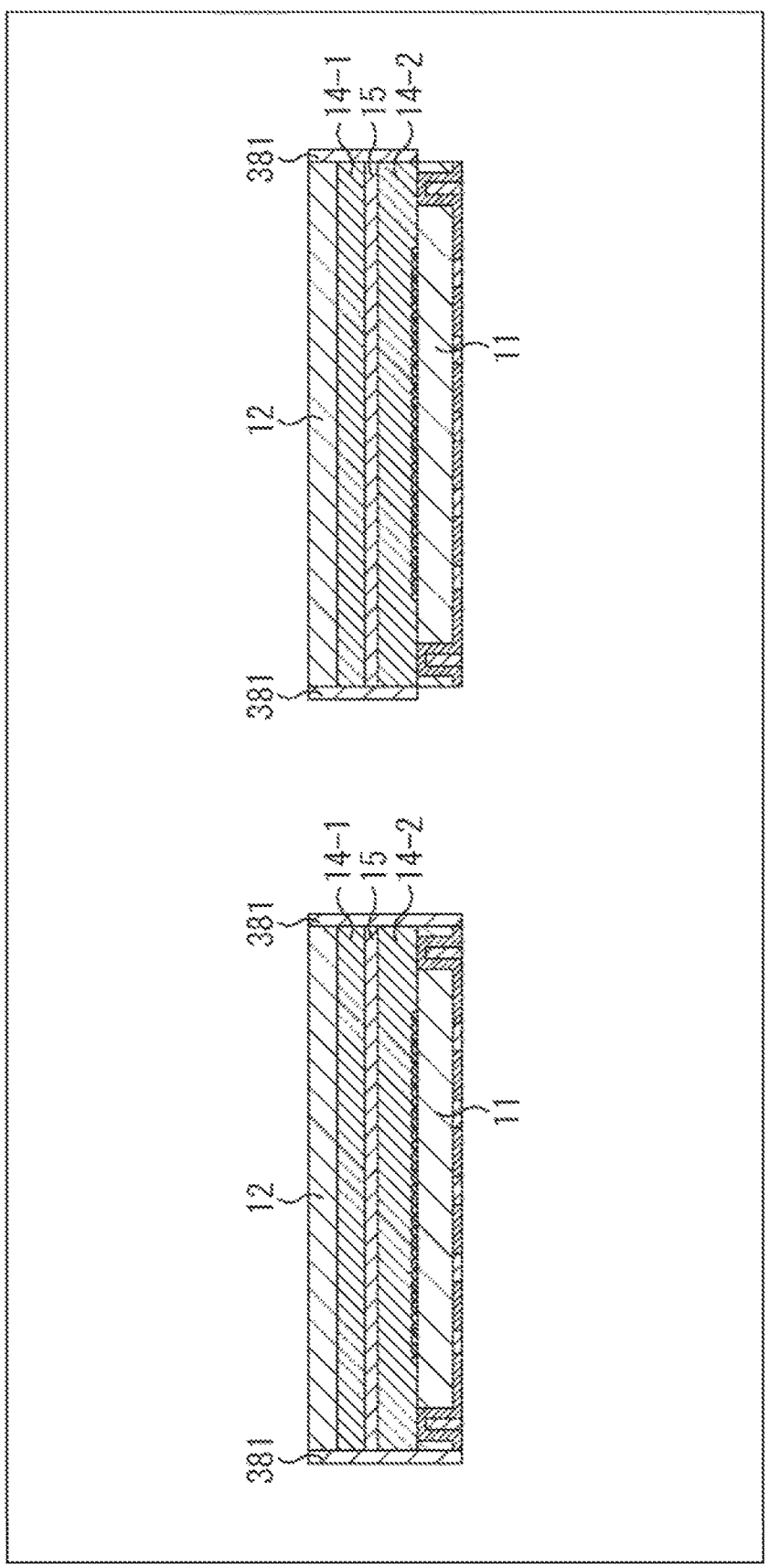
FIG. 37 is a diagram explaining a modified example which adds an anti-reflection film to a side surface portion of the configuration of FIG. 29.

Specifically, as depicted in a left part of FIG. 37, the added film 381 functioning as an anti-reflection film, a light absorbing film, or the like may be formed on an entire side surface cross section of the glass substrate 12, the IRCFs 14-1 and 14-2, the adhesive 15, and the solid-state imaging element 11.

Moreover, as depicted in a right part of FIG. 37, the added film 381 functioning as an anti-reflection film, a light absorbing film, or the like may be formed on only the side surfaces of the glass substrate 12, the IRCFs 14-1 and 14-2, and the adhesive 15, except for the side surface of the solid-state imaging element 11.

In either of these cases, reduction of entrance of unnecessary light into the solid-state imaging element 11, and thus reduction of generation of a ghost and a flare are achievable by the added film 381 provided on the side surface portions of the solid-state imaging element 11, the glass substrate 12, the IRCFs 14-1 and 14-2, and the adhesive 15.

17. Seventeenth Embodiment

According to the example described above, reduction of falling wastes, and also reduction of generation of a flare or a ghost are achieved by adjusting a size relation in the horizontal direction between the solid-state imaging element 11, the IRCF 14-1, the adhesive 15, the IRCF 14-2, and the glass substrate 12 laminated on each other. However, a lens which is miniaturized and lightweight and achieves high-resolution imaging may be actualized by specifying a lens shape.

For example, consider a case where a lens corresponding to the lens 271 coated with the AR coating 271a is joined onto the glass substrate 12 formed on the solid-state imaging element 11 (for example, the integrated configuration unit 10 included in the imaging device 1 of FIG. 19). Note that the configuration of the imaging device 1 may be a configuration other than the configuration of FIG. 19. For example, the same is applicable to a case where the lens 131 included in the integrated configuration unit 10 of the imaging device 1 of FIG. 9 is replaced with the lens 271.

Figure 38:
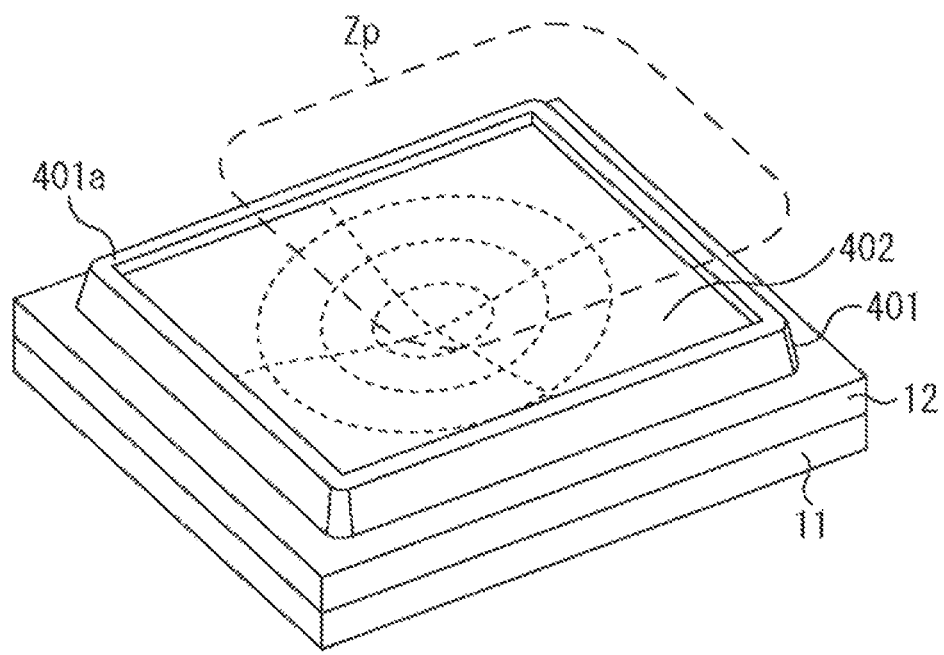
FIG. 38 is a diagram explaining a configuration example of an imaging device according to a seventeenth embodiment of the present disclosure.

Specifically, as depicted in FIG. 38, it is assumed that a lens 401 of a recessed type having an aspherical surface concentric around a center located at a center of gravity as viewed from a top surface (corresponding to the lens 271 of FIG. 19) is formed on the glass substrate 12 formed on the solid-state imaging element 11. It is further assumed that an AR coating 402 (a film having a function equivalent to the function of the AR coating 271a or the anti-reflection treatment portion 291a described above) is formed on a surface of the lens 401 into which light enters, and that a protrusion portion 401a is formed on an outer peripheral portion of the lens 401. Note that each of FIGS. 38 and 39 depicts a configuration of the solid-state imaging element 11, the glass substrate 12, and the lens 271 extracted from the integrated configuration unit 10 included in the imaging device 1 of FIG. 19.

Figure 39:
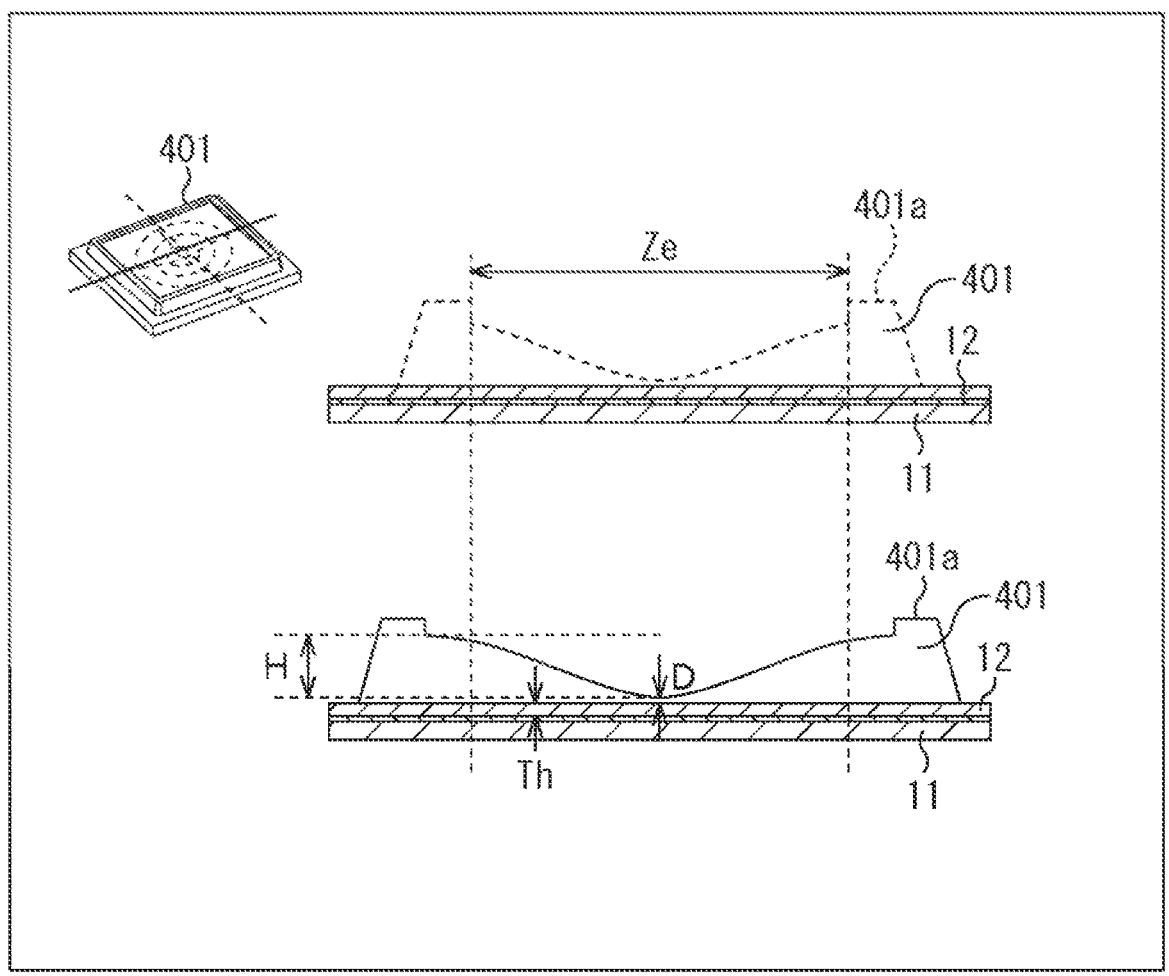
FIG. 39 is a diagram explaining a condition of a thickness of a lens which is miniaturized, lightweight, and capable of capturing a high-resolution image.

As depicted in FIG. 39, the lens 401 here has a mortar shape which has an aspherical recessed shape around the center located at the center of gravity as viewed from the top surface. Note that an upper right part of FIG. 39 depicts a cross-sectional shape of the lens 401 in a direction indicated by a dotted line in an upper left part of the figure, while a lower right part of the figure depicts a cross-sectional shape of the lens 401 in a direction indicated by a solid line in the upper left part of the figure.

In FIG. 39, a range Ze of the lens 401 has a common aspherical curved surface structure in both the upper right part and the lower right part of FIG. 39. Such a shape constitutes an effective region on the imaging surface of the solid-state imaging element 11 as a region for converging incident light coming from above in the figure.

Moreover, a thickness of the lens 401 constituted by the aspherical curved surface varies according to a distance in a direction perpendicular to a light incident direction from the center position. More specifically, the lens thickness becomes a smallest thickness D at the center position and becomes a largest thickness H at a position farthest from the center in the range Ze. In addition, in a case where the thickness of the glass substrate 12 is a thickness Th, the largest thickness H of the lens 401 is larger than the thickness Th of the glass substrate 12, while the smallest thickness D of the lens 401 is smaller than the thickness Th of the glass substrate 12. Therefore, to sum up the foregoing relations, (the integrated configuration unit 10) of the imaging device 1 which is miniaturized and lightweight and achieves high resolution imaging can be actualized by using the lens 401 and the glass substrate 12 having a relation of "thickness H>thickness Th>thickness D" for the thicknesses D, H, and Th.

In addition, the imaging device 1 which is miniaturized and lightweight and achieves high resolution imaging can be actualized by setting a volume VG of the glass substrate 12 to a volume smaller than a volume VL of the lens 401 and thereby achieving highest efficiency of the lens volume.

<Stress Distributions Generated During Heating of AR Coating>

In addition, the above configuration can reduce stress produced by expansion or contraction of the AR coating 402 during loading of implementation reflow heat or a reliability test.

Figure 40:
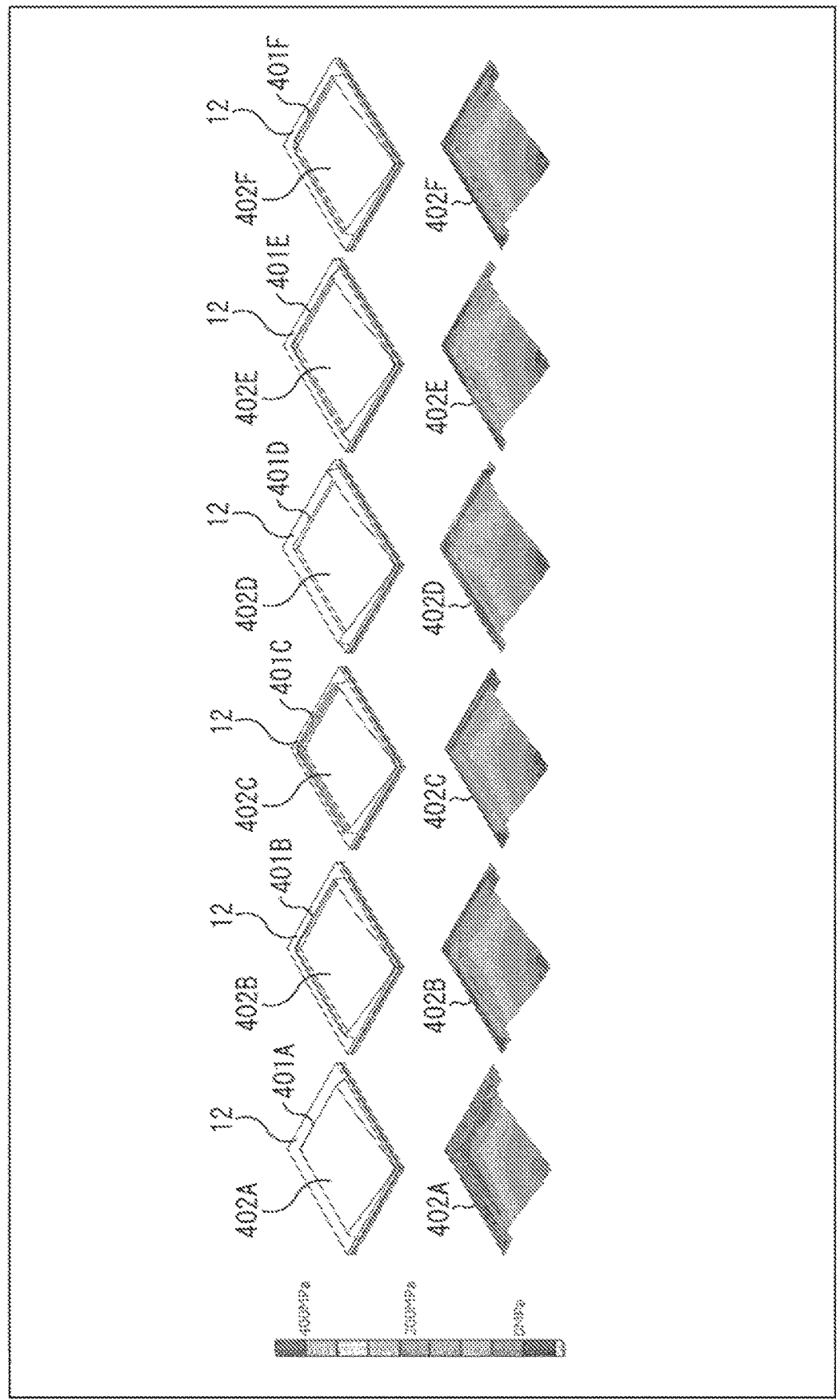
FIG. 40 is a diagram explaining stress distributions applied to an AR coating on the lens during loading of implementation reflow heat corresponding to a lens shape.

FIG. 40 depicts stress distributions produced by expansion and contraction of the AR coating 402 during loading of implementation reflow heat according to a change of an external shape of the lens 401 of FIG. 39. Note that the stress distributions in FIG. 40 represent distributions in a range of ½ in the horizontal direction and the vertical direction, i.e., ¼ of the whole, with respect to the center position of the lens 401 as a reference, as indicated by the range Zp in FIG. 38.

A leftmost part of FIG. 40 depicts a stress distribution produced in AR coating 402A during loading of implementation reflow heat in a lens 401A where the protrusion portion 401a is not provided.

A second part from the left in FIG. 40 depicts a stress distribution produced in AR coating 402B during loading of implementation reflow heat in a lens 401B where the protrusion portion 401a depicted in FIG. 39 is provided.

A third part from the left in FIG. 40 depicts a stress distribution produced in AR coating 402C during loading of implementation reflow heat in a lens 401C where the protrusion portion 401a depicted in FIG. 39 has a larger height than that height in FIG. 39.

A fourth part from the left in FIG. 40 depicts a stress distribution produced in AR coating 402D during loading of implementation reflow heat in a lens 401D where the protrusion portion 401a depicted in FIG. 39 has a larger width than that width in FIG. 39.

A fifth part from the left in FIG. 40 depicts a stress distribution produced in AR coating 402E during loading of implementation reflow heat in a lens 401E where a side surface of an outer peripheral portion of the protrusion portion 401a depicted in FIG. 39 is more tapered than in FIG. 39.

A rightmost part of FIG. 40 depicts a stress distribution produced in AR coating 402F during loading of implementation reflow heat in a lens 401F where the protrusion portion 401a depicted in FIG. 39 is provided at only four corners constituting the outer peripheral portion.

As depicted in FIG. 40, a large stress distribution is exhibited in the outer peripheral side of the effective region in the stress distribution produced in the AR coating 402A of the lens 401A where the protrusion portion 401a is not provided as depicted in the leftmost part. However, the large stress distribution presented in the AR coating 402A is not produced in the AR coatings 402B to 402F of the lenses 401B to 401F on each of which the protrusion portion 401a is formed.

Accordingly, generation of cracks in the AR coating 402 produced by expansion or contraction of the lens 401 during loading of implementation reflow heat can be reduced by providing the protrusion portion 401a on the lens 401.

<Modification of Lens Shape>

According to the example described above, the imaging device 1 includes the lens 401 which is recessed and has the protrusion portion 401a having the tapered outer peripheral portion as depicted in FIG. 39 to achieve miniaturization, weight reduction, and high-resolution imaging. However, the lens 401 may have other shapes as long as the lens 401 and the glass substrate 12 have the relation "thickness H>thickness Th>thickness D" for the thicknesses D, H, and Th. Moreover, it is more preferable that a relation "volume VG<volume VL" holds for the volumes VG and VL.

Figure 41:
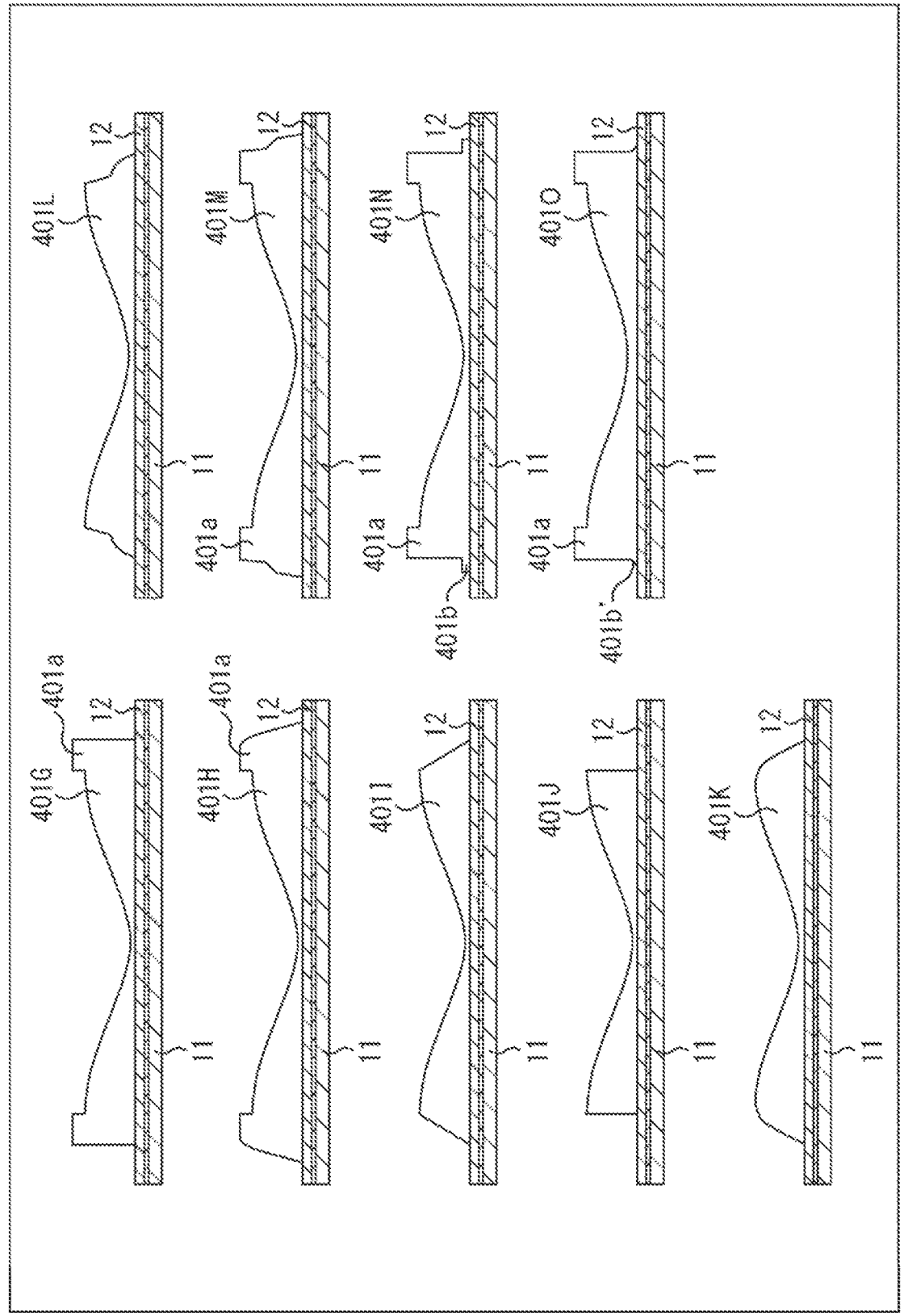
FIG. 41 is a diagram explaining a modified example of a lens shape of FIG. 39.

For example, as depicted in a lens 401G of FIG. 41, the side surface on the outer peripheral side of the protrusion portion 401a may have a right angle with respect to the glass substrate 12 without including a taper.

Further, as depicted in a lens 401H of FIG. 41, the side surface on the outer peripheral side of the protrusion portion 401a may include a round taper.

Further, as depicted in a lens 401I of FIG. 41, the side surface may include a linear tapered shape having a predetermined angle with respect to the glass substrate 12 without including the protrusion portion 401a itself.

Further, as depicted in a lens 401J of FIG. 41, the side surface may have a configuration not including the protrusion portion 401a itself, i.e., may have a configuration forming a right angle with respect to the glass substrate 12 without including a tapered shape.

Further, as depicted in a lens 401K of FIG. 41, the side surface may include a round tapered shape with respect to the glass substrate 12 without including the protrusion portion 401a itself.

Further, as depicted in a lens 401L of FIG. 41, the side surface of the lens may have a two-stage configuration having two inflection points without including the protrusion portion 401a itself. Note that a detailed configuration of the lens 401L will be described below with reference to FIG. 42. In addition, the side surface of the lens 401L has a two-stage configuration having two inflection points, and therefore will be also referred to as a two-stage side surface lens.

Further, as depicted in a lens 401M of FIG. 41, the side surface may include the protrusion portion 401a and also have a two-stage configuration having two inflection points in the external shape side surface.

Further, as depicted in a lens 401N of FIG. 41, the side surface may include the protrusion portion 401a and may further have a hemming bottom portion 401b having a square shape in the vicinity of the boundary with the glass substrate 12 as a configuration having a right angle with respect to the glass substrate 12.

Moreover, as depicted in the lens 401N of FIG. 41, the protrusion portion 401a may be included, and a hemming bottom portion 401b' having a round shape may be further added to the vicinity of the boundary with the glass substrate 12 as a configuration having a right angle with respect to the glass substrate 12.

<Detailed Configuration of Two-Stage Side Surface Lens>

A detailed configuration of the two-stage side surface lens 401L of FIG. 41 will be here described with reference to FIG. 42.

Figure 42:
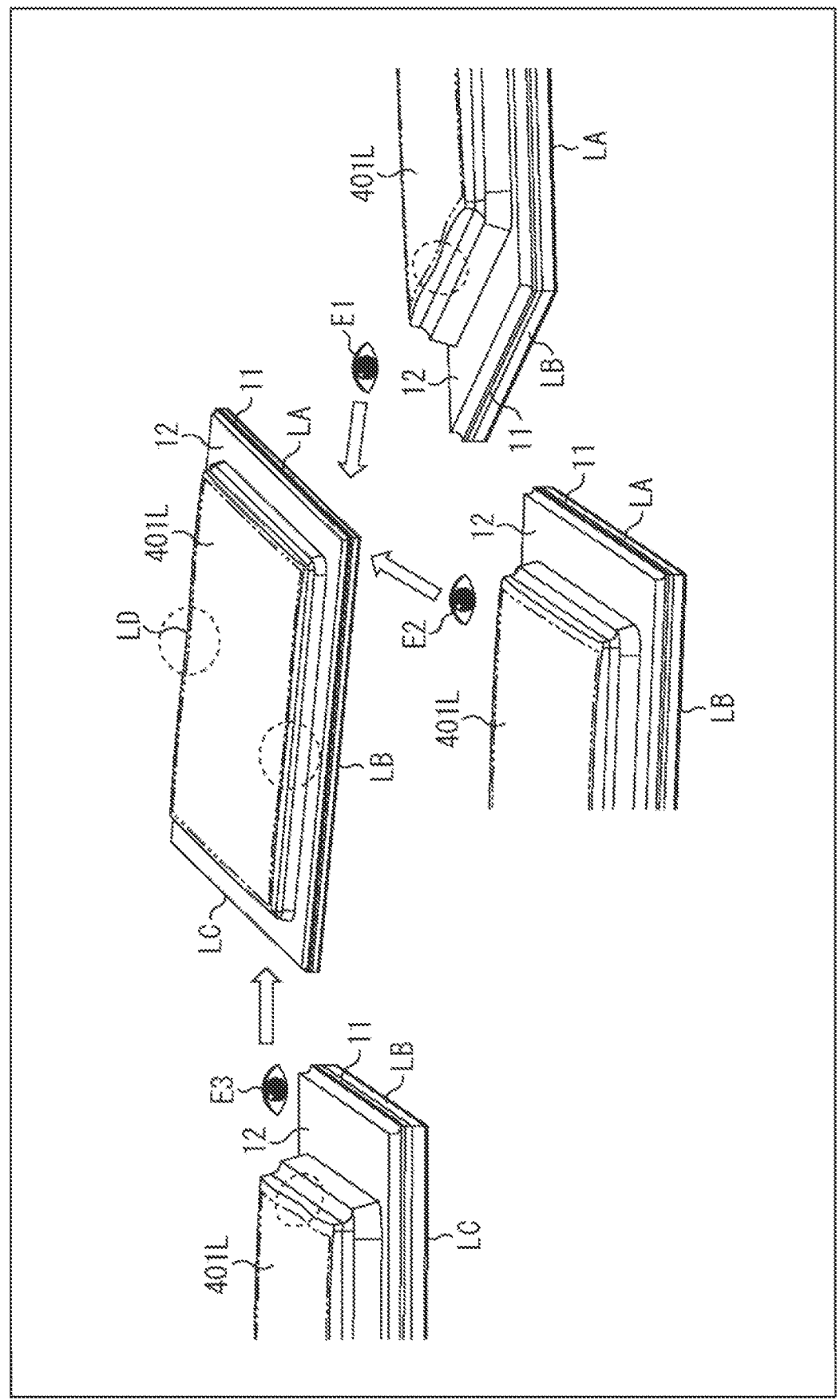
FIG. 42 is a diagram explaining a shape of a two-stage side surface lens of FIG. 41.

FIG. 42 is an external appearance perspective view as viewed in various directions when the two-stage side surface lens 401L is provided on the glass substrate 12 formed on the solid-state imaging element 11. In an upper center part of FIG. 42, sides LA, LB, LC, and LD are here defined clockwise from a right side of the solid-state imaging element 11 in this order in the figure.

In addition, a right part of FIG. 42 is a perspective view around a corner formed by the sides LA and LB of the solid-state imaging element 11 when the solid-state imaging element 11 and the lens 401L are viewed in a visual line E1 in the upper center part of FIG. 42. Moreover, a lower center part of FIG. 42 is a perspective view around the corner formed by the sides LA and LB of the solid-state imaging element 11 when the solid-state imaging element 11 and the lens 401L are viewed in a visual line E2 in the upper center part of FIG. 42. Furthermore, a lower left part of FIG. 42 is a perspective view around a corner formed by the sides LB and LC of the solid-state imaging element 11 when the solid-state imaging element 11 and the lens 401L are viewed in a visual line E3 in the center part of FIG. 42.

Specifically, according to the two-stage side surface lens 401L, each of center portions of the sides LB and LD (not depicted) corresponding to longer sides is located close to a center of gravity having a smallest lens thickness in a circle functioning as a lens as viewed from a top surface of the two-stage side surface lens 401L corresponding to a recessed lens. Accordingly, the lens becomes thin, and each of ridges has a shape of a gradual curve as surrounded by a dotted line.

On the other hand, each of center portions of the sides LA and LC corresponding to short sides is located far from the center of gravity. In this case, the lens becomes thick, and each of ridges each has a linear shape.

<Two Inflection Points and Two-Stage Side Surface>

Figure 43:
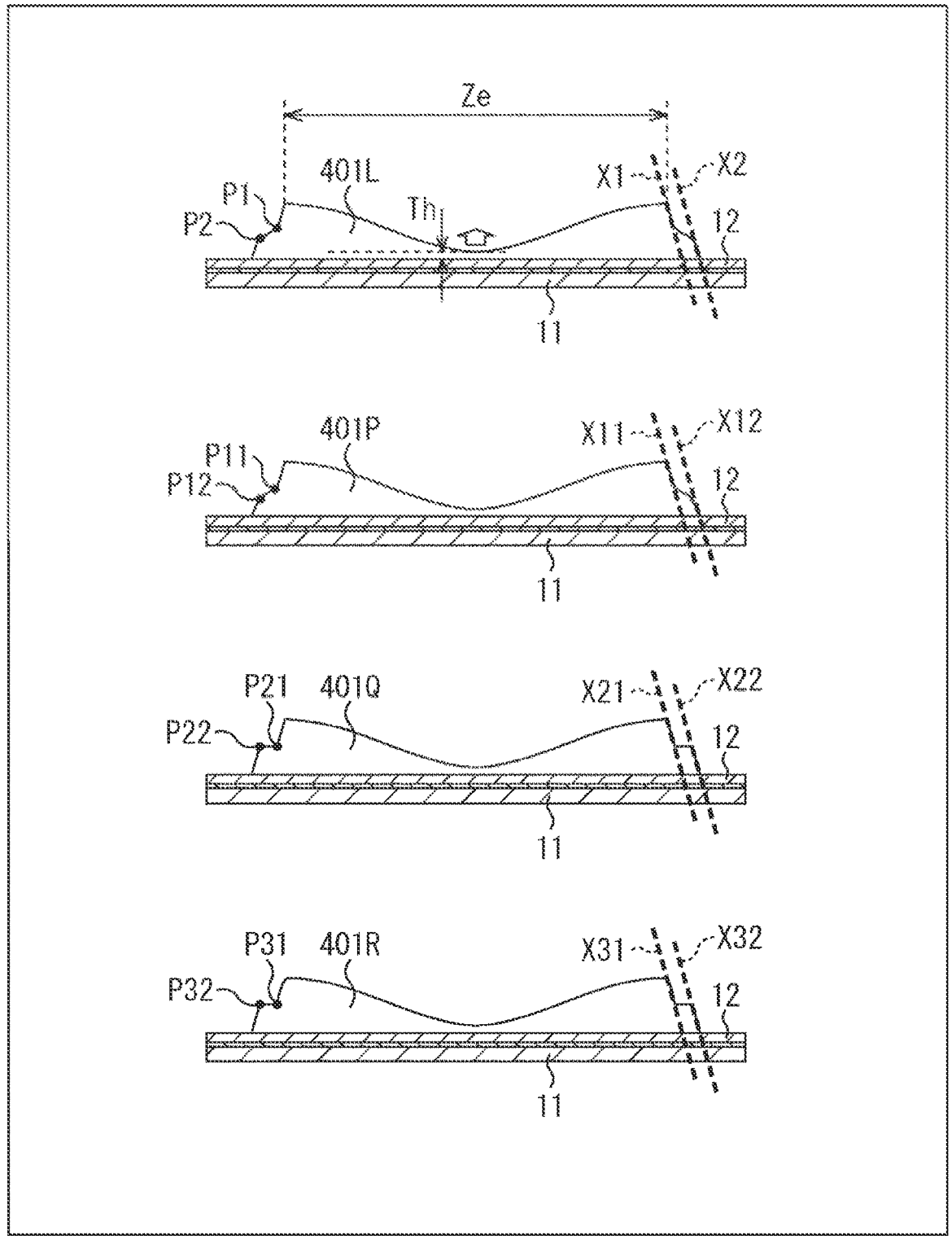
FIG. 43 is a diagram explaining modified examples of the shape of the two-stage side surface lens of FIG. 41.

In addition, as depicted in FIG. 43, according to the two-stage side surface lens 401L, a side surface in a non-effective region provided outside an effective region Ze has a two-stage configuration in a cross-sectional shape. Average surfaces X1 and X2 of the side surface deviate from each other. Inflection points P1 and P2 in the cross-sectional shape are formed at positions where a step is produced by two-stage side surface.

The inflection points P1 and P2 are points of recessed and projected changes in this order from a position near the solid-state imaging element 11.

In addition, each of the inflection points P1 and P2 from the glass substrate 12 is located at a position higher than the smallest thickness Th of the two-stage side surface lens 401L.

Further, a difference between the respective average surfaces X1 and X2 (a distance between the average surfaces X1 and X2) of the two-stage side surface is preferably larger than the thickness of the solid-state imaging element 11 (the thickness of the silicon substrate 81 of the solid-state imaging element 11 of FIG. 6).

Further, the distance difference between the average surfaces X1 and X2 of the two-stage side surface is preferably is 1% or more of a region width perpendicular to an incident direction of incident light in the effective region of the lens 401L (for example, a width He in the horizontal direction or a height Ve in the vertical direction in FIG. 23).

Accordingly, a shape other than the shape of the two-stage side surface lens 401L may be adopted as long as the two-stage side surface and the two inflection points meeting the foregoing conditions are formed. For example, as depicted in a second part from above in FIG. 43, the two-stage side surface lens may be a two-stage side surface lens 401P which includes a two-stage side surface constituted by average surfaces X11 and X12, and has inflection points P11 and P12 having curvatures different from those of the inflection points P1 and P2 and located at positions higher than the smallest thickness Th of the lens from the glass substrate 12.

Moreover, for example, as depicted in a third part from above in FIG. 43, the two-stage side surface lens may be a two-stage side surface lens 401Q which includes a two-stage side surface constituted by average surfaces X21 and X22, and has inflection points P21 and P22 having curvatures different from those of the inflection points P1 and P2 and the inflection points P11 and P22, and located at positions higher than the smallest thickness Th of the lens from the glass substrate 12.

Furthermore, for example, as depicted in a fourth part from above in FIG. 43, the two-stage side surface lens may be a two-stage side surface lens 401R which includes a two-stage side surface constituted by average surfaces X31 and X32, has inflection points P31 and P32 located at positions higher than the smallest thickness Th of the lens from the glass substrate 12, and has a round end portion located at a thickest position of the lens 401.

<Stress Distributions Generated During Heating of AR Coating in Lens Including Side Surface Having Two Inflection Points and Two-Stage Configuration>

As described above, the two-stage side surface lens 401L which has two inflection points and a side surface having a two-stage configuration can reduce stress applied to the AR coating 402 by expansion or contraction of the lens 401L during loading of implementation reflow heat or a reliability test.

Figure 44:
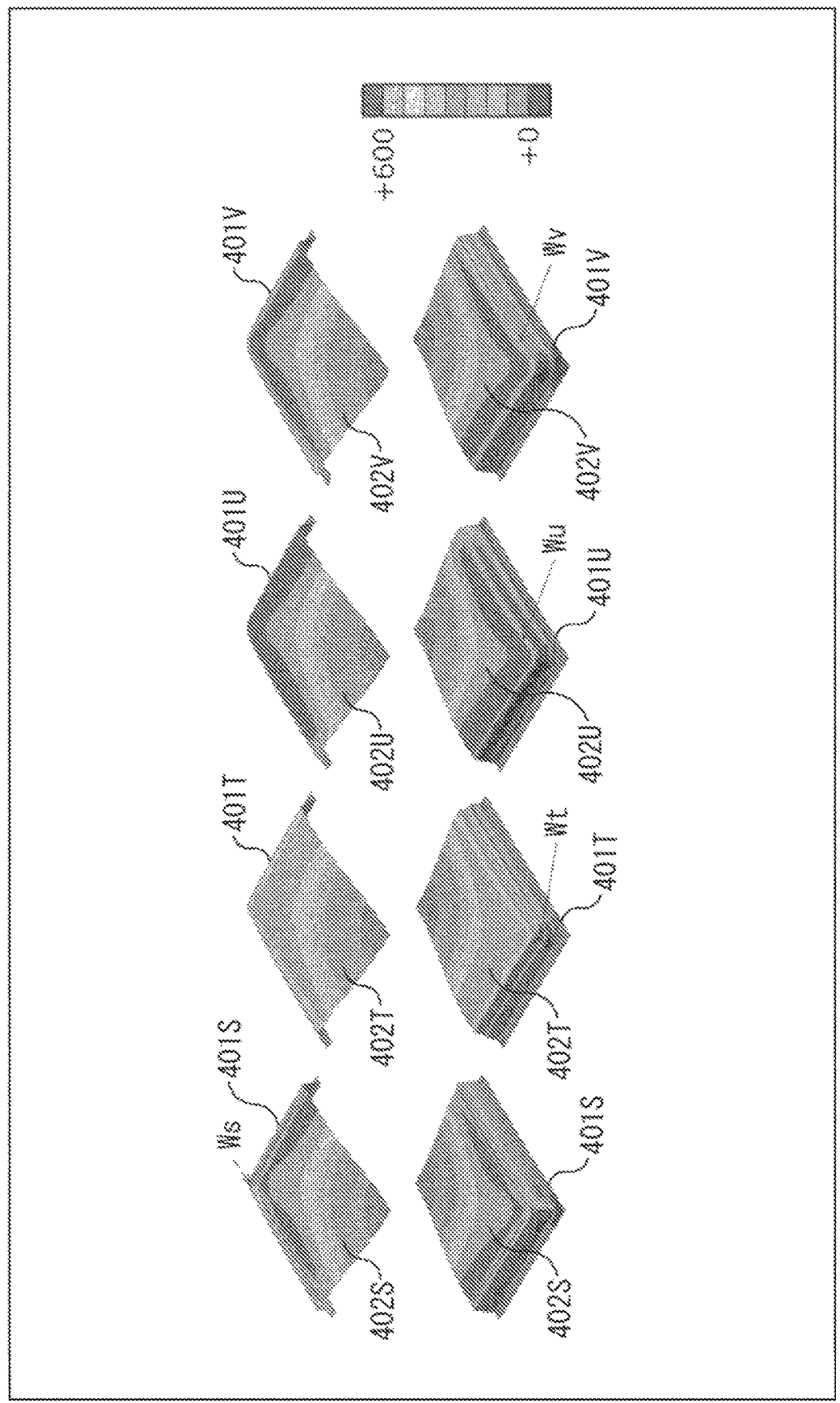
FIG. 44 is a diagram explaining stress distributions applied to an AR coating on the two-stage side surface lens of FIG. 41 during loading of implementation reflow heat.

FIG. 44 depicts stress distributions produced by expansion and contraction of the AR coating 402 during loading of implementation reflow heat according to a change of the external shape of the lens 401 of FIG. 39. In FIG. 44, an upper part depicts stress distributions of the AR coating 402 on the back side when the lens 401 is viewed in a diagonal direction. A lower part of the figure depicts stress distributions of the AR coating 402 on the front side when the lens 401 is viewed in the diagonal direction.

A leftmost part of FIG. 44 depicts a stress distribution produced in an AR coating 402S during loading of implementation reflow heat in a lens 401S (corresponding to the lens 401A) which does not have the protrusion portion 401a and is not a two-stage side surface lens.

A second part from the left in FIG. 44 depicts a stress distribution produced in AR coating 402T during loading of implementation reflow heat in a lens 401T corresponding to the two-stage side surface lens 401L depicted in FIG. 43.

A third part from the left in FIG. 44 depicts a stress distribution produced in AR coating 402U during loading of implementation reflow heat in a lens 401U which does not include the protrusion portion 401a, but has a tapered portion and round-molded corners of respective sides of the lens.

A fourth part from the left in FIG. 44 depicts a stress distribution produced in AR coating 402V during loading of implementation reflow heat in a lens 401V which does not include the protrusion portion 401a nor a tapered portion, but has a side surface perpendicular to the glass substrate 12, and round-molded corners of respective sides of the lens.

Figure 45:
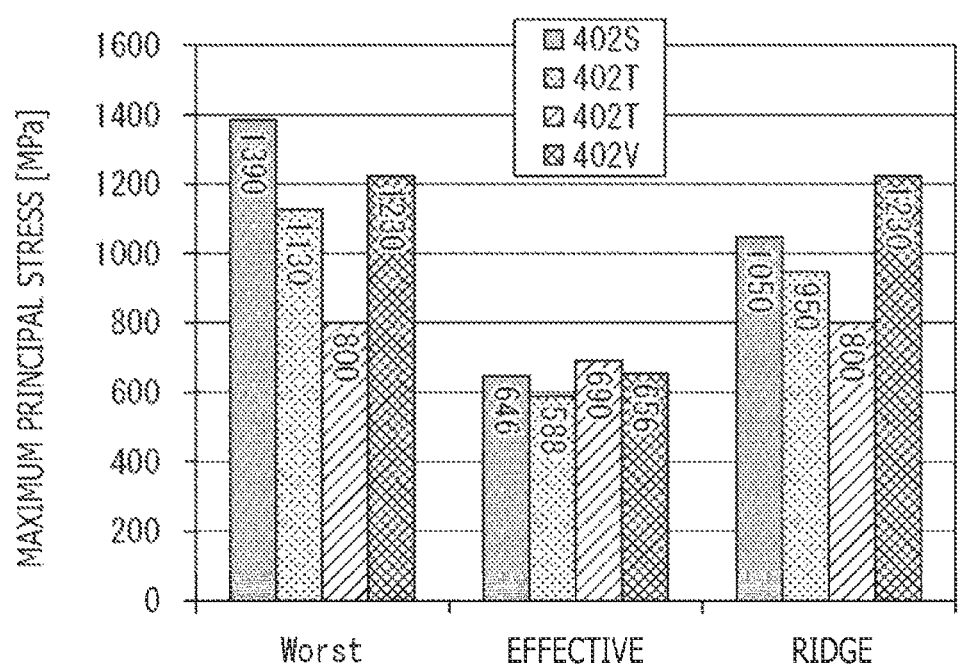
FIG. 45 is a diagram explaining maximum values of stress distributions applied to the AR coating on the lens of FIG. 44 during loading of implementation reflow heat.

In addition, FIG. 45 presents graphs of maximum values in respective areas in the stress distributions produced in the AR coating in the respective lens shapes of FIG. 44, i.e., maximum values in the whole (Worst), maximum values in the effective region of the lens (effective), and maximum values in a ridge (ridge) in this order from the left of the figure. Further, the graphs of the maximum values in each of the areas in FIG. 45 indicate maximum values in stress distributions of the AR coating 402S to 402V in this order from the left.

FIG. 45 presents the maximum stress exhibited in the whole of each of the lenses. Specifically, the maximum stress becomes 1390 MPa at a corner Ws of a top surface (FIG. 44) in the case of the AR coating 402S of the lens 401S, becomes 1130 MPa at a corner Wt in a ridge (FIG. 44) in the case of the AR coating 402T of the lens 401T, becomes 800 MPa on a ridge Wu (FIG. 44) in the case of the AR coating 402U of the lens 401U, and becomes 1230 MPa on a ridge Wv (FIG. 44) in the case of the AR coating 402V of the lens 401V.

In addition, FIG. 45 presents the maximum stress exhibited in the effective region of each of the lenses. Specifically, the maximum stress becomes 646 MPa in the case of the AR coating 402S of the lens 401S, becomes 588 MPa in the case of the AR coating 402T of the lens 401T, becomes 690 MPa in the case of the AR coating 402U of the lens 401U, and becomes 656 MPa in the case of the AR coating 402V of the lens 401V.

Moreover, in the ridge of each of the lenses, the maximum stress becomes 1050 MPa in the case of the AR coating 402S of the lens 401S, becomes 950 MPa in the case of the AR coating 402T of the lens 401T, becomes 800 MPa in the case of the AR coating 402U of the lens 401U, and becomes 1230 MPa in the case of the AR coating 402U of the lens 401V.

According to FIG. 45, the maximum stress becomes the minimum in the case of the AR coating 402S of the lens 401S in each of the areas. As apparent from FIG. 44, the stress distribution around 600 Mpa increases in a range close to the outer peripheral portion of the AR coating 402U of the lens 401U, but does not exist in the stress distribution in the whole effective region of the AR coating 402T of the lens 401T. As a whole, the stress distribution produced in the AR coating 402T of the AR coating 402T (identical to the AR coating 402L) decreases in the external shape constituted by the AR coating 402T of the lens 401T (identical to the lens 401L).

In other words, as apparent from FIGS. 44 and 45, expansion and contraction caused in the AR coating 402T (402L) is reduced in the lens 401T (401L) which has the two inflection points and the side surface having the two-stage configuration during loading of implementation reflow heat. Accordingly, stress produced by expansion or contraction decreases.

As described above, the two-stage side surface lens 401L which has the two inflection points and the side surface having the two-stage configuration is adopted as the lens 401. Accordingly, expansion or contraction caused by heat can be reduced during loading of implementation reflow heat, a reliability test, or the like.

As a result, stress applied to the AR coating 402L can be lowered. Accordingly, reduction of generation of cracks and reduction of generation of lens separation or the like are achievable. In addition, reduction of expansion or contraction of the lens itself thus achieved can reduce generation of distortion, and, therefore, reduction of image quality deterioration according to an increase in double refraction caused by distortion and reduction of a flare generated according to an increase in interface reflection caused by a local change of a refractive index are achievable.

18. Eighteenth Embodiment

According to the example described above, a lens which is miniaturized and lightweight and achieves high-resolution imaging is actualized by specifying the lens shape. However, a lens which is more miniaturized and lightweight and achieves high-resolution imaging may be actualized by increasing accuracy during formation of the lens on the solid-state imaging element 11.

Figure 46:
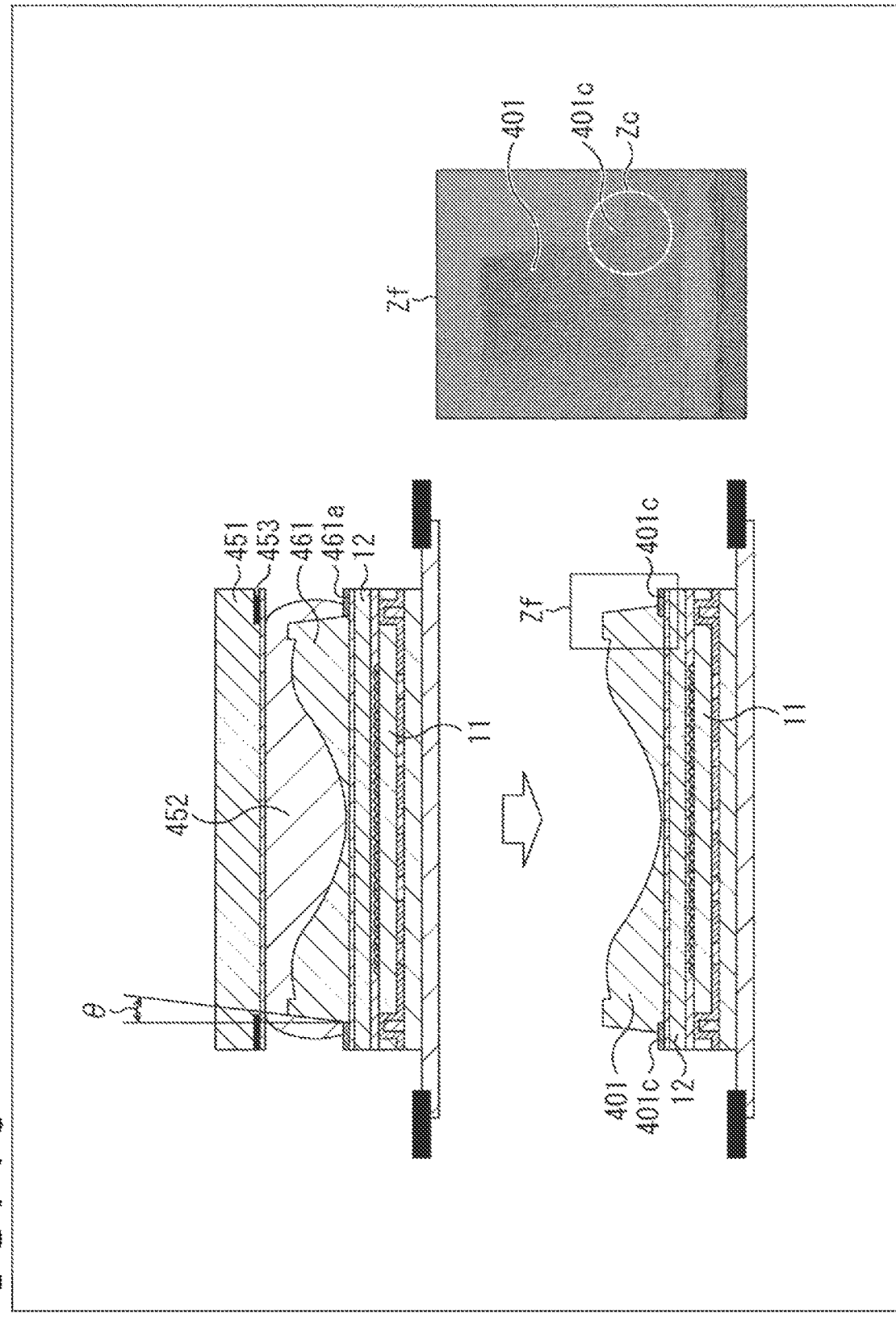
FIG. 46 is a diagram explaining a manufacturing method of an imaging device according to an eighteenth embodiment of the present disclosure.

As depicted in an upper part of FIG. 46, ultraviolet curing resin 461 as a material of the lens 401 is filled into a space formed between a mold 452 and the glass substrate 12 in a state where the mold 452 on a substrate 451 is pressed against the glass substrate 12 on the solid-state imaging element 11. Thereafter, exposure to ultraviolet light is carried out for a predetermined time from an upper part of the figure.

Each of the substrate 451 and the mold 452 is made of material transmitting ultraviolet light.

The mold 452 has an aspherical projected structure corresponding to the shape of the lens 401 of a recessed type. A light shielding film 453 is formed in an outer peripheral portion of the mold 452. For example, the mold 452 is capable of forming a taper having an angle θ in the side surface of the lens 401 as depicted in FIG. 46 according to an incident angle of ultraviolet light.

The ultraviolet curing resin 461 as a material of the lens 401 is cured by exposure to ultraviolet light for a predetermined time. The cured ultraviolet curing resin 461 is formed as an aspherical recessed lens and affixed to the glass substrate 12 as depicted in a lower part of FIG. 46.

After an elapse of the predetermined time in the state of irradiation with ultraviolet light, the ultraviolet curing resin 461 is cured and forms the lens 401. After formation of the lens 401, the mold 452 is separated from the lens 401 thus formed (mold separation).

A part of the ultraviolet curing resin 461 leaks from the mold 452 and forms a leak portion 461a at the boundary between the outer peripheral portion of the lens 401 and the glass substrate 12. However, the leak portion 461a is shielded from ultraviolet light by the light shielding film 453. Accordingly, as indicated by a range Zc in an enlarged diagram Zf, the leak portion 461a as a part of the ultraviolet curing resin 461 remains uncured, and is cured by ultraviolet light contained in natural light after mold separation. As a result, the leak portion 461a remains as a hemming bottom portion 401d.

In this manner, the lens 401 is formed into a recessed lens using the mold 452, and a taper shape having the angle θ specified by the light shielding film 453 is formed in the side surface of the lens 401. Further, the hemming bottom portion 401d is formed in the outer peripheral portion of the lens 401 at the boundary with the glass substrate 12. In this case, the lens 401 can be bonded to the glass substrate 12 with more rigidity.

As a result, a lens which is miniaturized and lightweight and achieves high-resolution imaging can be produced with high accuracy.

Figure 47:
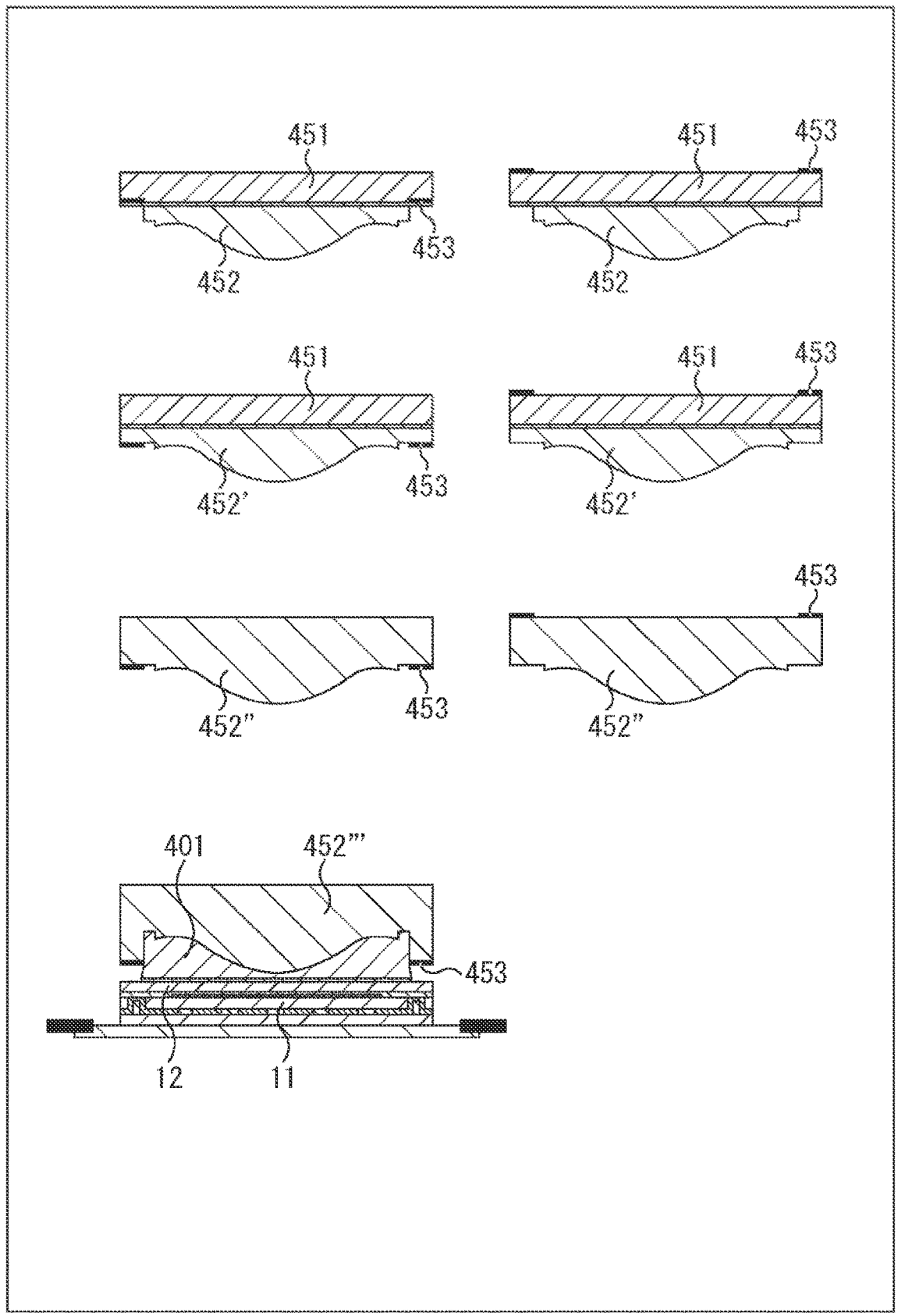
FIG. 47 is a diagram explaining modified examples of the manufacturing method of FIG. 46.

Note that the example described above is the case where the light shielding film 453 is provided on the substrate 451 in the outer peripheral portion of the lens 401 on the back side (lower side in the figure) of the substrate 451 with respect to the incident direction of the ultraviolet light as depicted in an upper left part of FIG. 47. However, the light shielding film 453 may be provided on the substrate 451 in the outer peripheral portion of the lens 401 on the front side (upper side in the figure) of the substrate 451 with respect to the incident direction of the ultraviolet light as depicted in an upper right part of FIG. 47.

Further, a mold 452' larger in the horizontal direction than the mold 452 may be formed, and the light shielding film 453 may be provided on the outer peripheral portion of the lens 401 instead of the substrate 451 on the back side (lower side in the figure) with respect to the incident direction of the ultraviolet light as depicted in a left and second part from above in FIG. 47.

Further, the light shielding film 453 may be provided on the substrate 451 on the mold 452' in the outer peripheral portion of the lens 401 on the front side (upper side in the figure) of the substrate 451 with respect to the incident direction of the ultraviolet light as depicted in a right and second part from above in FIG. 47.

Further, a mold 452" may be produced by integrating the substrate 451 and the mold 452, and the light shielding film 453 may be provided in the outer peripheral portion of the lens 401 on the back side (lower side in the figure) with respect to the incident direction of the ultraviolet light as depicted in a left and third part from above in FIG. 47.

Moreover, the mold 452" may be produced by integrating the substrate 451 and the mold 452, and the light shielding film 453 may be provided in the outer peripheral portion of the lens 401 on the front side (upper side in the figure) with respect to the incident direction of the ultraviolet light as depicted in a right and third part from above in FIG. 47.

Furthermore, a mold 452''' which has a configuration for regulating a part of the side surface portion may be formed in addition to the substrate 451 and the mold 452, and the light shielding film 453 may be formed in the outer peripheral portion of the mold 452''' and on the back side with respect to the incident direction of the ultraviolet light as depicted in a left lower part of FIG. 47.

Note that each of the configurations of FIGS. 46 and 47 is a configuration where the IRCF 14 and the adhesive 15 are eliminated from the integrated configuration unit 10 of the imaging device 1 of FIG. 9. However, this elimination is made only for convenience of explanation. Needless to say, the IRCF 14 and the adhesive 15 may be provided between the lens 401 (131) and the glass substrate 12. Furthermore, the description of the example continues hereinafter on an assumption that the IRCF 14 and the adhesive 15 are omitted from the configuration of the imaging device 1 depicted in FIG. 9. In any cases, however, the IRCF 14 and the adhesive 15 may be provided between the lens 401 (131) and the glass substrate 12, for example.

<Forming Method of Two-Stage Side Surface Lens>

A manufacturing method of the two-stage side surface lens will be subsequently described.

A basic manufacturing method is similar to the manufacturing method for a lens of not the two-stage side surface type described above.

Figure 48:
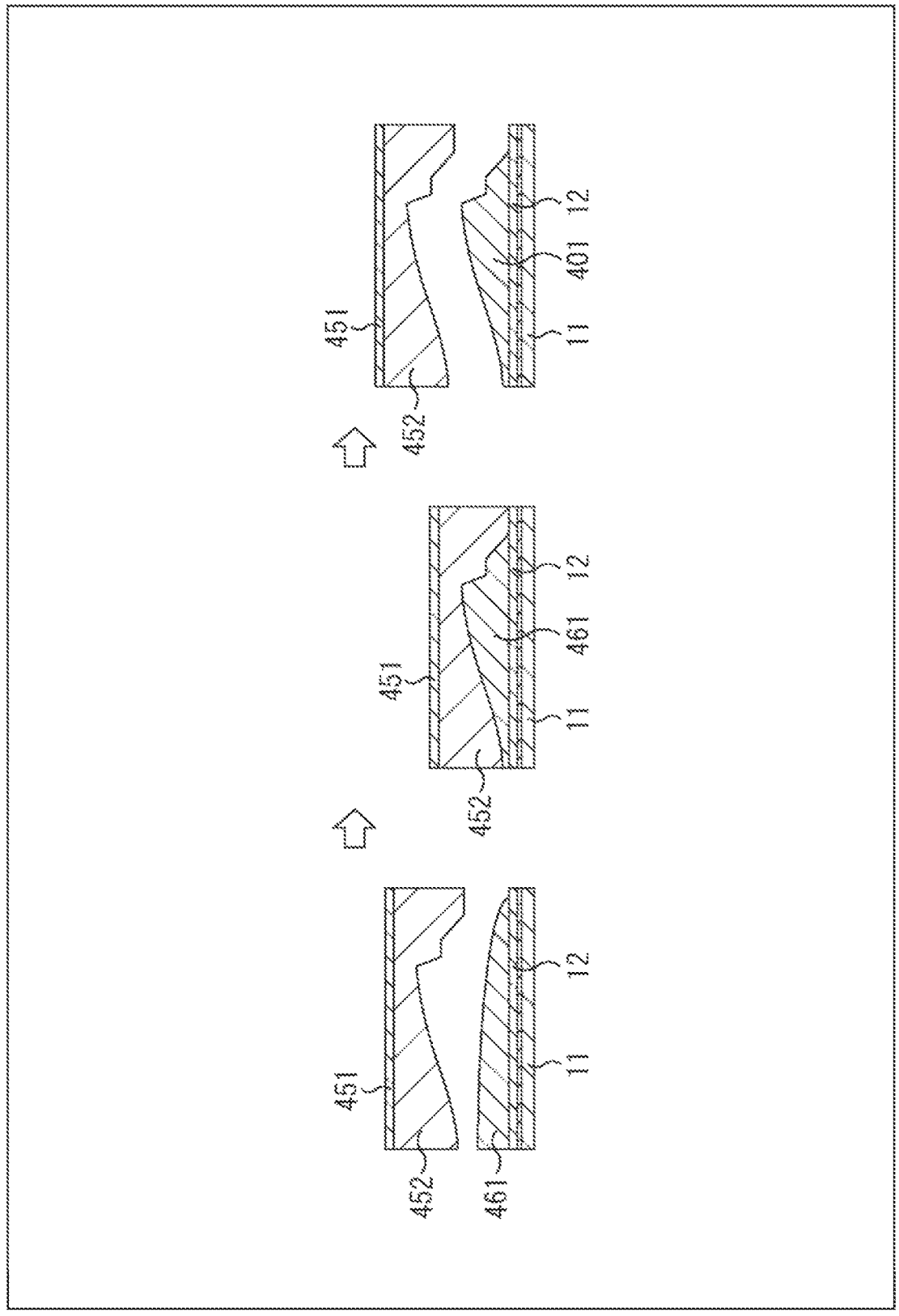
FIG. 48 is a diagram explaining a manufacturing method of the two-stage side surface lens.

Specifically, as depicted in a left part of FIG. 48, the mold 452 corresponding to the side surface shape of the two-stage side surface lens 401L is prepared for the substrate 451. The ultraviolet curing resin 461 is placed on the glass substrate 12 provided on the solid-state imaging element 11. Note that FIG. 48 depicts a configuration of only a right half of a side cross section of the mold 452.

Subsequently, as depicted in a center part of FIG. 48, the ultraviolet curing resin 461 on which the mold 452 is placed is fixed with a press against the glass substrate 12. In this state, ultraviolet light is applied from above in the figure with the ultraviolet curing resin 461 filled into a recess of the mold 452.

The ultraviolet curing resin 461 is cured by exposure to the ultraviolet light. As a result, the two-stage side surface lens 401 having a recessed shape corresponding to the mold 452 is formed.

After the lens 401 is formed by exposure to the ultraviolet light for the predetermined time, the mold 452 is separated from the mold as depicted in a right part of FIG. 48. As a result, the lens 401 constituted by the two-stage side surface lens is completed.

In addition, as depicted in a left part of FIG. 49, a part of an outer peripheral portion of the mold 452 in a portion in contact with the glass substrate 12, i.e., a portion below the height of the inflection point located close to the glass substrate 12 in the two inflection points of the cross-sectional shape of the side surface, for example, may be cut to provide the light shielding film 453 on a cut surface.

In this case, as depicted in a second part from the left in FIG. 49, the ultraviolet light is shielded in a portion below the light shielding film 453 when the ultraviolet light is applied for a predetermined time from above in the figure in a state where the ultraviolet curing resin 461 is filled into the recess of the mold 452. In this case, curing does not progress in that portion, and the lens 401 remains uncompleted. However, the ultraviolet curing resin 461 which is located around the effective region in the figure and exposed to the ultraviolet light is cured and constitutes the lens 401.

Figure 49:
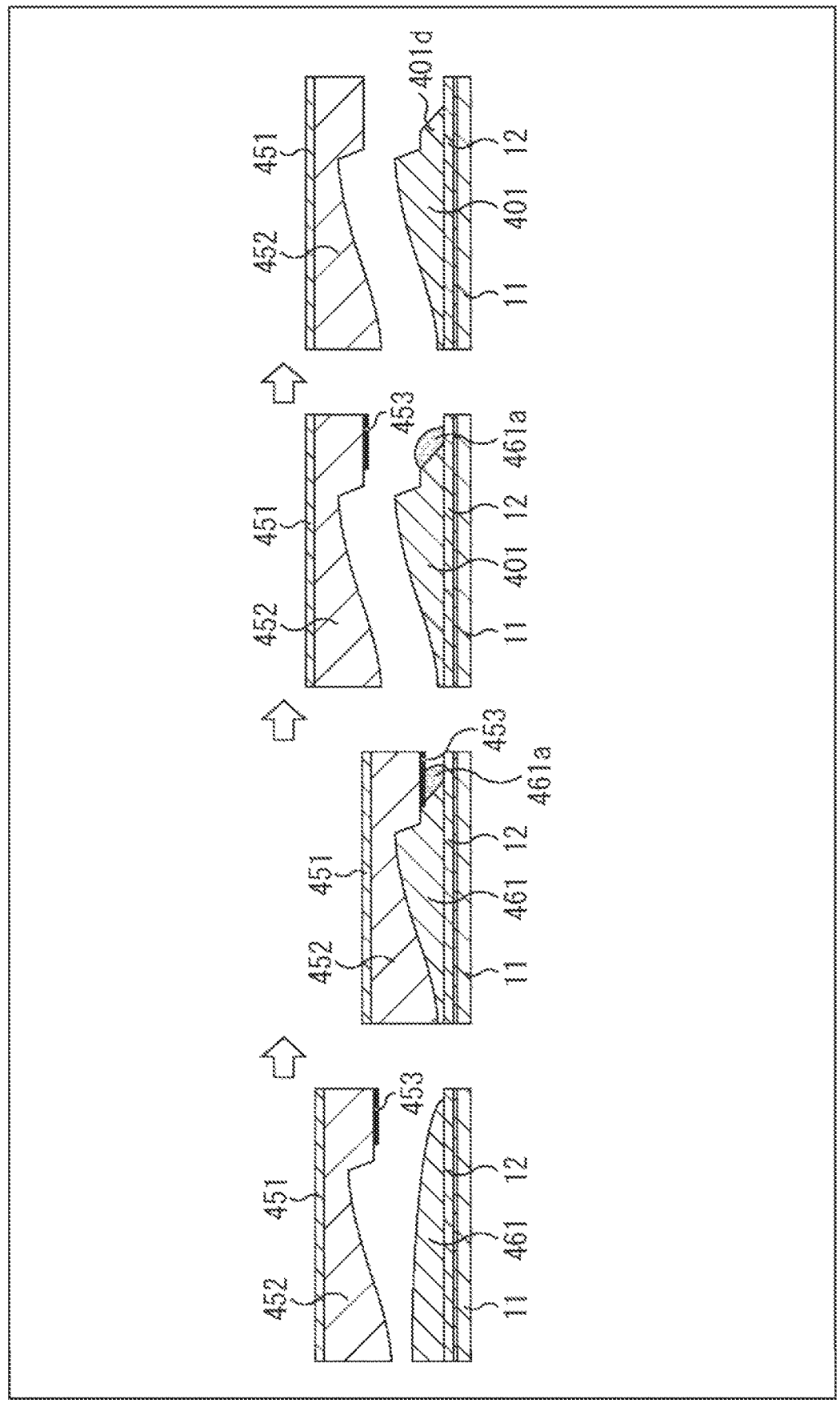
FIG. 49 is a diagram explaining a modified example of the manufacturing method of the two-stage side surface lens.

When the mold 452 is separated in this state, a side surface of the two-stage configuration in a portion close to the glass substrate 12 in an outermost periphery of the lens 401 constituted as the two-stage side surface lens is left as the leak portion 461a of the uncured ultraviolet curing resin 461 as depicted in a third part from the left in FIG. 49.

Accordingly, as depicted in a right part of FIG. 49, ultraviolet light is separately applied to the side surface still in the state of the leak portion 461a of the uncured ultraviolet curing resin 461 to cure the side surface while controlling an angle and surface roughness of the side surface.

Figure 50:
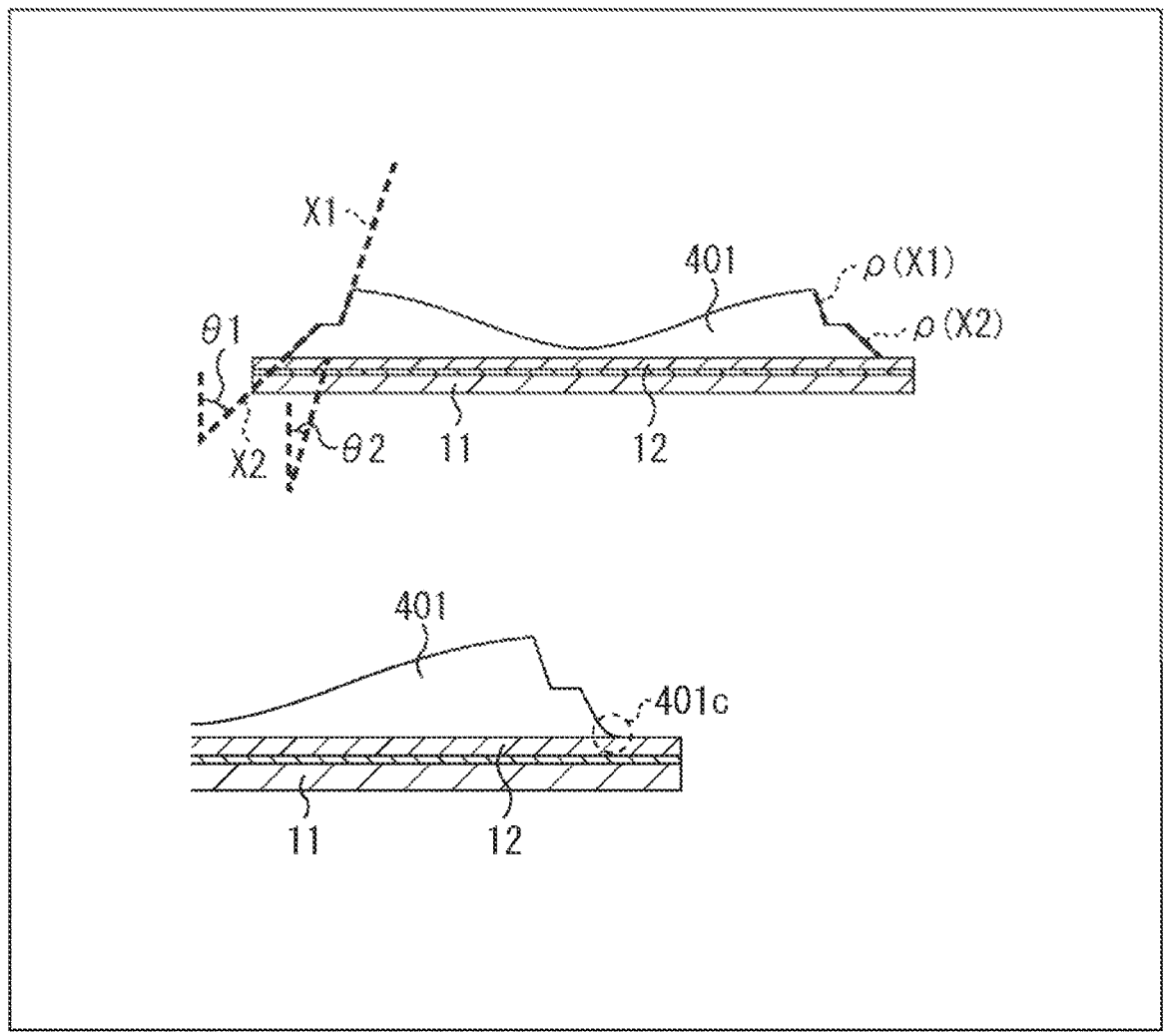
FIG. 50 is a diagram explaining adjustment of angles formed by average surfaces of a side surface, adjustment of surface roughness, and addition of a hemming bottom portion in the manufacturing method of the two-stage side surface lens of FIG. 49.

In such a manner, as depicted in an upper part of FIG. 50, angles formed by average surfaces X1 and X2 of the side surface of the lens 401 are allowed to be set to different angles, such as angles θ1 and θ2, with respect to the incident direction of the incident light.

When the angles of the side surfaces X1 and X2 here are set as angle θ1<angle θ2 on an assumption that the angles of the side surfaces X1 and X2 are angles θ1 and θ2, respectively, generation of a side surface flare and separation of the completed lens 401 from the glass substrate 12 during mold separation of the mold 452 can be reduced.

In addition, surface roughness values ρ(X1) and ρ(X2) of the side surfaces X1 and X2, respectively, are allowed to be set to different values.

When the respective surface roughness values ρ(X1) and ρ(X2) of the side surfaces X1 and X2 here are set as the surface roughness ρ(X1)<the surface roughness ρ(X2), generation of a side surface flare and separation of the completed lens 401 from the glass substrate 12 during mold separation of the mold 452 can be reduced.

Moreover, the hemming bottom portion 401d can be formed by adjusting the shape of the leak portion 461a of the ultraviolet curing resin 461 as depicted in a lower part of FIG. 50. In this manner, the lens 401 can be more rigidly fixed to the glass substrate 12.

Note that formation of the angles θ1 and θ2, the surface roughness values ρ(X1) and ρ(X2), and the hemming bottom portion 401d can be defined using the shape of the mold 452 even in a case where the light shielding film 453 described with reference to FIG. 48 is not adopted. However, in a case where the mold 452 equipped with the light shielding film 453 is used as described with reference to FIG. 49, later adjustment is allowed for the leak portion 461a of the ultraviolet curing resin 461 left as an uncured portion after initial irradiation of ultraviolet light. Accordingly, the degree of setting freedom of the angles θ1 and 02, the surface roughness values ρ(X1) and ρ(X2), and the hemming bottom portion 401d can be raised.

In either of the cases, the lens 401 can be accurately formed on the glass substrate 12 formed on the solid-state imaging element 11. Further, the angles of the side surfaces X1 and X2, the surface roughness values ρ(X1) and ρ(X2), and the presence or absence of the hemming bottom portion 401d of the two-stage side surface lens 401 are adjustable. Accordingly, generation of a flare or a ghost can be reduced, and also the lens 401 can be more rigidly formed on the glass substrate 12.

19. Nineteenth Embodiment

According to the example described above, the lens 401 is accurately formed on the glass substrate 12 formed on the solid-state imaging element 11 by using the molding method. However, an alignment mark may be formed on the glass substrate 12 to form the lens 401 at an appropriate position on the glass substrate 12. In this manner, the lens 401 may be positioned on the basis of the alignment mark to more accurately form the lens 401 on the glass substrate 12.

Figure 51:
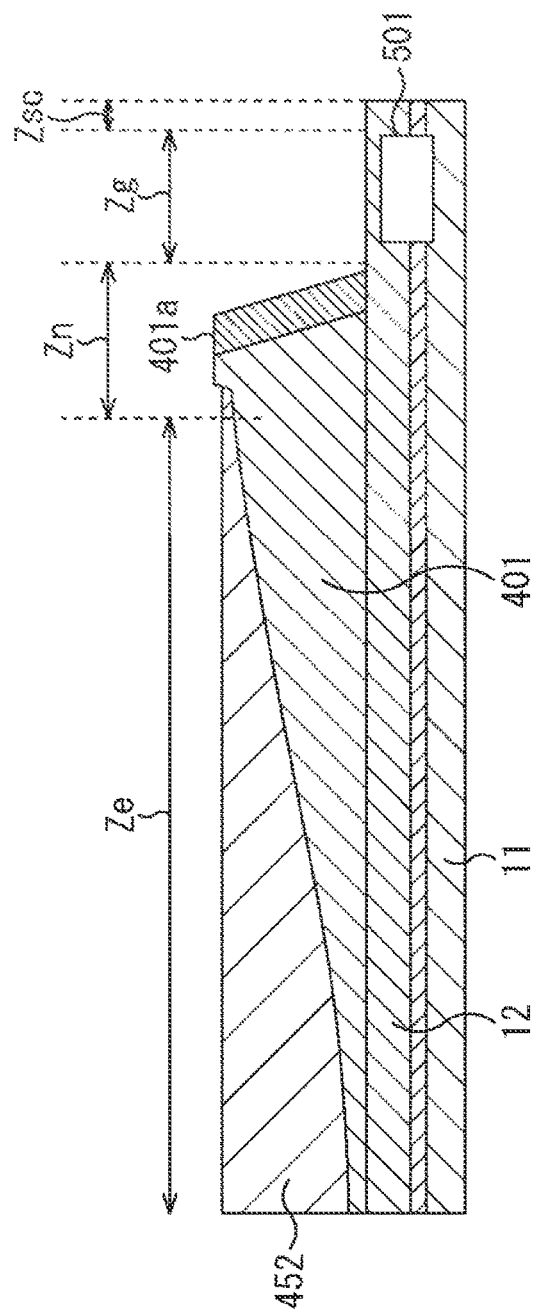
FIG. 51 is a diagram explaining a configuration example of an imaging device according to a nineteenth embodiment of the present disclosure.

Specifically, as depicted in FIG. 51, the effective region Ze of the lens 401 (corresponding to the effective region 131a of FIG. 23) is defined from the center. A non-effective region Zn (corresponding to the non-effective region 131b of FIG. 23) is provided in the outer peripheral portion of the lens 401. A region Zg to which the glass substrate 12 is exposed is provided in the further outer peripheral portion. A region Zsc where a scribe line is defined is provided in the outermost peripheral portion of the solid-state imaging element 11. In FIG. 51, a protrusion portion 401a is provided in the non-effective region Zn (corresponding to the non-effective region 131b of FIG. 23).

The respective regions have a width relation of "the width of the effective region Ze>the width of the non-effective region Zn>the width of the region Zg to which the glass substrate 12 is exposed>the width of the region Zsc where the scribe line is defined."

An alignment mark 501 is formed in the region Zg on the glass substrate 12 as a region to which the glass substrate 12 is exposed. Accordingly, the size of the alignment mark 501 is smaller than the size of the region Zg, but is required to be a size sufficient for recognizing an image of the alignment mark 501 for alignment.

For example, alignment may be achieved by forming the alignment mark 501 on the glass substrate 12 at a position to be in contact with the corner of the lens 401, and adjusting the corner of the lens in the mold 452 to a position aligned with the position where the alignment mark 501 is formed on the basis of an image captured by an alignment camera.
<Example of Alignment Mark>

Figure 52:
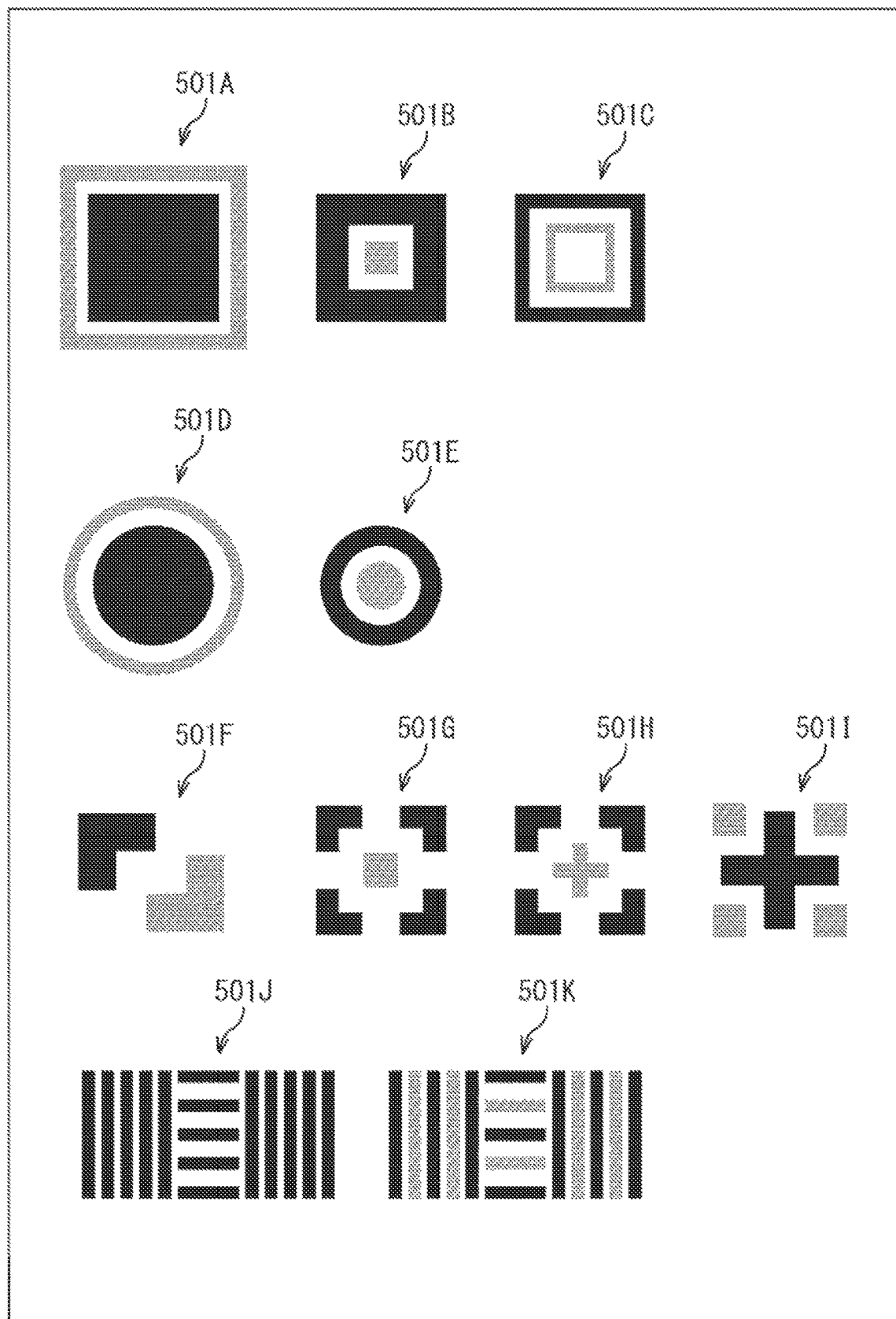
FIG. 52 is a diagram explaining examples of an alignment mark of FIG. 51.

For example, alignment marks 501A to 501K depicted in FIG. 52 may be adopted as the alignment mark 501.

Specifically, each of the alignment marks 501A to 501C has a square shape, each of the alignment marks 501D and 501E has a circular shape, each of the alignment marks 501F to 501I has a polygonal shape, and each of the alignment marks 501J and 501K is constituted by a plurality of linear shapes.
<Examples of Alignment Mark Formed on Glass Substrate and Mold>

In addition, positions of the lens 401 and the glass substrate 12 may be aligned by forming a black portion and a gray portion of each of the alignment marks 501A to 501K at positions corresponding to the outer peripheral portion of the lens 401 on the mold 452 and the region Zg on the glass substrate 12, respectively, and checking whether a positional relation of mutual correspondence has been achieved on the basis of an image captured by an alignment camera, for example.

Specifically, in a case of the alignment mark 501A, as depicted in FIG. 52, an alignment mark 501' for the gray portion constituted by a square frame is formed on the mold 452, while the alignment mark 501 constituted by a square portion as the black portion is formed. Both the alignment marks 501' and 501 are formed such that an appropriate positional relation between the lens 401 and the mold 452 holds.

Figure 53:
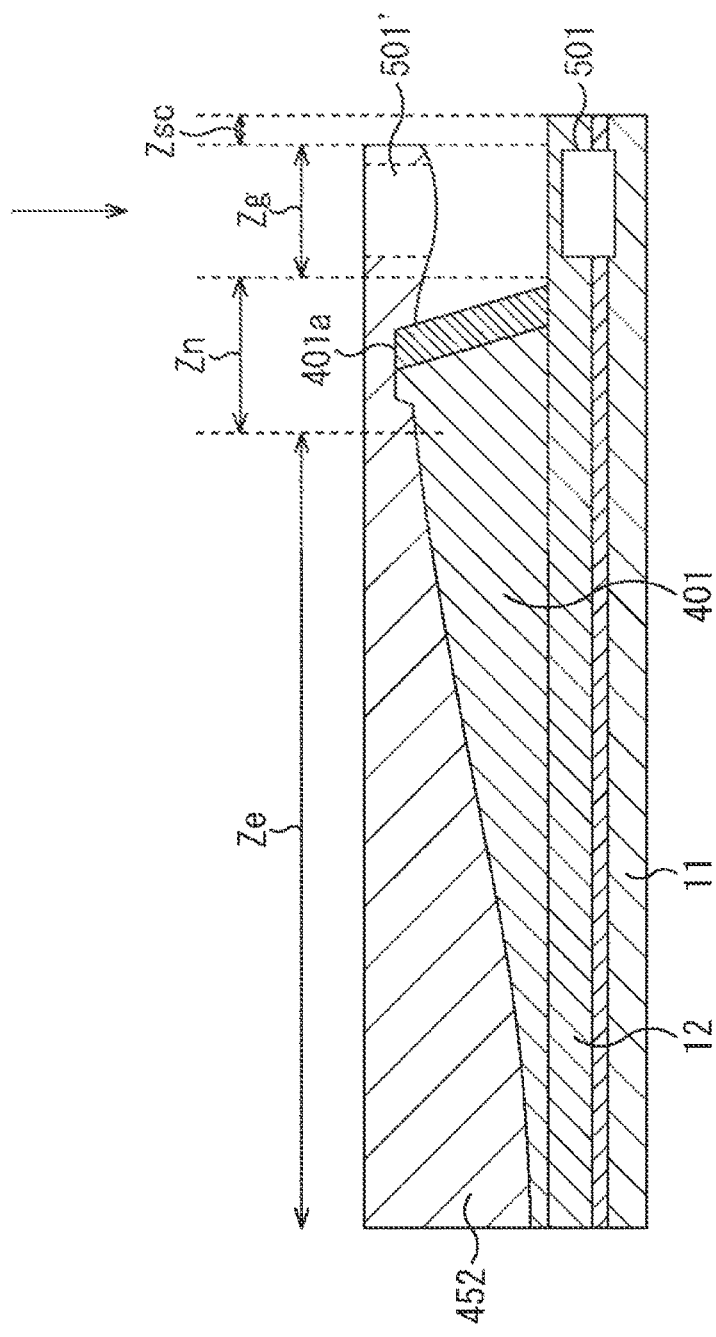
FIG. 53 is a diagram explaining an application example of the alignment mark of FIG. 51.

Thereafter, alignment may be adjusted by capturing an image of the alignment mark 501 on the glass substrate 12 and an image of the alignment mark 501' on the mold 452 in an arrow direction of FIG. 53 using the alignment camera, and adjusting the position of the mold 452 such that an image of the alignment mark 501 having a black direction shape and overlapped within the alignment mark 501' constituted by a gray square frame is captured.

In this case, it is preferable that the alignment mark 501 as the black portion and the alignment mark 501' as the gray portion are arranged within an identical visual field of an identical camera. However, alignment may be achieved by calibrating a positional relation between a plurality of cameras beforehand, and adjusting the correspondence of the positional relation between the alignment marks 501 and 501' provided at corresponding different positions using the plurality of cameras.

In either of the cases, the lens 401 can be accurately positioned and formed on the glass substrate 12 formed on the solid-state imaging element 11 by using the alignment mark 501.

20. Twentieth Embodiment

According to the example described above, the lens 401 and the glass substrate 12 on the solid-state imaging element 11 are accurately positioned and formed by using the alignment mark. However, the AR coating 402 may be formed in the effective region of the lens 401 to increase sensitivity and achieve fine imaging.

Figure 54:
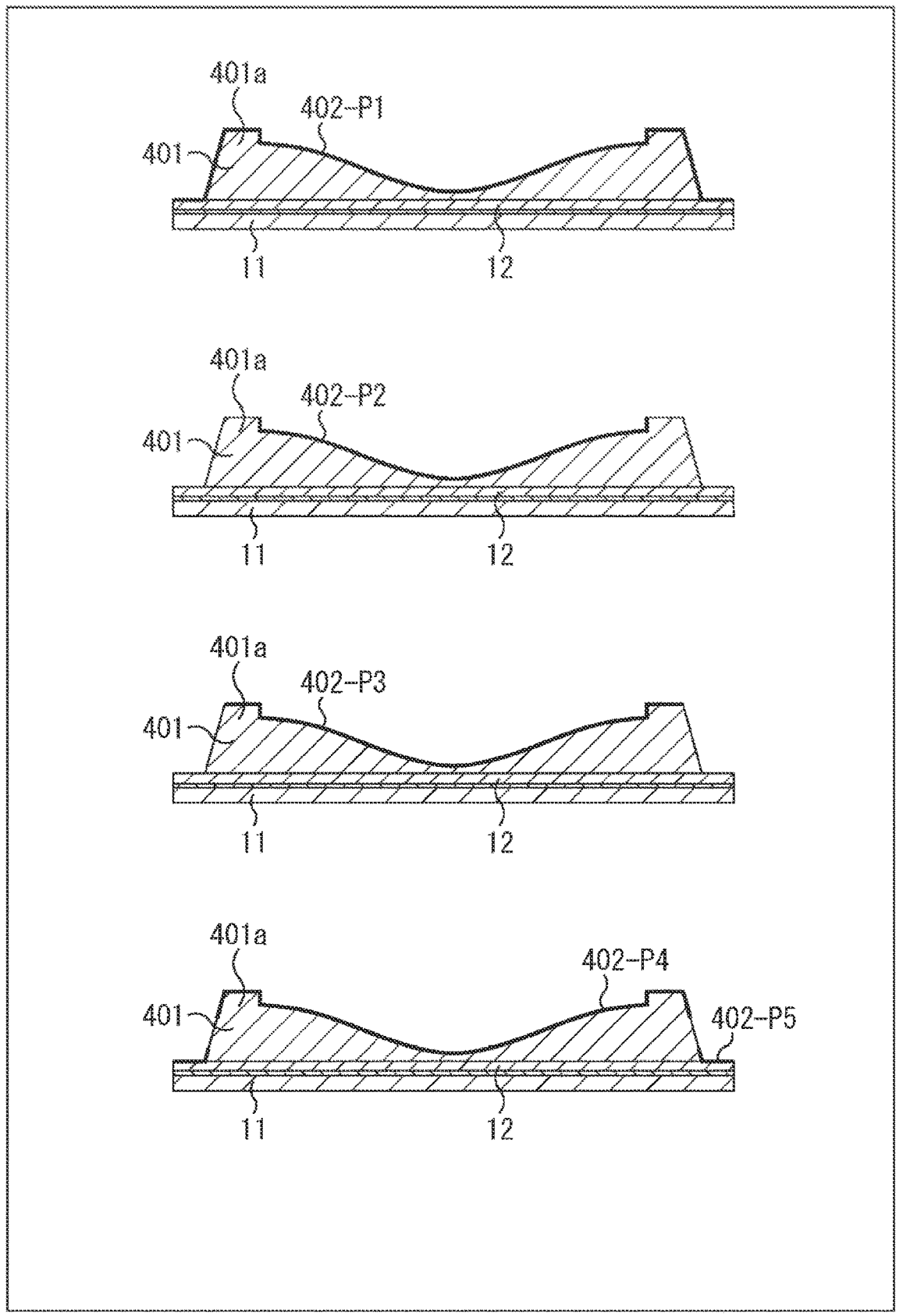
FIG. 54 is a diagram explaining a configuration example of an imaging device according to a twentieth embodiment of the present disclosure.

Specifically, for example, an AR coating 402-P1 may be formed on an entire area of the glass substrate 12, in the non-effective region containing a side surface and a flat surface portion of the protrusion portion 401a (corresponding to the non-effective region 131b of FIG. 23) and the effective region (corresponding to the effective region 131a of FIG. 23) as indicated by a thick line in an uppermost part of FIG. 54.

Moreover, for example, an AR coating 402-P2 may be formed in only the effective region within the protrusion portion 401a on the lens 401 as depicted in a second part from above in FIG. 54. By forming the AR coating 402-P2 in only the region within the protrusion portion 401a on the lens 401 (effective region (corresponding to the effective region 131a of FIG. 23)), stress produced by expansion or contraction of the lens 401 by heat during loading of implementation reflow heat or the like can be reduced, and therefore generation of cracks in the AR coating 402-P2 can be reduced.

Additionally, for example, an AR coating 402-P3 may be formed in a region which is located inside the protrusion portion 401a (effective region (corresponding to the effective region 131a of FIG. 23)) and includes the flat surface portion of the protrusion portion 401a on the lens 401 as depicted in a third part from above in FIG. 54. By forming the AR coating 402-P3 in only the region which is located inside the protrusion portion 401a and includes the protrusion portion 401a on the lens 401, stress produced for the AR coating 402-P3 by expansion or contraction of the lens 401 by heat during loading of implementation reflow heat or the like can be reduced, and therefore generation of cracks can be reduced.

Furthermore, for example, an AR coating 402-P4 may be formed in a region inside the protrusion portion 401a (effective region (corresponding to the effective region 131a of FIG. 23)) in addition to the flat surface portion of the protrusion portion 401a on the lens 401 and a part of the outer peripheral portion of the flat surface portion, and an AR coating 402-P5 may be further formed on the glass substrate 12 and in a region on the lens 401 in the vicinity of the boundary with the glass substrate 12 as depicted in a fourth part from above in FIG. 54. As that in the case of the AR coatings 402-P4 and 402-P5, a region where the AR coating is not formed is defined in a part of the side surface portion of the lens 401. In this manner, stress produced for the AR coating 402-P2 by expansion or contraction of the lens 401 by heat during loading of implementation reflow heat or the like can be reduced, and therefore generation of cracks can be reduced.

Figure 55:
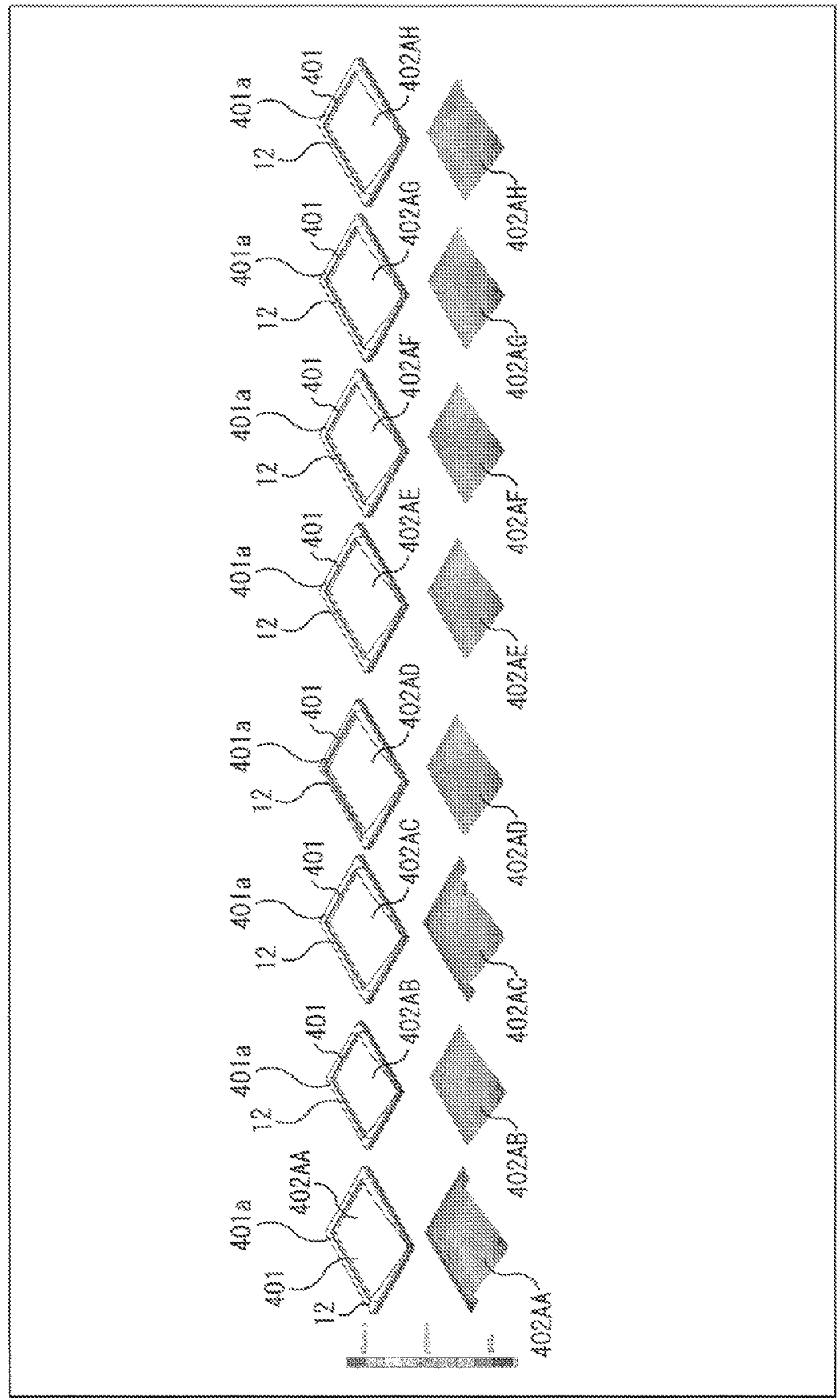
FIG. 55 is a diagram explaining stress distributions applied to an AR coating during loading of implementation reflow heat in a case where the AR coating is formed in an entire surface and in different cases.

FIG. 55 collectively presents stress distributions produced in the AR coating 402 during loading of implementation reflow heat with various changes in the region where the AR coating 402 is formed in the lens 401.

An upper part of FIG. 55 depicts external shapes of the lens 401 and the AR coating 402 when the lens 401 is divided into two parts in both the horizontal and vertical directions, while a lower part depicts distributions of stress produced in the corresponding AR coating 402 during loading of implementation reflow heat.

A left part of FIG. 55 depicts a case of formation of an AR coating 402AA where an AR coating is formed in an entire area including the glass substrate 12 in the periphery, the side surface of the lens 401, the protrusion portion 401a, and the inside of the protrusion portion 401a.

A second part from the left in FIG. 55 depicts a case of an AR coating 402AB where an AR coating is not formed in the glass substrate 12 in the periphery and the side surface of the lens 401, and is formed in other regions in the configuration of the leftmost part of FIG. 55.

A third part from the left in FIG. 55 depicts a case of an AR coating 402AC where an AR coating is not formed in the region of the side surface of the lens 401, and is formed in the glass substrate 12 in the periphery, the protrusion portion 401a, and the inside of the protrusion portion 401a in the configuration of the leftmost part of FIG. 55.

A fourth part from the left in FIG. 55 depicts a case of an AR coating 402AD where an AR coating is not formed in the region of the side surface of the lens 401, the flat surface portion of the protrusion portion 401a, and a region inside the protrusion portion 401a in a range of a predetermined width A from a flattened portion of the top surface of the protrusion portion 401a, and is formed inside the other range of the protrusion portion 401a and the glass substrate 12 in the periphery in the configuration of the leftmost part of FIG. 55. The width A here is 100 μm, for example.

A fifth part from the left in FIG. 55 depicts a case of an AR coating 402AE where an AR coating is formed in the inside of the protrusion portion 401a, the flattened portion of the top surface of the protrusion portion 401a, and a range of the predetermined width A below the flattened portion in the side surface outside the protrusion portion 401a in the configuration of the leftmost part of FIG. 55.

A sixth part from the left in FIG. 55 depicts a case of an AR coating 402AF where an AR coating is formed in the inside of the protrusion portion 401a, the flattened portion of the top surface of the protrusion portion 401a, and a range of a predetermined width 2A below the flattened portion in the side surface outside the protrusion portion 401a in the configuration of the leftmost part of FIG. 55.

A seventh part from the left in FIG. 55 depicts a case of an AR coating 402AG where an AR coating is formed in the inside of the protrusion portion 401a, the flattened portion of the top surface of the protrusion portion 401a, and a range of a predetermined width 3A below the flattened portion in the side surface outside the protrusion portion 401a in the configuration of the leftmost part of FIG. 55.

An eighth part from the left in FIG. 55 depicts a case of an AR coating 402AH where an AR coating is formed in the inside of the protrusion portion 401a, the flattened portion of the top surface of the protrusion portion 401a, and a range of a predetermined width 4A below the flattened portion in the side surface outside the protrusion portion 401a in the configuration of the leftmost part of FIG. 55.

As indicated by a comparison with the leftmost part of FIG. 55, stress produced in the AR coating 402 in any of the cases becomes smaller in the AR coating 402 formed such that the AR coating inside the protrusion portion 401a on the lens 401 is not continuously connected to the AR coating 402 on the glass substrate 12 than in the AR coating 402AA where the AR coating 402 is formed to cover the entire surface of the lens 401.

Generation of a flare or a ghost can be reduced by forming the AR coating 402 on the lens 401 in the manner described above. Accordingly, finer imaging is achievable.

Moreover, generation of cracks caused by expansion or contraction by heating during loading of implementation reflow heat, a reliability test or the like can be reduced by providing the AR coating 402 in such a manner as to leave a region where the AR coating is not formed in the effective region and at least a part other than the glass substrate 12 on the entire surface including the effective region and the non-effective region in the lens 401 including the protrusion portion 401*a* and the glass substrate 12 as the outer peripheral portion of the lens 401.

While the AR coating 402 has been described above, other films may be adopted as long as the films are formed on the surface of the lens 401. For example, an anti-reflection film such as a moth eye film may be adopted.

Furthermore, while the example of the lens including the protrusion portion 401*a* has been described above, it is sufficient if a lens not including the protrusion portion 401*a* is adopted as long as the region where the AR coating is not formed is provided in the effective region and at least a part other than the glass substrate 12 on the entire surface including the effective region and the non-effective region and the glass substrate 12 as the outer peripheral portion of the lens 401. In other words, it is sufficient if the AR coating 402 formed on the lens 401 is not formed in a state continuously connected to the AR coating 402 formed on the lens side surface and the glass substrate 12. Accordingly, the lens 401 may be the two-stage side surface lens 401L, for example. In this case, similar effects can be produced if the AR coating 402 is formed on the lens 401 in such a manner as not to be formed in a state continuously connected to the AR coating 402 formed on the lens side surface and the glass substrate 12.

21. Twenty-First Embodiment

According to the example described above, stress produced in the AR coating 402 by expansion or contraction by heat during loading of implementation reflow heat is reduced by forming the AR coating 402 on the lens 401 in such a state not continuously connected to the AR coating 402 formed on the glass substrate 12.

However, generation of a side surface flare may be reduced by forming a light shielding film in such a manner as to cover the protrusion portion 401*a* and the side surface of the lens 401.

Figure 56:
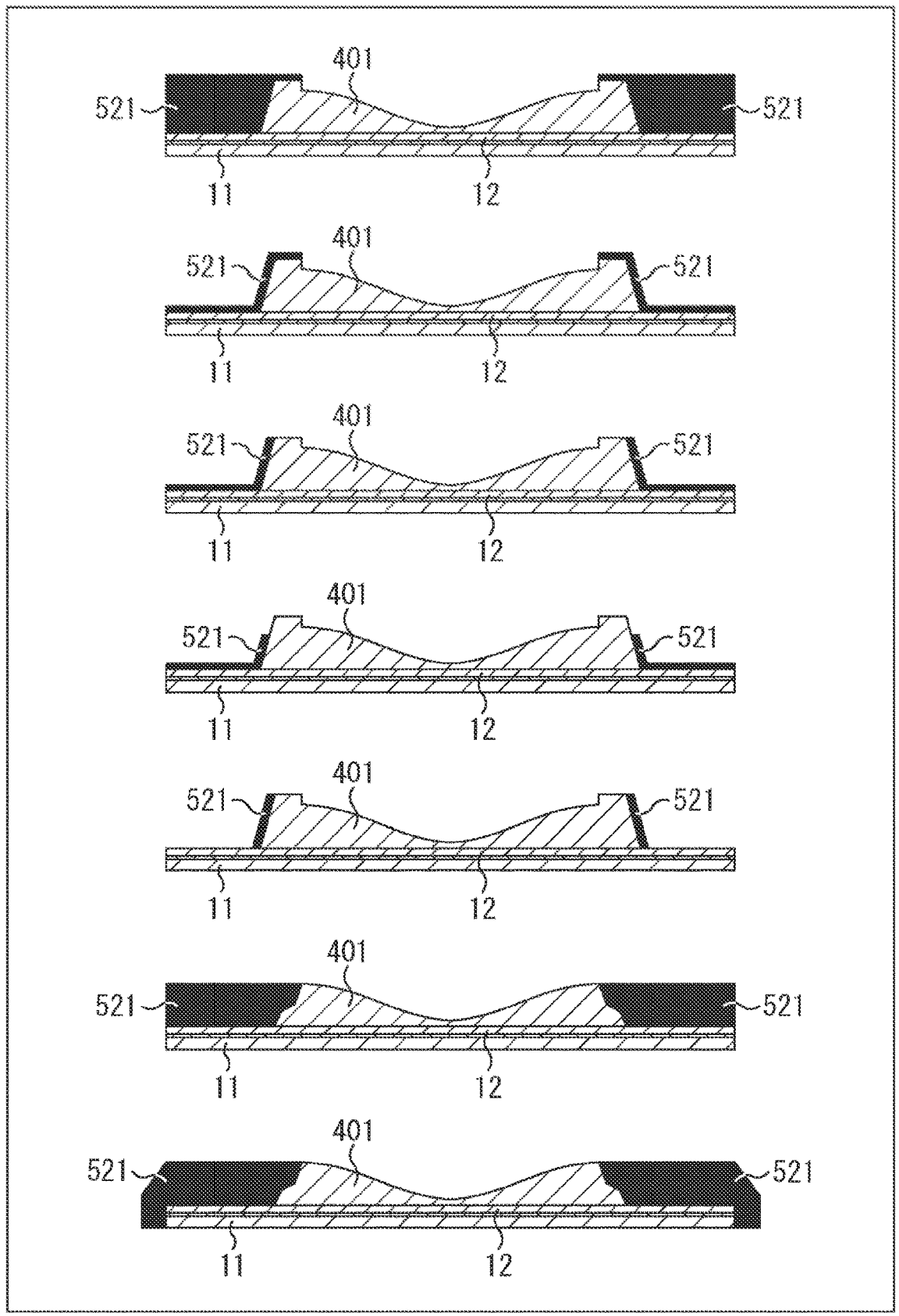
FIG. 56 is a diagram explaining a configuration example of an imaging device according to a twenty-first embodiment of the present disclosure.

Specifically, as depicted in an uppermost part of FIG. 56, a light shielding film 521 may be formed in an entire range including the side surface of the lens 401 and an area up to the height of the flat surface portion of the top surface of the protrusion portion 401*a*, i.e., a range other than the effective region on the glass substrate 12.

Further, as depicted in a second part from above in FIG. 56, the light shielding film 521 may be formed in a range of the upper part of the glass substrate 12 to the side surface of the lens 401, and an entire surface up to the flat surface portion of the top surface of the protrusion portion 401*a*, i.e., the entire area of the surface portion other than the effective region.

Further, as depicted in a third part from above in FIG. 56, the light shielding film 521 may be formed in a range of the upper part of the glass substrate 12 to the side surface of the protrusion portion 401*a* of the lens 401.

Further, as depicted in a fourth part from above in FIG. 56, the light shielding film 521 may be formed in a range of the upper part of the glass substrate 12 up to a predetermined height from the glass substrate 12 on the side surface of the protrusion portion 401*a* of the lens 401.

Further, as depicted in a fifth part from above in FIG. 56, the light shielding film 521 may be formed on only the side surface of the protrusion portion 401*a* of the lens 401.

Further, as depicted in a sixth part from above in FIG. 56, the light shielding film 521 may be formed in a range up to highest positions of the two side surfaces of the two-stage side surface lens 401 on the glass substrate 12.

Further, as depicted in a seventh part from above in FIG. 56, the light shielding film 521 may be formed in such a manner as to cover the entire surface up to the highest positions of the two side surfaces of the two-stage side surface lens 401 on the glass substrate 12 and the outer peripheral portion of the solid-state imaging element 11.

In any of these cases, the light shielding film 521 is formed by partial film forming, by lithography after film forming, by forming resist, forming a film, and then lifting off the resist, or by lithography.

Further, a bank for forming a light shielding film may be formed in the outer peripheral portion of the two-stage side surface lens 401, and then the light shielding film 521 may be formed inside the bank and in the outer peripheral portion of the two-stage side surface lens 401.

Figure 57:
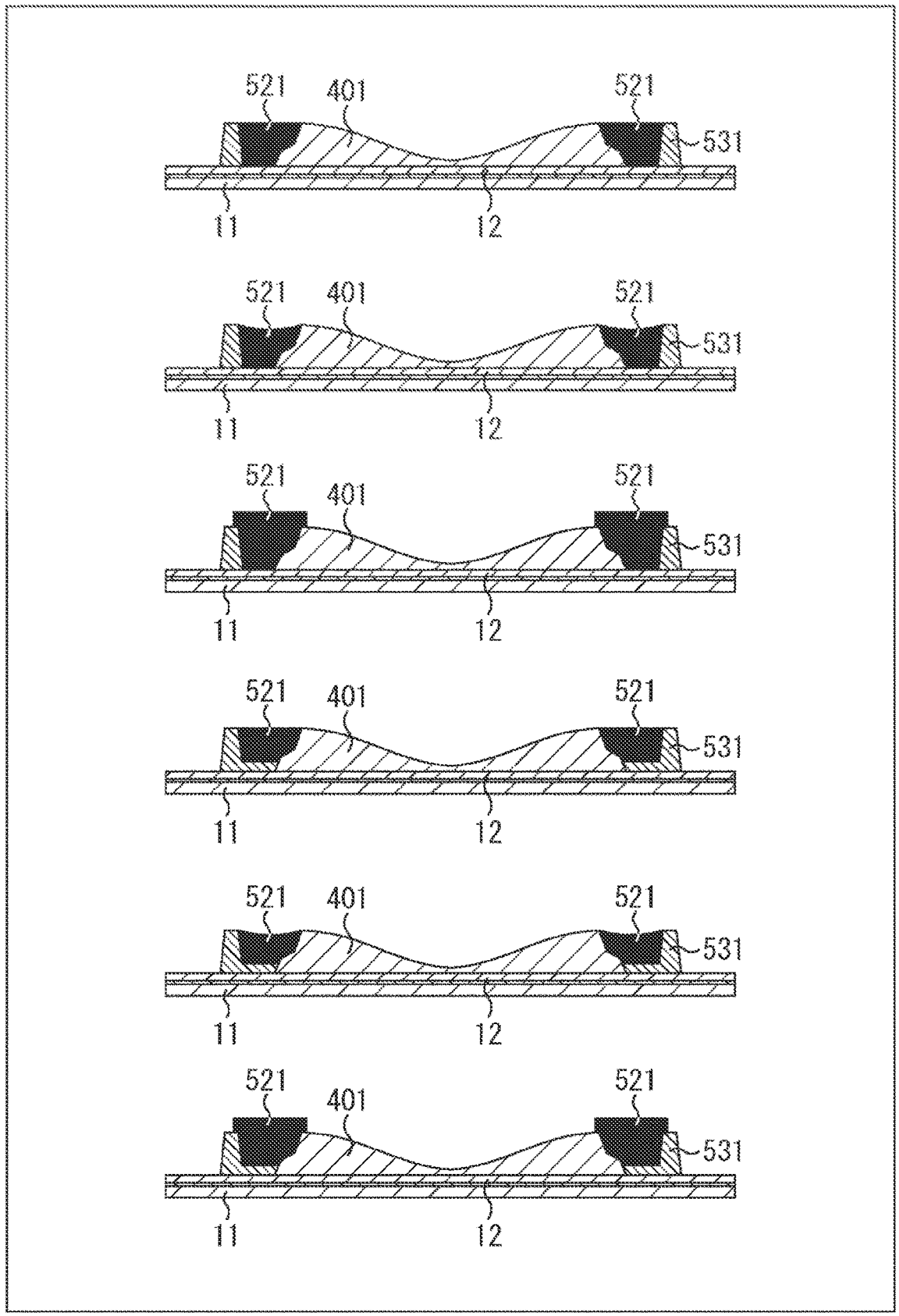
FIG. 57 is a diagram explaining examples where a light shielding film is formed on a side surface in a configuration connecting a lens and a bank.

Specifically, as depicted in an uppermost part of FIG. 57, a bank 531 at a height equivalent to a lens height may be formed on the glass substrate 12 in the outer peripheral portion of the two-stage side surface lens 401. In this case, the light shielding film 521 may be formed inside the bank 531 and in the outer peripheral portion of the two-stage side surface lens 401 by lithography or coating, and then the heights of the light shielding film 521, the lens 401, and the bank 531 may be equalized by polishing such as CMP (Chemical Mechanical Polishing).

Further, as depicted in a second part of FIG. 57, the bank 531 at a height equivalent to a lens height may be formed on the glass substrate 12 in the outer peripheral portion of the two-stage side surface lens 401. In this case, a material of the light shielding film 521 may be only applied to the inside of the bank 531 and in the outer peripheral portion of the two-stage side surface lens 401, and the heights of the light shielding film 521, the lens 401, and the bank 531 may be self-aligned based on the material of the light shielding film 521.

Further, as depicted in a third part of FIG. 57, the bank 531 at a height equivalent to a lens height may be formed on the glass substrate 12 in the outer peripheral portion of the two-stage side surface lens 401. In this case, the light shielding film 521 may be only formed inside the bank 531 and in the outer peripheral portion of the two-stage side surface lens 401 by lithography.

Further, as depicted in a fourth part of FIG. 57, the bank 531 may be formed on the glass substrate 12 in the outer peripheral portion of the two-stage side surface lens 401 in such a manner as to connect the boundary between the two-stage side surface lens 401 and the glass substrate 12. In this case, the light shielding film 521 may be formed inside the bank 531 and in the outer peripheral portion of the two-stage side surface lens 401 by lithography or coating, and then the heights of the light shielding film 521, the lens 401, and the bank 531 may be equalized by polishing such as CMP (Chemical Mechanical Polishing).

Moreover, as depicted in a fifth part of FIG. 57, the bank 531 may be formed on the glass substrate 12 in the outer peripheral portion of the two-stage side surface lens 401 in such a manner as to connect the boundary between the two-stage side surface lens 401 and the glass substrate 12. In this case, the material of the light shielding film 521 may be only applied to the inside of the bank 531 and in the outer peripheral portion of the two-stage side surface lens 401, and the heights of the light shielding film 521, the lens 401, and the bank 531 may be self-aligned based on the material of the light shielding film 521.

Furthermore, as depicted in a sixth part of FIG. 57, the bank 531 may be formed on the glass substrate 12 in the outer peripheral portion of the two-stage side surface lens 401 in such a manner as to connect the boundary between the two-stage side surface lens 401 and the glass substrate 12. In this case, the light shielding film 521 may be only formed inside the bank 531 and in the outer peripheral portion of the two-stage side surface lens 401 by lithography.

In any of these cases, the light shielding film is formed in such a manner as to cover the protrusion portion 401a and the side surface of the lens 401. Accordingly, generation of a side surface flare can be reduced.

According to the example described above, the light shielding film is formed in the outer peripheral portion of the lens 401. However, it is sufficient if any configuration is adopted as long as light entrance from the outer peripheral portion of the lens 401 is prevented. Accordingly, a light absorbing film may be formed instead of the light shielding film, for example.

22. Example of Application to Electronic Apparatus

The imaging device 1 depicted in FIGS. 1, 4, and 6 to 17 described above is applicable to various types of electronic apparatuses including, for example, an imaging device such as a digital still camera and a digital video camera, a cellular phone having an imaging function, and other apparatuses having an imaging function.

Figure 58:
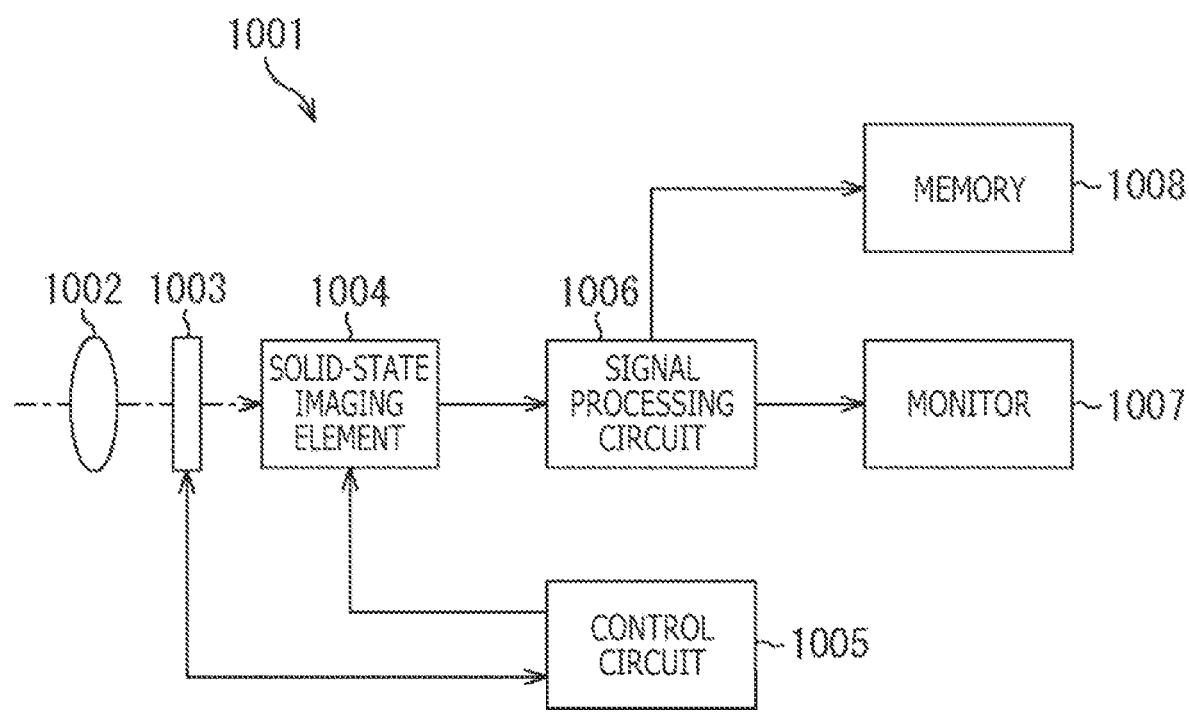
FIG. 58 is a block diagram depicting a configuration example of an imaging device as an electronic apparatus to which a camera module of the present disclosure is applied.

FIG. 58 is a block diagram depicting a configuration example of an imaging device as an electronic apparatus to which the present technology is applied.

An imaging device 1001 depicted in FIG. 58 includes an optical system 1002, a shutter device 1003, a solid-state imaging element 1004, a driving circuit 1005, a signal processing circuit 1006, a monitor 1007, and a memory 1008, and is capable of capturing a still image and a moving image.

The optical system 1002 including one or a plurality of lenses guides light (incident light) received from an object toward the solid-state imaging element 1004 and captures an image of the object on a light receiving surface of the solid-state imaging element 1004.

The shutter device 1003 is disposed between the optical system 1002 and the solid-state imaging element 1004, and controls light irradiation period and a light shieling period for the solid-state imaging element 1004 under control by the driving circuit 1005.

The solid-state imaging element 1004 is constituted by a package including the solid-state imaging element described above. The solid-state imaging element 1004 accumulates signal charges for a fixed period according to light imaged on the light receiving surface via the optical system 1002 and the shutter device 1003. The signal charges accumulated in the solid-state imaging element 1004 are transferred according to a driving signal (timing signal) supplied from the driving circuit 1005.

The driving circuit 1005 outputs a driving signal for controlling a transfer operation of the solid-state imaging element 1004 and a shutter operation of the shutter device 1003 to drive the solid-state imaging element 1004 and the shutter device 1003.

The signal processing circuit 1006 performs various signal processes for the signal charges output from the solid-state imaging element 1004. An image (image data) obtained by the signal processing performed by the signal processing circuit 1006 is supplied to and displayed on the monitor 1007, or supplied to and stored (recorded) in the memory 1008.

The imaging device 1001 configured as above is also capable of reducing a ghost or a flare caused by internal diffused reflection while achieving miniaturization and height reduction of the device configuration by adopting the imaging device 1 depicted in any one of FIGS. 1, 9, and 11 to 22 in place of the optical system 1002 and the solid-state imaging element 1004 described above.

23. Use Examples of Solid-State Imaging Device

Figure 59:
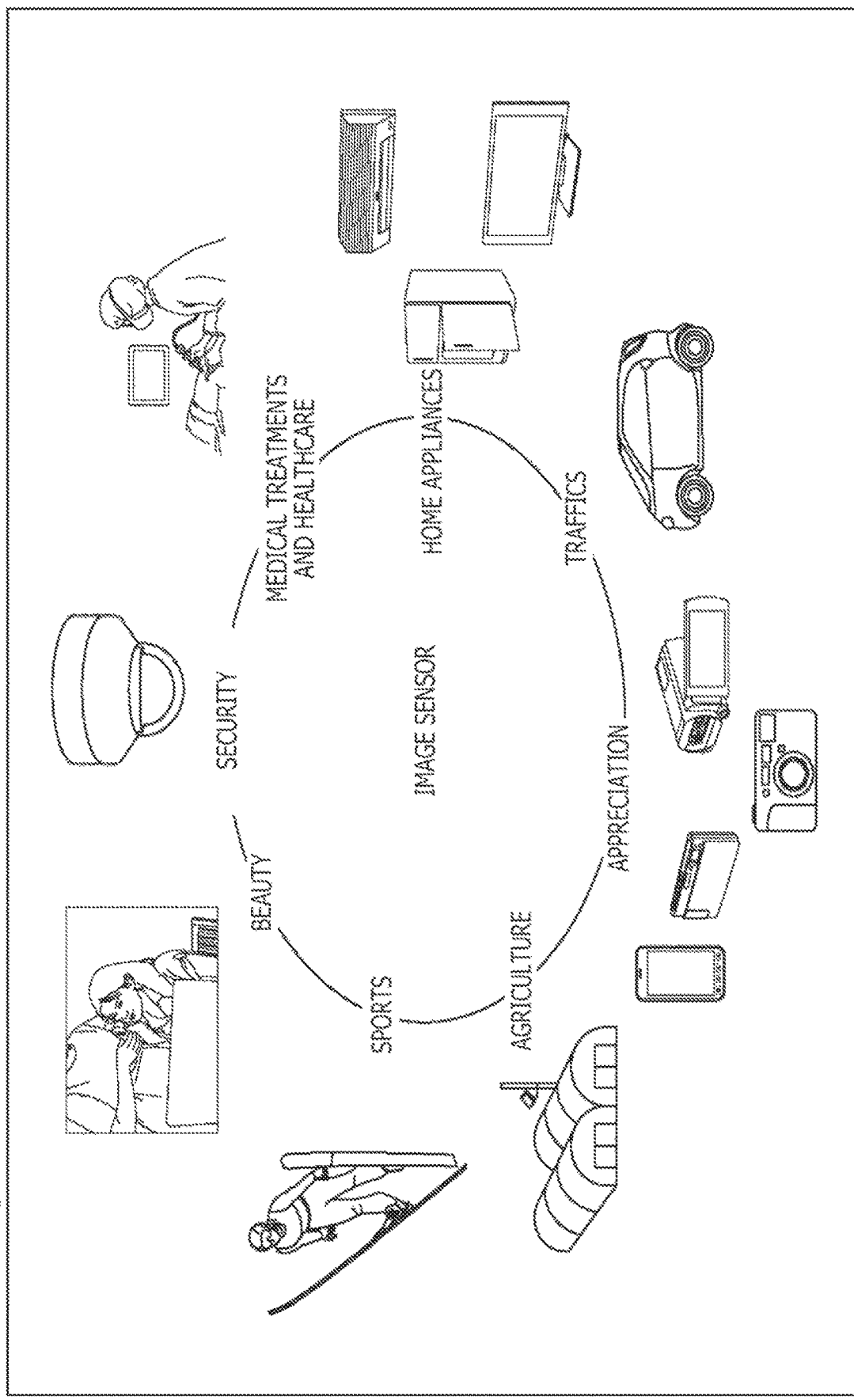
FIG. 59 is a diagram explaining use examples of the camera module to which the technology of the present disclosure is applied.

FIG. 59 is a diagram depicting use examples of the imaging device 1 described above.

The imaging device 1 described above is available in various cases where light such as visible light, infrared light, ultraviolet light, and X-ray is sensed as described below, for example.

- a device for capturing images used for appreciation, such as a digital camera and a portable device having a camera function
- a device for traffics, such as an in-vehicle sensor for imaging front and rear, surroundings, interior, and others of an automobile for safe driving such as automatic stopping, recognizing a state of a driver, or for other purposes, a monitoring camera for monitoring traveling vehicles and roads, and a distance measurement sensor for measuring a distance between vehicles
- a device for home appliances, such as TV, a refrigerator, and an air conditioner, for imaging a gesture of a user and performing a device operation according to the gesture
- a device for medical treatments and healthcare, such as an endoscope, and a device for imaging blood vessels by receiving infrared light
- a device for security, such as a monitoring camera for crime prevention and a camera for personal authentication
- a device for beauty, such as a skin measurement device for imaging skin and a microscope for imaging scalp
- a device for sports, such as an action camera and a wearable camera for sport applications
- a device for agriculture, such as a camera for monitoring a state of a field and crops

24. Example of Application to Endoscopic Surgery System

The technology according to the present disclosure (present technology) is applicable to various products. For example, the technology according to the present disclosure may be applied to an endoscopic surgery system.

Figure 60:
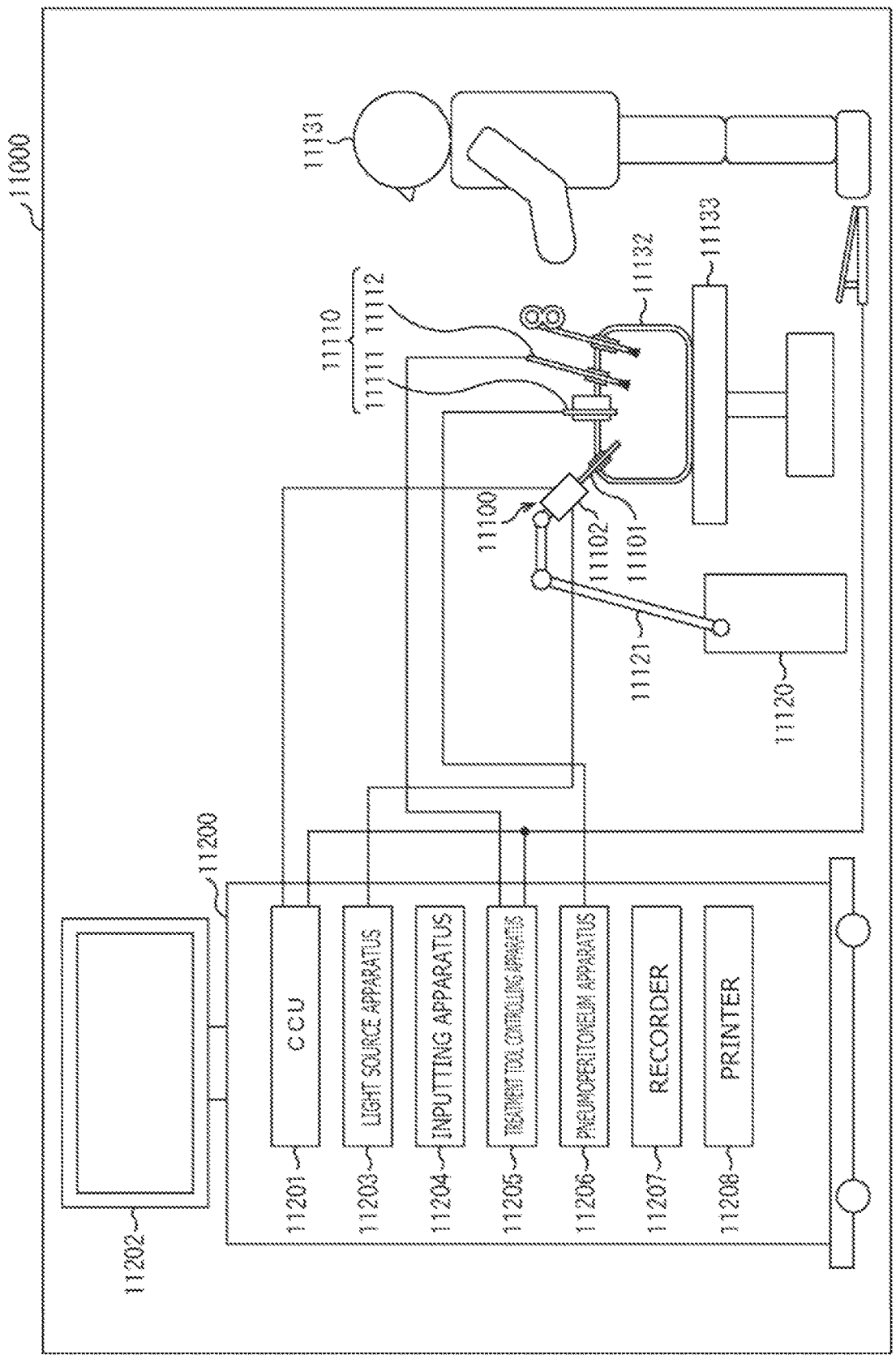
FIG. 60 is a view depicting an example of a schematic configuration of an endoscopic surgery system.

FIG. 60 is a view depicting an example of a schematic configuration of an endoscopic surgery system to which the technology according to an embodiment of the present disclosure (present technology) can be applied.

In FIG. 60, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 61:
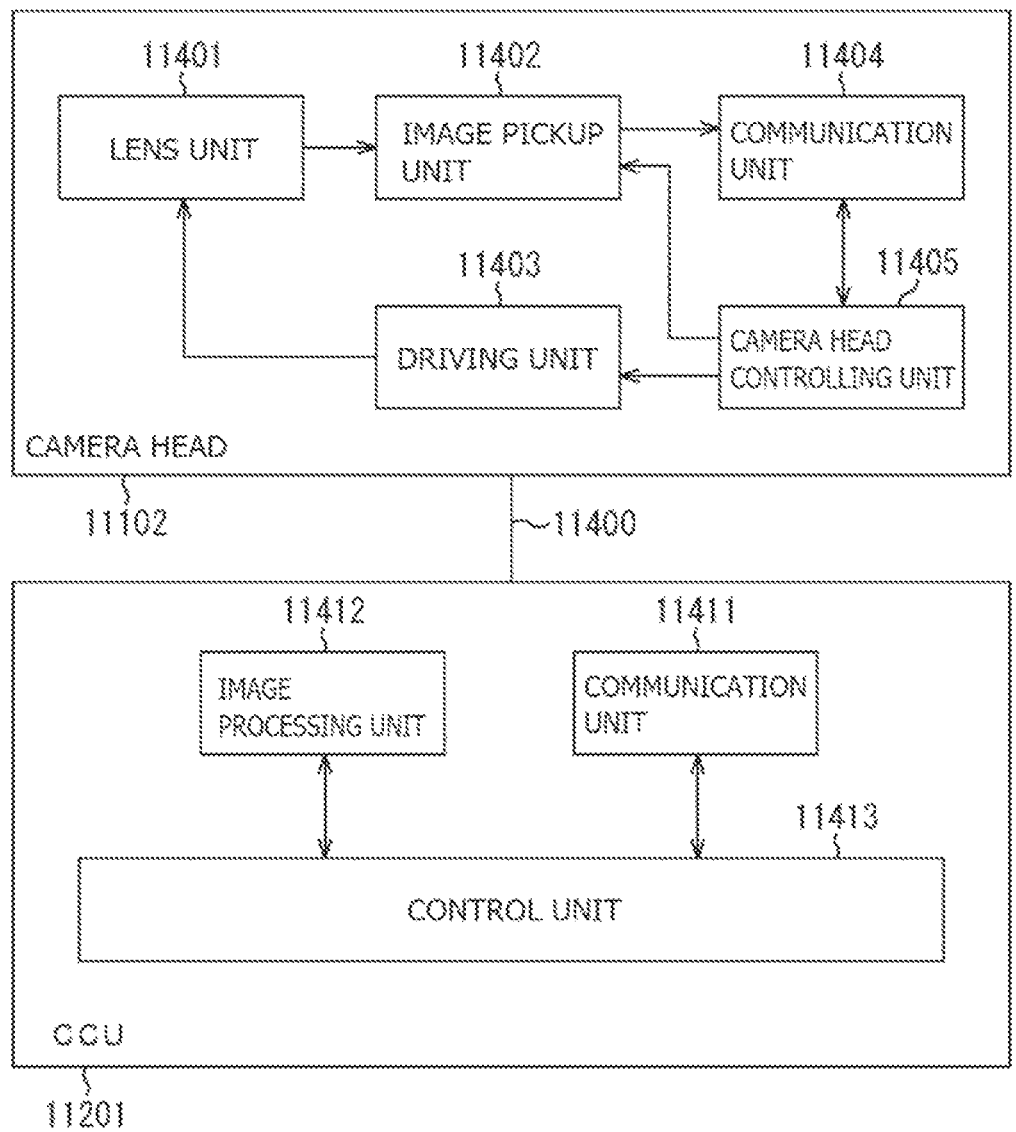
FIG. 61 is a block diagram depicting an example of a functional configuration of a camera head and a camera control unit (CCU).

FIG. 61 is a block diagram depicting an example of a functional configuration of the camera head 11102 and the CCU 11201 depicted in FIG. 60.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applicable has been described above. The technology according to the present disclosure is applicable to the endoscope 11100, (the image pickup unit 11402) of the camera head 11102, (the image processing unit 11412) of the CCU 11201, and others. Specifically, for example, the imaging device 1 of FIGS. 1, 9, and 11 to 22 is applicable to the lens unit 11401 and the image pickup unit 10402. Miniaturization and height reduction of the device configuration, and also reduction of generation of a flare and a ghost caused by internal diffused reflection are achievable by applying the technology according to the present disclosure to the lens unit 11401 and the image pickup unit 10402.

Note that, while the endoscopic surgery system has been described here by way of example, the technology according to the present disclosure may be applied to others, such as a microscopic surgery system.

25. Example of Application to Mobile Body

The technology according to the present disclosure (present technology) is applicable to various products. For example, the technology according to the present disclosure may be actuated as a device mounted on any type of mobile body, such as a car, an electric car, a hybrid electric car, a motorcycle, a bicycle, a personal mobility, an airplane, a drone, a vessel, and a robot.

Figure 62:
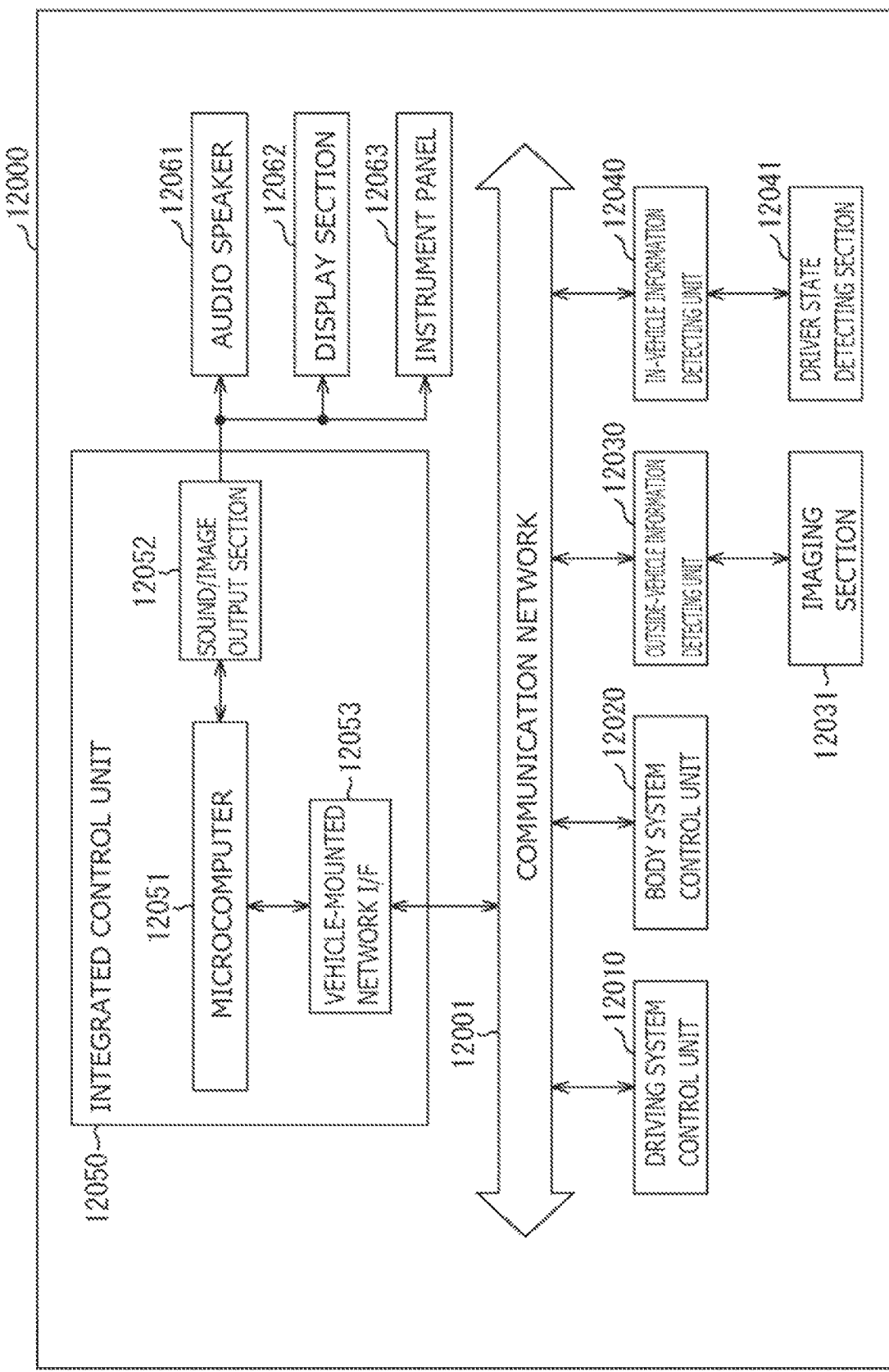
FIG. 62 is a block diagram depicting an example of schematic configuration of a vehicle control system.

FIG. 62 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 62, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 62, an audio speaker 12061, a display section 12062, and an instrument panel 12063 are illustrated as the output device. The display section 12062 may, for example, include at least one of an on-board display and a head-up display.

Figure 63:
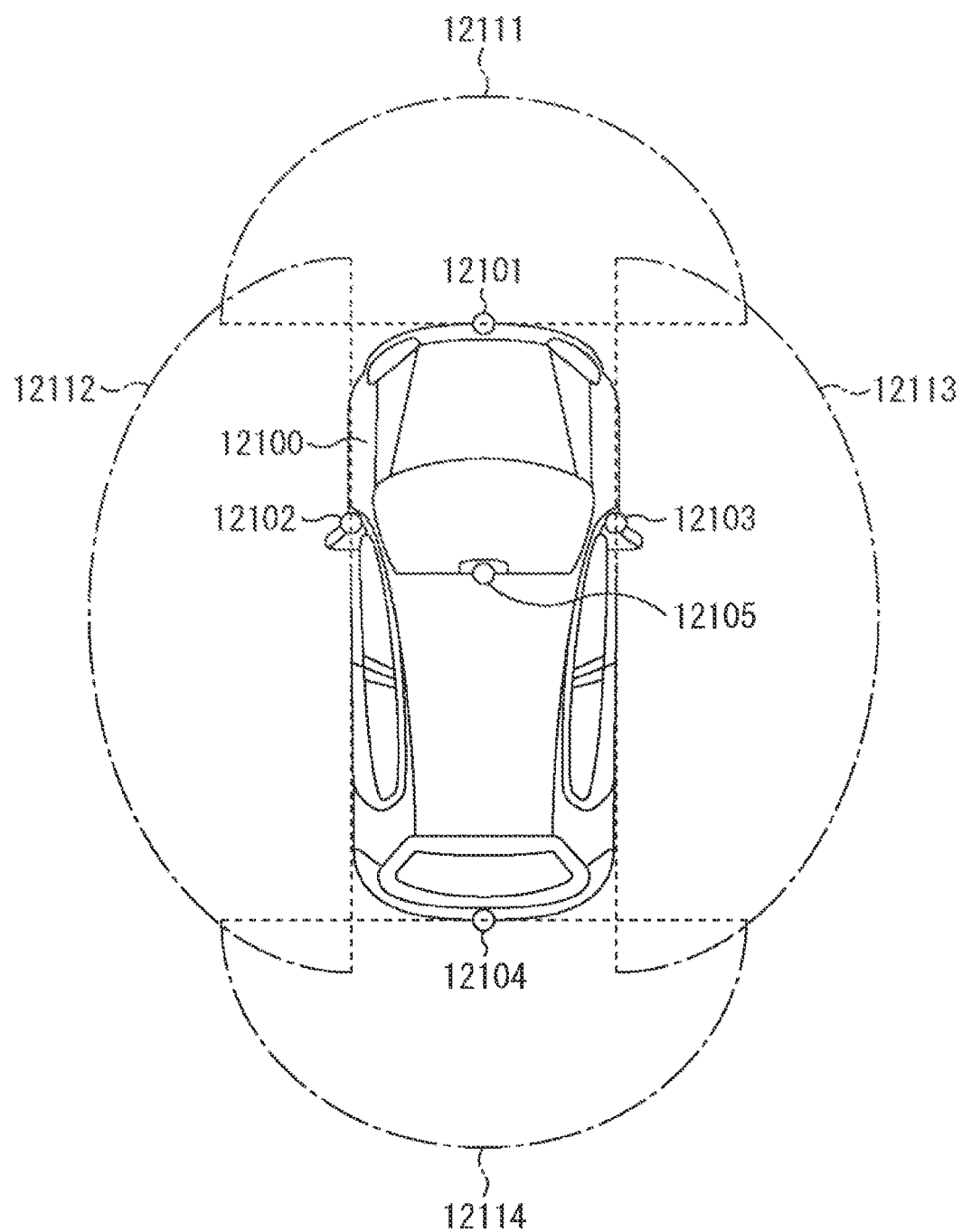
FIG. 63 is a diagram of assistance in explaining an example of installation positions of an outside-vehicle information detecting section and an imaging section.

FIG. 63 is a diagram depicting an example of the installation position of the imaging section 12031.

In FIG. 63, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 63 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 in the configuration described above, for example. Specifically, for example, the imaging device 1 of FIGS. 1, 9, and 11 to 22 is applicable to the imaging section 12031. Miniaturization and height reduction of the device configuration, and also reduction of generation of a flare and a ghost caused by internal diffused reflection are achievable by applying the technology according to the present disclosure to the imaging section 12031.

Note that the present disclosure may have following configurations.

<1>

An imaging device including:
- a solid-state imaging element that generates a pixel signal by photoelectric conversion according to a light amount of incident light; and
- a lens group that includes a plurality of lenses and focuses the incident light on a light receiving surface of the solid-state imaging element, in which
- a lowermost layer lens included in the lens group and constituting a lowermost layer with respect to an incident direction of the incident light is provided in a foremost stage in a direction for receiving the incident light, and
- the lowermost layer lens is an aspherical and recessed lens, a light shielding film being formed on a side surface of the lowermost layer lens.

<2>

The imaging device according to <1>, in which
- an effective region for converging the incident light on the solid-state imaging element is defined in the lowermost layer lens, and
- the light shielding film is formed on the side surface of the lowermost layer lens in a region up to a height at which the effective region is defined.

<3>

The imaging device according to <1> or <2>, in which the light shielding film is formed not only on the side surface of the lowermost layer lens, but also on a glass substrate provided on the solid-state imaging element, the lowermost layer lens being affixed to the glass substrate.

<4>
The imaging device according to any one of <1> to <3>, in which
an effective region for converging the incident light on the solid-state imaging element is defined in the lowermost layer lens, and
the light shielding film is formed in a region including the side surface of the lowermost layer lens and excluding the effective region.
<5>
The imaging device according to <4>, in which the light shielding film is so formed as to cover an entire region including the side surface of the lowermost layer lens, excluding the effective region, and extending up to a height of the lowermost layer lens in the incident direction of the incident light.
<6>
The imaging device according to <5>, in which the light shielding film is formed between a bank provided on an outer peripheral portion of the lowermost layer lens and the side surface of the lowermost layer lens.
<7>
The imaging device according to <6>, in which the light shielding film is formed by filling, by using lithography, a material of the light shielding film between the bank provided on the outer peripheral portion of the lowermost layer lens and the side surface of the lowermost layer lens.
<8>
The imaging device according to <6>, in which the light shielding film is formed by applying a material of the light shielding film between the bank provided on the outer peripheral portion of the lowermost layer lens and the side surface of the lowermost layer lens.
<9>
The imaging device according to <6>, in which the light shielding film is formed by filling, by using lithography, a material of the light shielding film between the bank provided on the outer peripheral portion of the lowermost layer lens and the side surface of the lowermost layer lens, or applying the material, and then polishing the material.
<10>
The imaging device according to <9>, in which the bank is so formed as to connect with the side surface of the lowermost layer lens.
<11>
The imaging device according to <4>, in which the light shielding film is formed in a region including the side surface of the lowermost layer lens and excluding the effective region and disposed on a surface at a height of the lowermost layer lens in the incident direction of the incident light.
<12>
The imaging device according to <3>, in which a protrusion portion having a bank shape is formed on an outer peripheral side surface of the lowermost layer lens, a thickness of the protrusion portion from the glass substrate being larger than a largest thickness of the lowermost layer lens, and the protrusion portion having a flat surface portion.
<13>
The imaging device according to any one of <1> to <12>, in which an outer peripheral portion of the lowermost layer lens has a multistep side surface.
<14>
The imaging device according to any one of <1> to <13>, in which the solid-state imaging element has a laminated and non-cavity structure.

REFERENCE SIGNS LIST

1 Imaging device, 10 Integrated configuration unit, 11 Solid-state imaging element (having CPS structure), 11a Lower substrate (logic substrate), 11b Upper substrate (pixel sensor substrate), 11c Color filter, 11d On-chip lens, 12 Glass substrate, 13 Adhesive, 14 IRCF (infrared cut filter), 14' IRCF glass substrate, 15 Adhesive, 16 Lens group, 17 Circuit board, 18 Actuator, 19 Connector, 20 Spacer, 21 Pixel region, 22 Control circuit, 23 Logic circuit, 32 Pixel, 51 Photodiode, 81 Silicon substrate, 83 Wiring layer, 86 Insulation film, 88 Silicon through electrode, 91 Solder mask, 101 Silicon substrate, 103 Wiring layer, 105 Chip through electrode, 106 Connection wiring, 109 Silicon through electrode, 131 Lens, 151 Adhesive, 171 Lens group, 191 Solid-state imaging element (having COB structure), 192 Wire bond, 211 Infrared cut resin, 231 Glass substrate, 231a Protrusion, 231b Cavity, 251 Coating agent having infrared cut function, 271 Lens, 271a AR coating, 291 Lens, 291a Anti-reflection treatment portion, 301 Infrared cut lens, 321 Glass substrate, 351 Refractive film, 371, 371-1 to 371-4, 381 Added film, 401, 401A to 401U, 401AA to 401AH Lens, 401a Protrusion portion, 401b, 401b' Hemming bottom portion, 401d Hemming bottom portion, 402, 402A to 402U, 402AA to 402AH, 402-P1 to 402-P5 AR coating, 451 Substrate, 452, 452', 452", 452''' Mold, 453 Light shielding film, 461 Ultraviolet curing resin, 461a Leak portion, 501, 501', 501A to 501K Alignment mark, 521 Light shielding film, 531 Bank

What is claimed is:
1. An imaging device, comprising:
a solid-state imaging element that generates a pixel signal by photoelectric conversion according to an amount of incident light;
a glass substrate;
a lens group that includes a plurality of lenses and focuses the incident light on a light receiving surface of the solid-state imaging element; and
a light shielding film,
wherein the glass substrate is disposed between the solid-state imaging element and the lens group,
wherein a lowermost layer lens included in the lens group and constituting a lowermost layer with respect to an incident direction of the incident light is provided on a first portion of a first surface of the glass substrate,
wherein the lowermost layer lens is an aspherical and recessed lens, and
wherein the light shielding film is formed on a side surface of the lowermost layer lens and on a second portion of the first surface of the glass substrate.
2. The imaging device according to claim 1, wherein
an effective region for converging the incident light on the solid-state imaging element is defined in the lowermost layer lens, and
the light shielding film is formed on the side surface of the lowermost layer lens in a region up to a height at which the effective region is defined.
3. The imaging device according to claim 1, wherein the lowermost layer lens is affixed to the glass substrate.
4. The imaging device according to claim 1, wherein
an effective region for converging the incident light on the solid-state imaging element is defined in the lowermost layer lens, and
the light shielding film is formed in a region including the side surface of the lowermost layer lens and excluding the effective region.

5. The imaging device according to claim 4, wherein the light shielding film is so formed as to cover an entire region including the side surface of the lowermost layer lens, excluding the effective region, and extending up to a height of the lowermost layer lens in the incident direction of the incident light.

6. The imaging device according to claim 5, wherein the light shielding film is formed between a bank provided on an outer peripheral portion of the lowermost layer lens and the side surface of the lowermost layer lens.

7. The imaging device according to claim 6, wherein the light shielding film is formed by filling, by using lithography, a material of the light shielding film between the bank provided on the outer peripheral portion of the lowermost layer lens and the side surface of the lowermost layer lens.

8. The imaging device according to claim 6, wherein the light shielding film is formed by applying a material of the light shielding film between the bank provided on the outer peripheral portion of the lowermost layer lens and the side surface of the lowermost layer lens.

9. The imaging device according to claim 6, wherein the light shielding film is formed by filling, by using lithography, a material of the light shielding film between the bank provided on the outer peripheral portion of the lowermost layer lens and the side surface of the lowermost layer lens, or applying the material, and then polishing the material.

10. The imaging device according to claim 9, wherein the bank is so formed as to connect with the side surface of the lowermost layer lens.

11. The imaging device according to claim 4, wherein the light shielding film is formed in a region including the side surface of the lowermost layer lens and excluding the effective region and disposed on a surface at a height of the lowermost layer lens in the incident direction of the incident light.

12. The imaging device according to claim 3, wherein a protrusion portion that extends from the first surface of the glass substrate is formed adjacent to an outer peripheral side surface of the lowermost layer lens, a thickness of the protrusion portion from the glass substrate being larger than a largest thickness of the lowermost layer lens, and the protrusion portion having a flat surface portion.

13. The imaging device according to claim 1, wherein an outer peripheral portion of the lowermost layer lens has a multistep side surface.

14. The imaging device according to claim 1, wherein the solid-state imaging element has a laminated and non-cavity structure.

* * * * *